(12) United States Patent
Chung et al.

(10) Patent No.: US 9,087,728 B2
(45) Date of Patent: Jul. 21, 2015

(54) SEMICONDUCTOR DEVICE

(71) Applicant: Samsung Electronics Co., Ltd., Suwon-si (KR)

(72) Inventors: Hyun-Woo Chung, Yongin-si (KR); Jiyoung Kim, Yongin-si (KP); Yoosang Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/097,937

(22) Filed: Dec. 5, 2013

(65) Prior Publication Data

US 2014/0159148 A1     Jun. 12, 2014

(30) Foreign Application Priority Data

Dec. 6, 2012  (KR) .................. 10-2012-0140994

(51) Int. Cl.
| | | |
|---|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 27/108 | (2006.01) |

(52) U.S. Cl.
CPC .... H01L 27/10814 (2013.01); H01L 27/10876 (2013.01); H01L 27/10891 (2013.01); H01L 27/10894 (2013.01)

(58) Field of Classification Search
CPC . H01L 29/76; H01L 29/7813; H01L 29/1095; H01L 29/66734; H01L 29/0696; H01L 31/062; H01L 31/113; H01L 31/119

USPC .................. 257/270, 306, 330, 365
See application file for complete search history.

(56) References Cited

U.S. PATENT DOCUMENTS

| | | | |
|---|---|---|---|
| 8,053,831 B2 | 11/2011 | Yu | |
| 8,119,485 B2 | 2/2012 | Kim | |
| 2009/0114991 A1* | 5/2009 | Kim et al. | 257/365 |
| 2009/0224312 A1* | 9/2009 | Taketani | 257/330 |
| 2009/0272982 A1* | 11/2009 | Nakamura et al. | 257/77 |
| 2011/0169066 A1 | 7/2011 | Moon et al. | |
| 2011/0309435 A1 | 12/2011 | Hwang et al. | |

FOREIGN PATENT DOCUMENTS

| | | |
|---|---|---|
| KR | 10-2008-0010664 A | 1/2008 |
| KR | 10-2010-0079795 A | 7/2010 |
| KR | 10-2011-0076507 A | 7/2011 |
| KR | 10-2011-0086357 A | 7/2011 |

* cited by examiner

*Primary Examiner* — Phuc Dang
(74) *Attorney, Agent, or Firm* — Myers Bigel Sibley & Sajovec, PA

(57) ABSTRACT

A method of manufacturing a semiconductor device includes forming device isolation layer in a substrate to define active regions of which each has first regions and a second region between the first regions, forming a first trench and a pair of second trenches in the substrate, and forming gates in the second trenches, respectively. The first trench extends in a first direction and crosses the active regions and the device isolation layer. The second trenches are connected to a bottom of the first trench and extend in the first direction at both sides of the second regions.

11 Claims, 52 Drawing Sheets

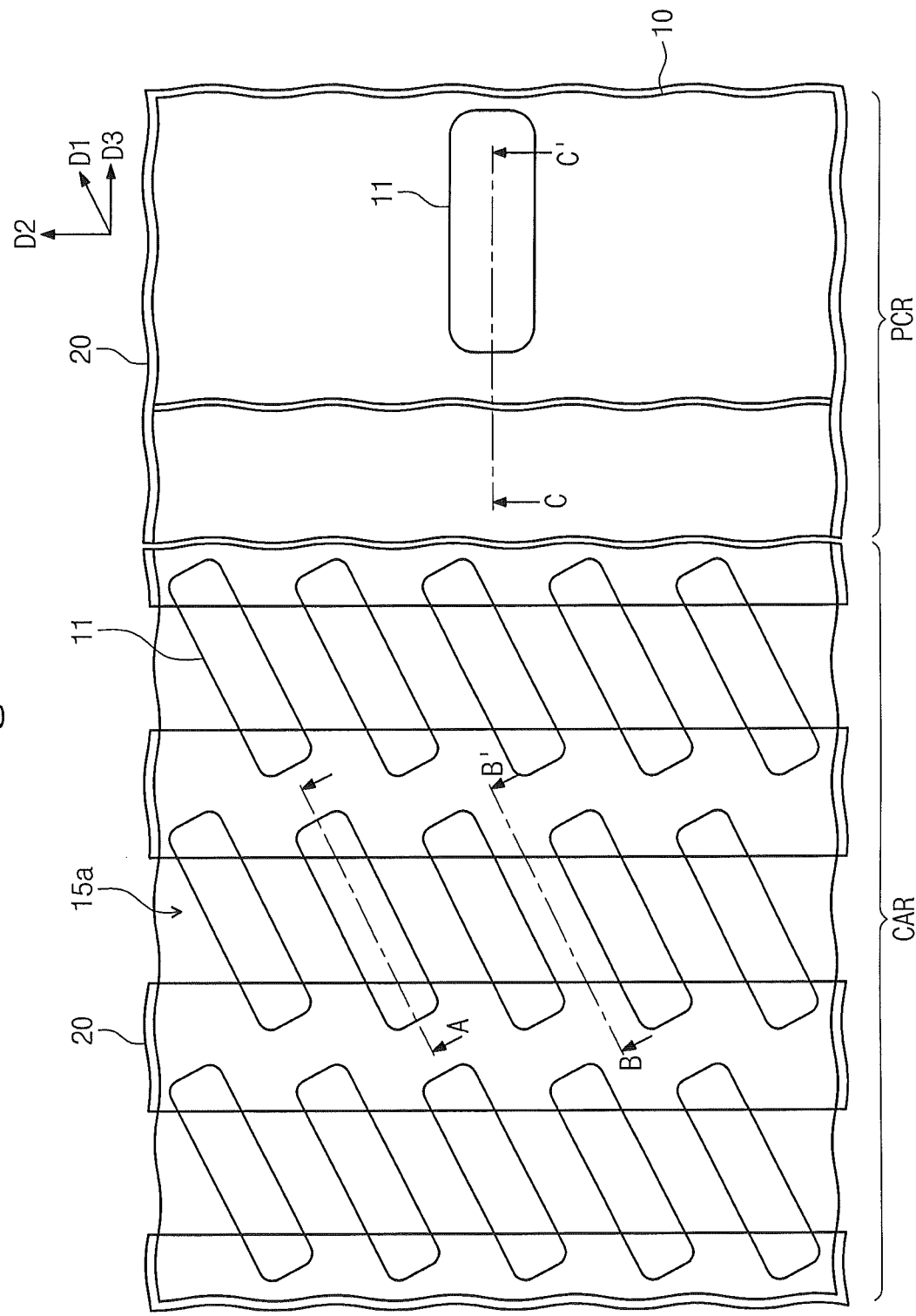

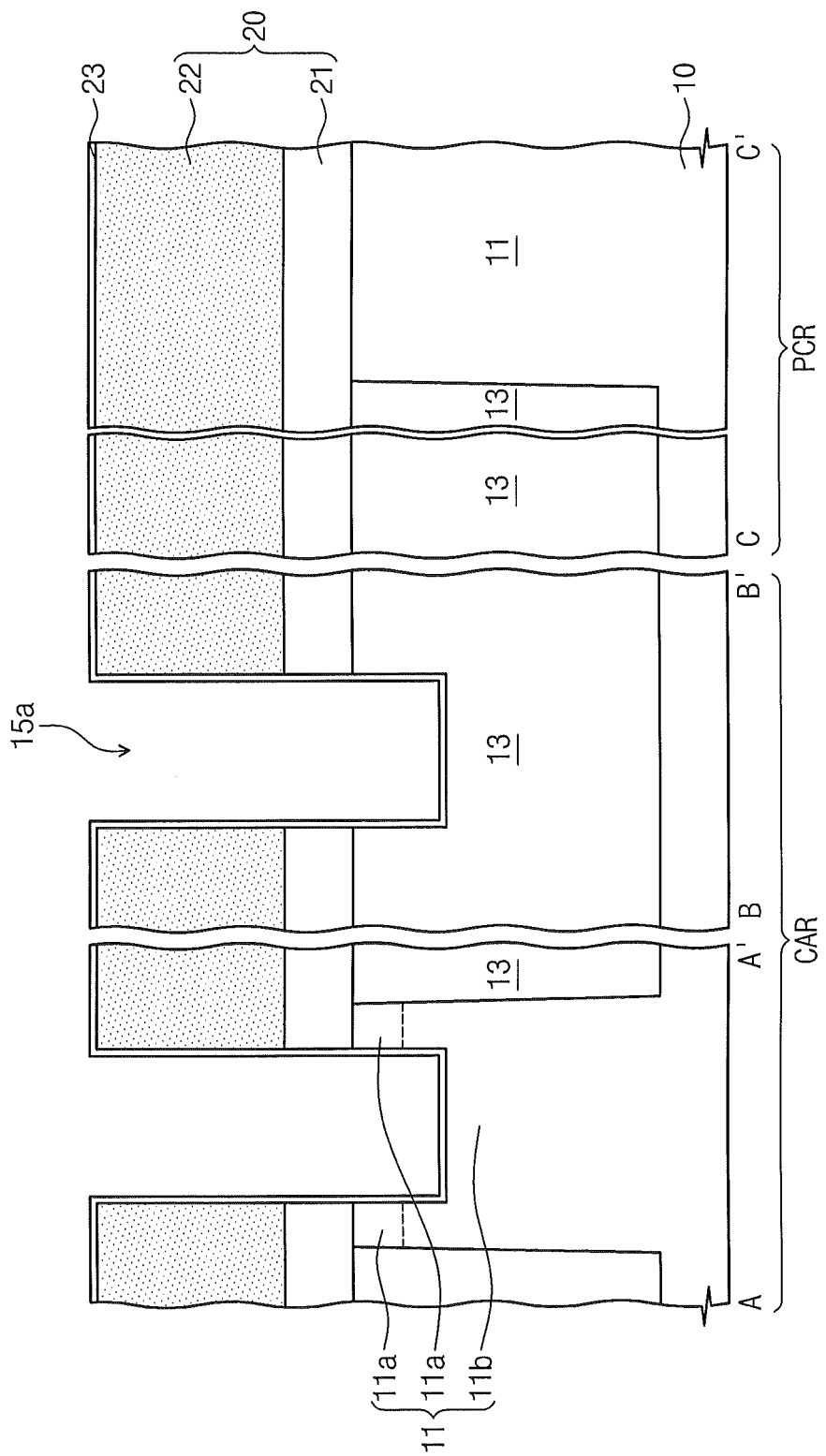

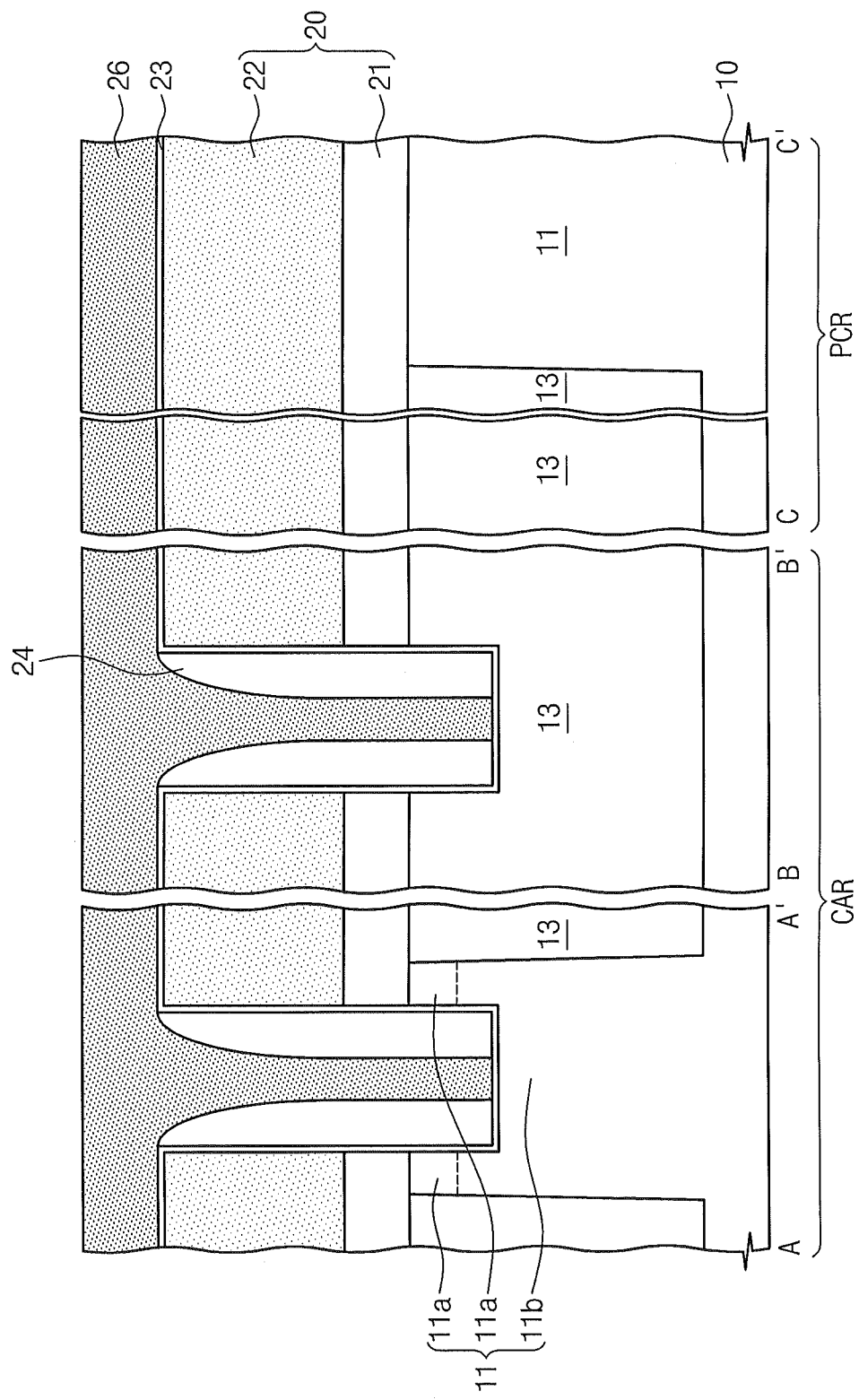

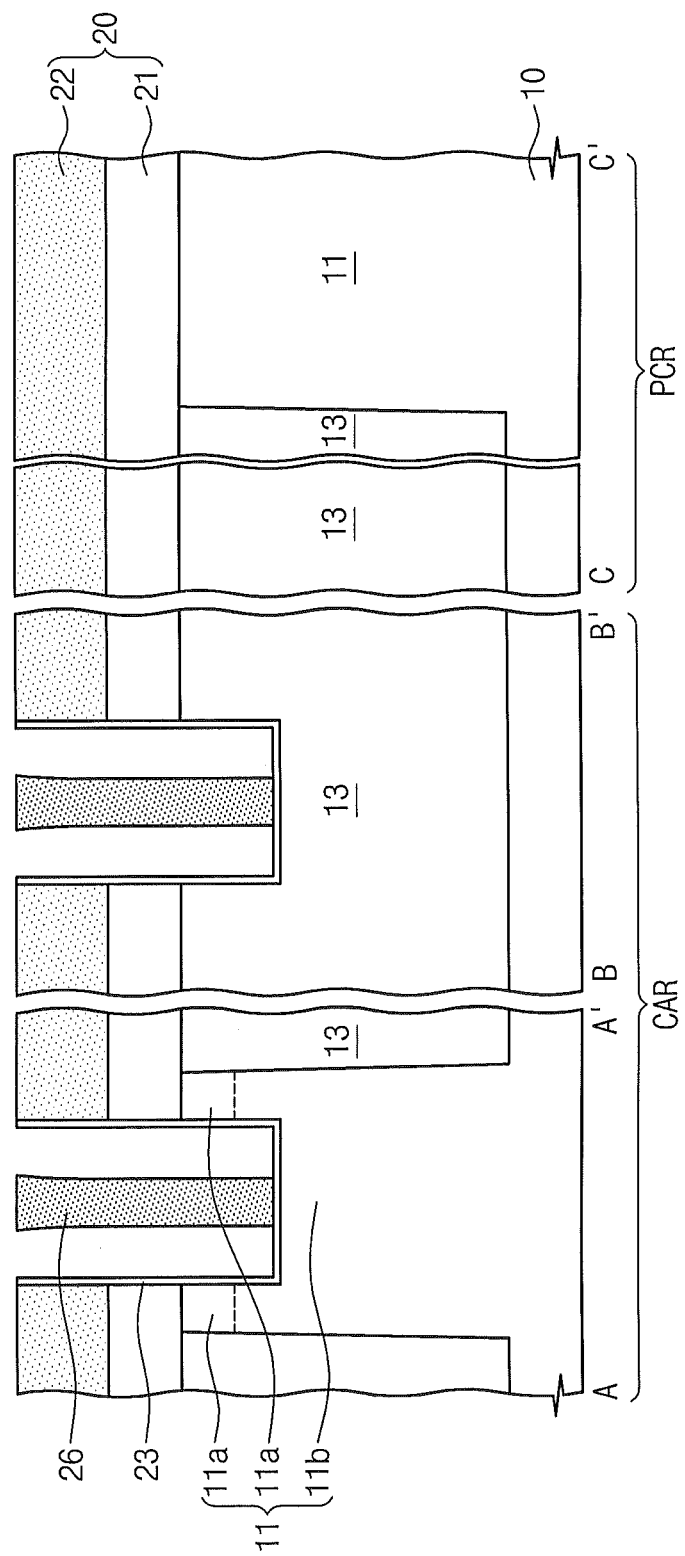

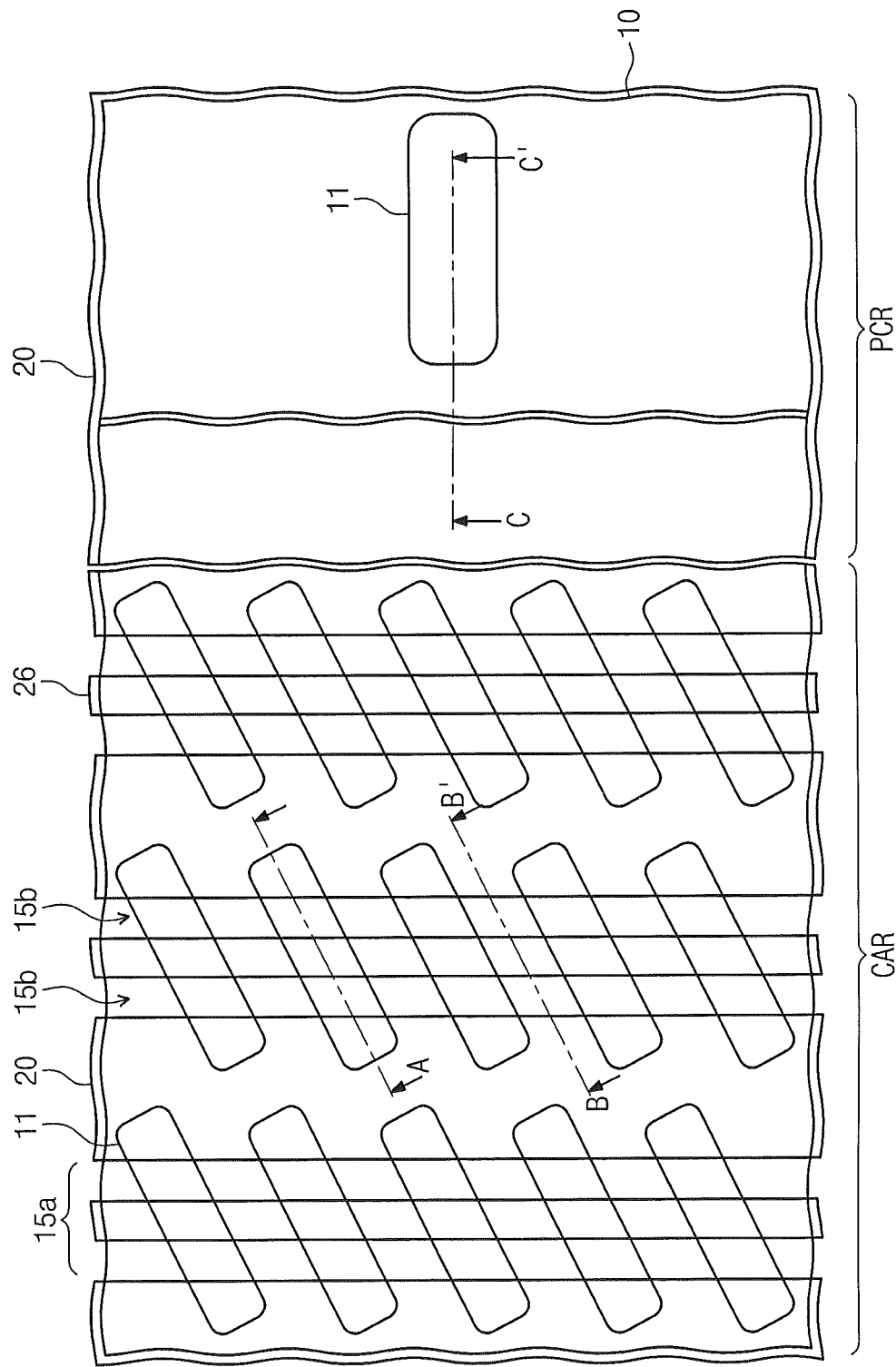

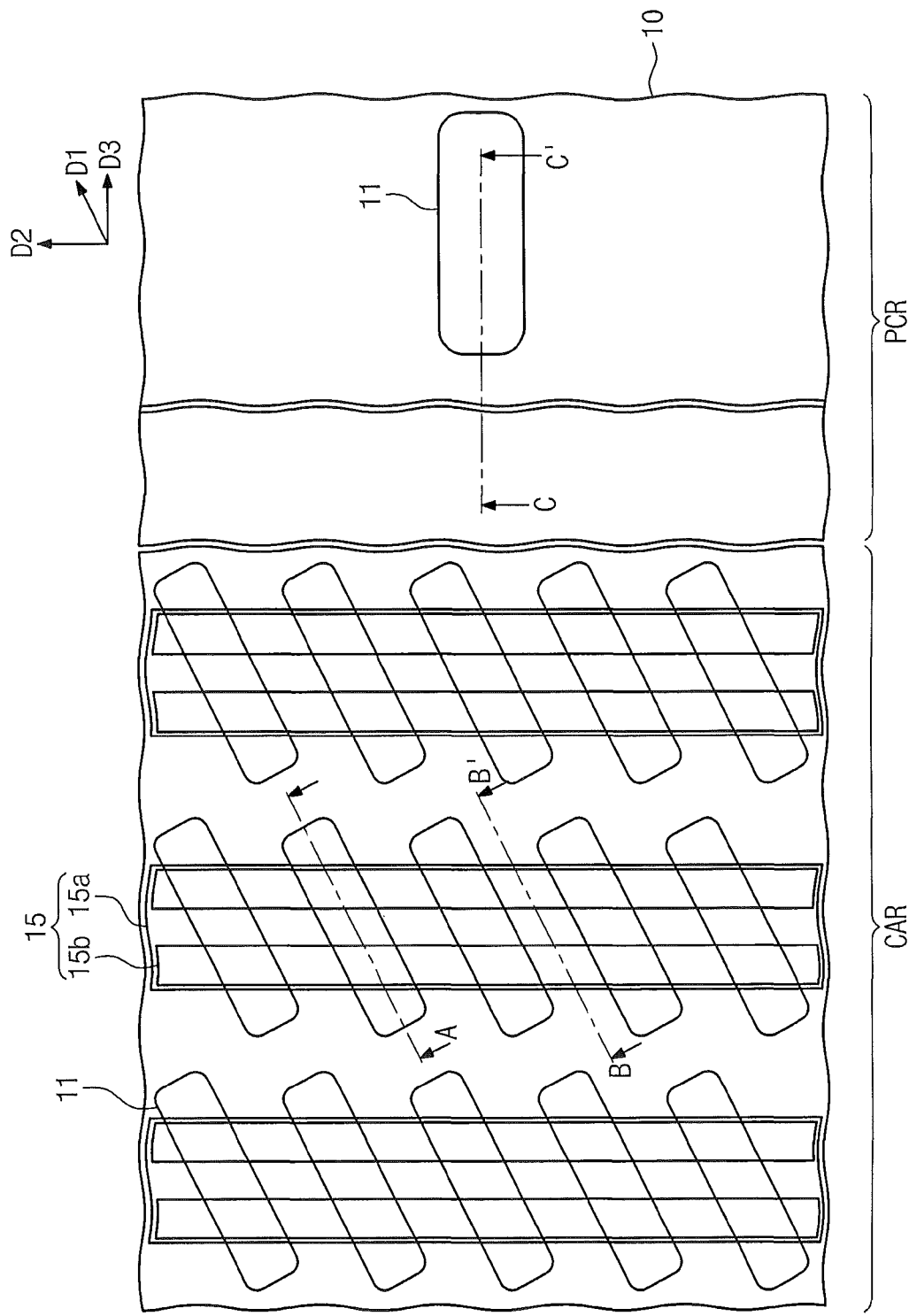

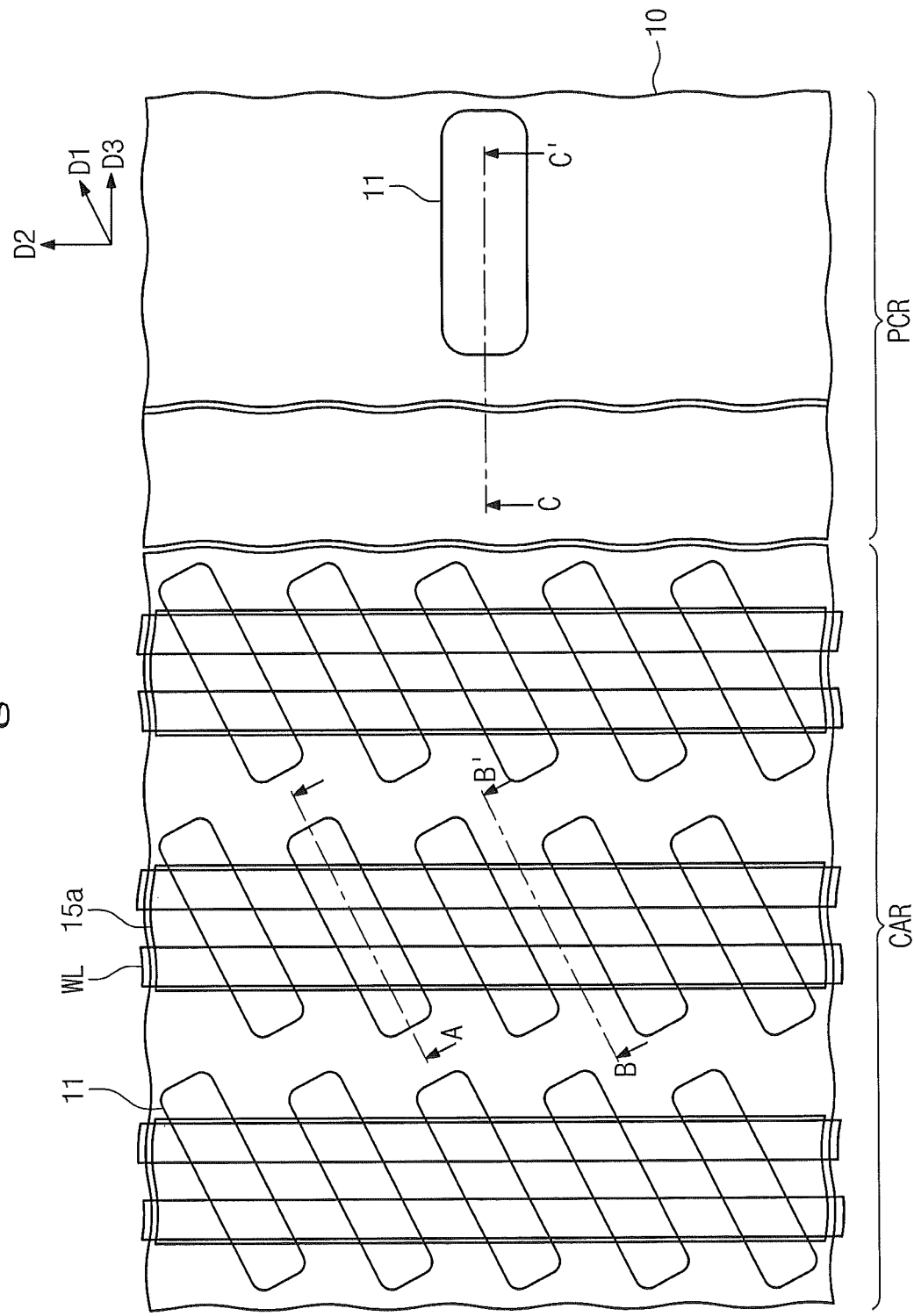

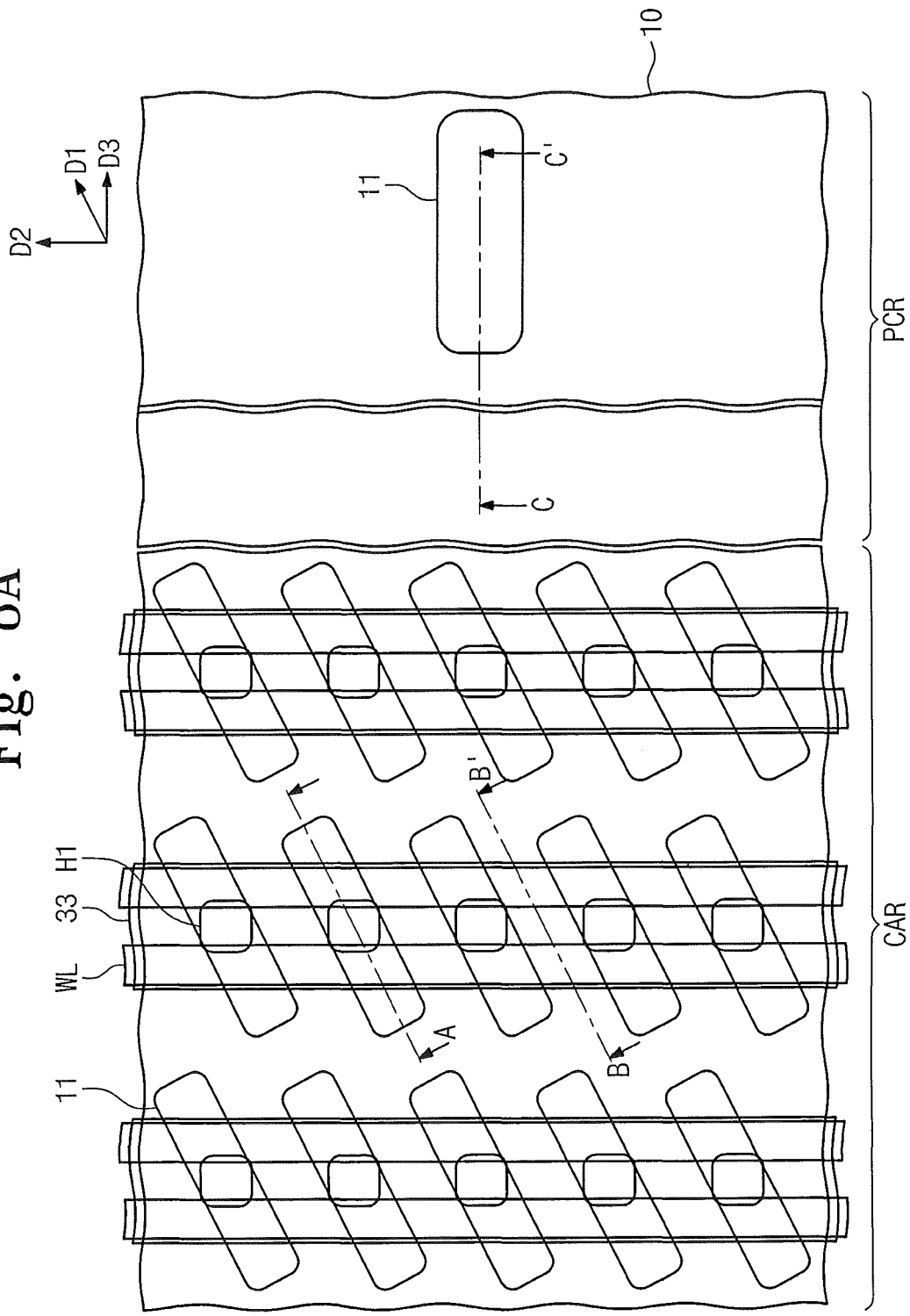

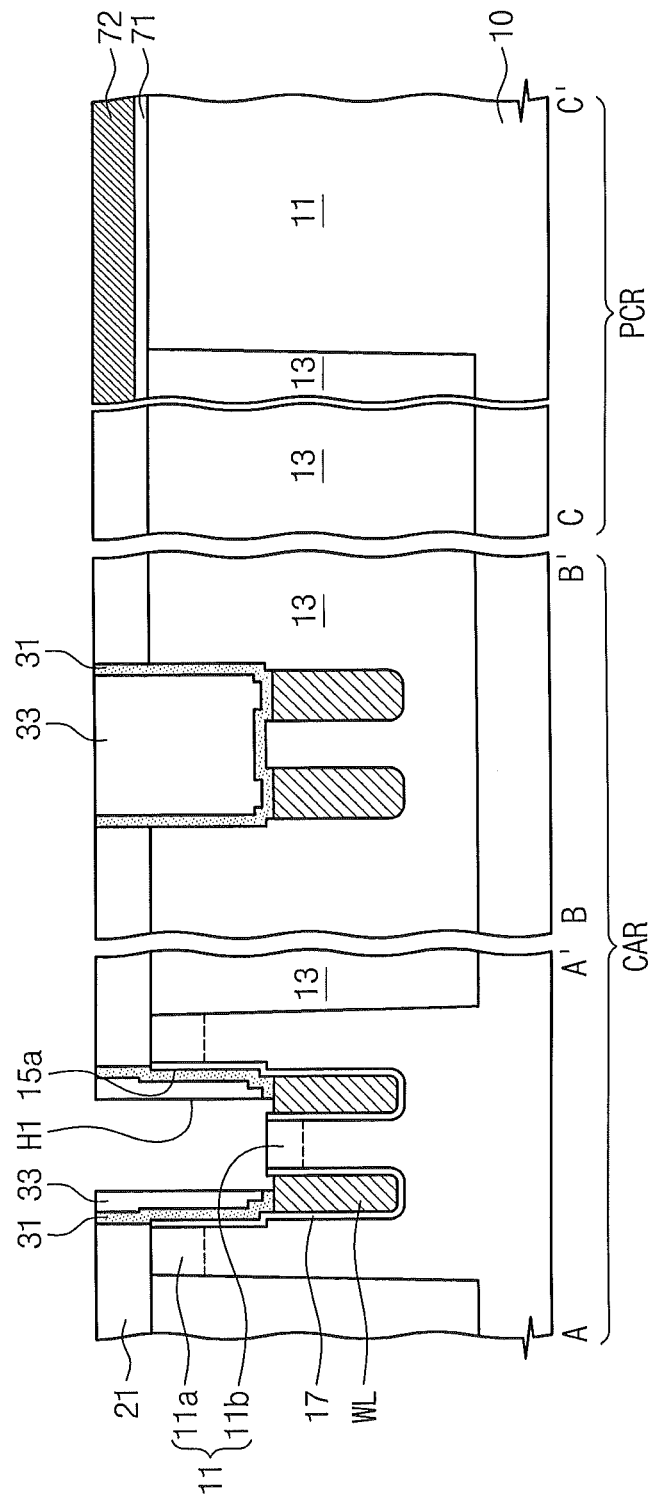

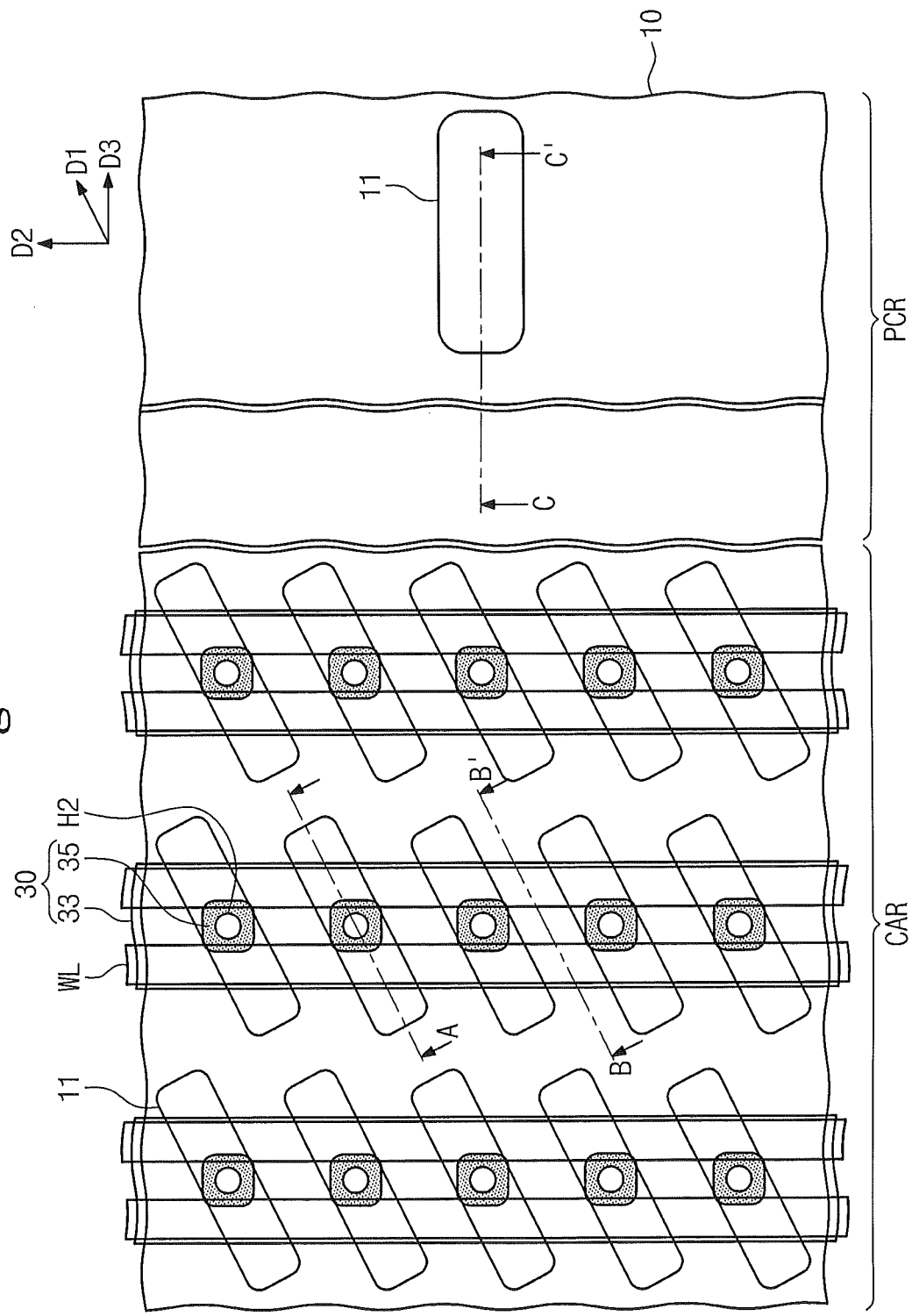

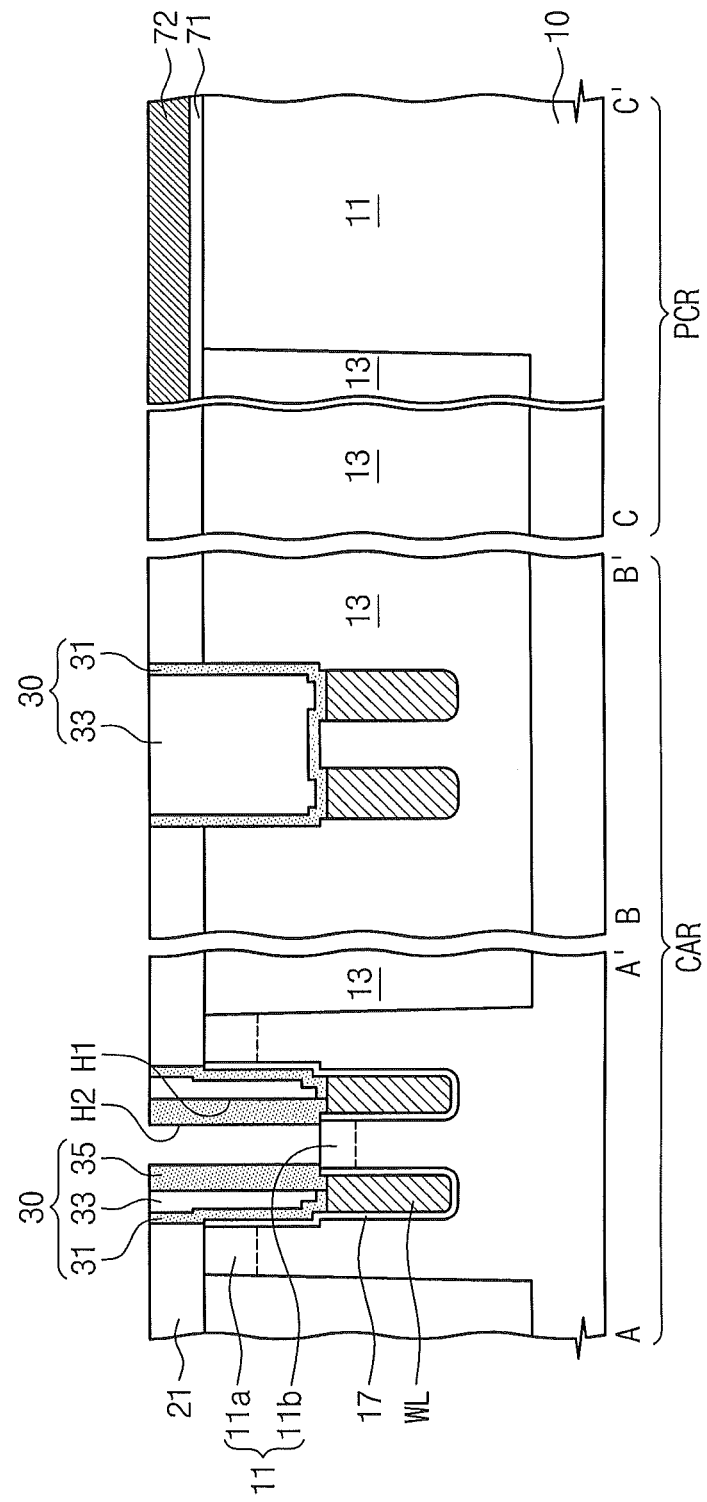

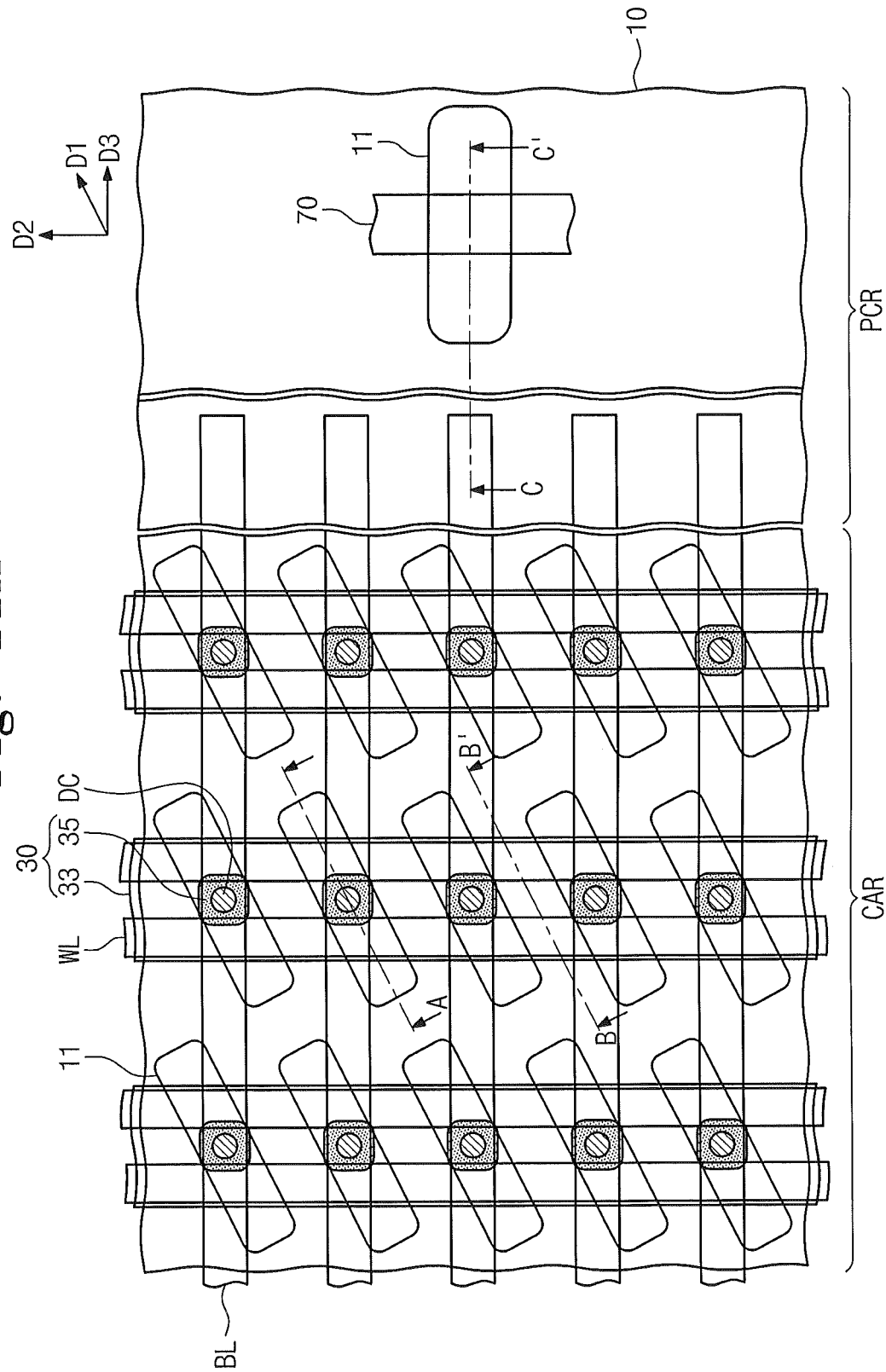

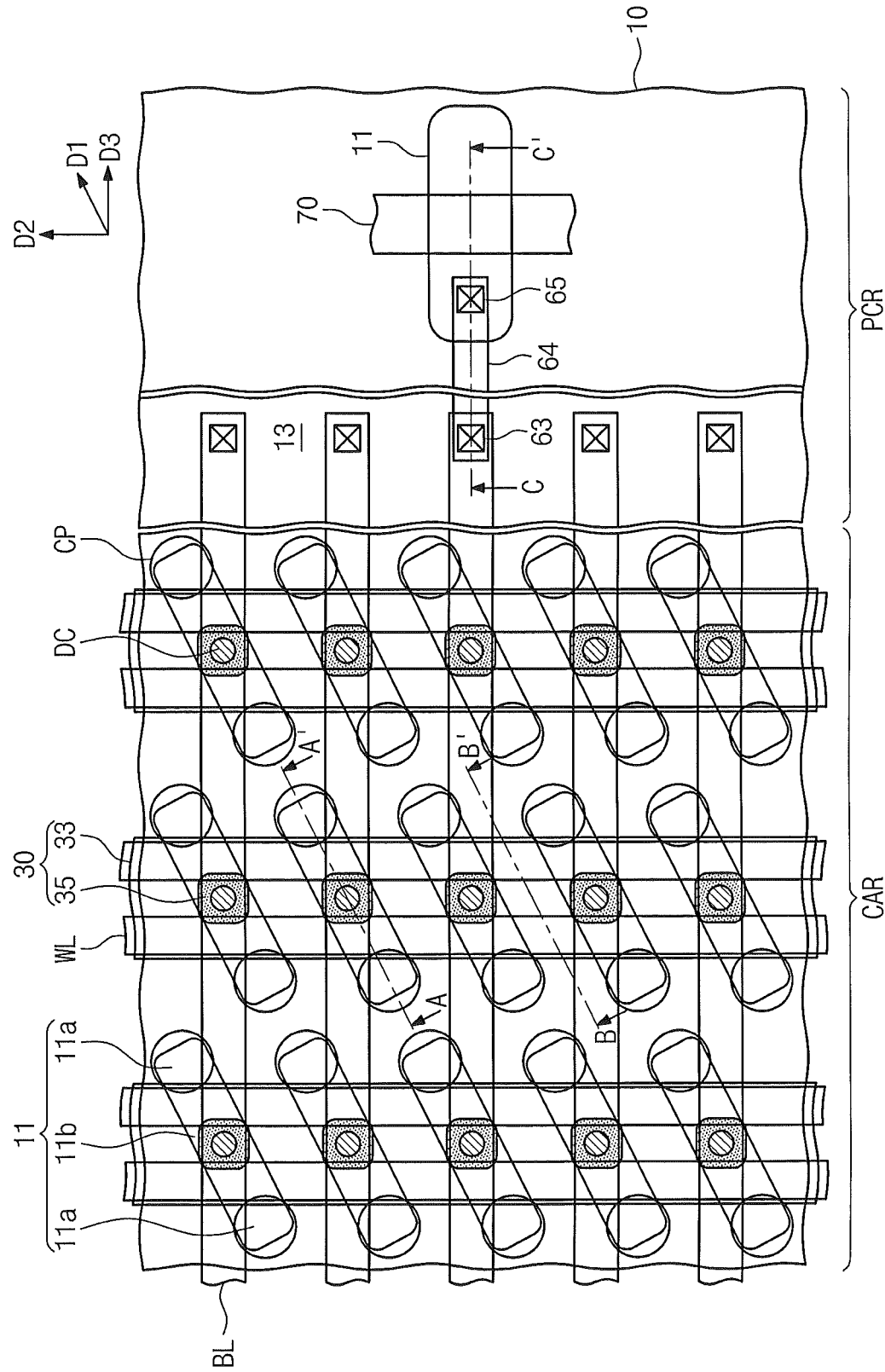

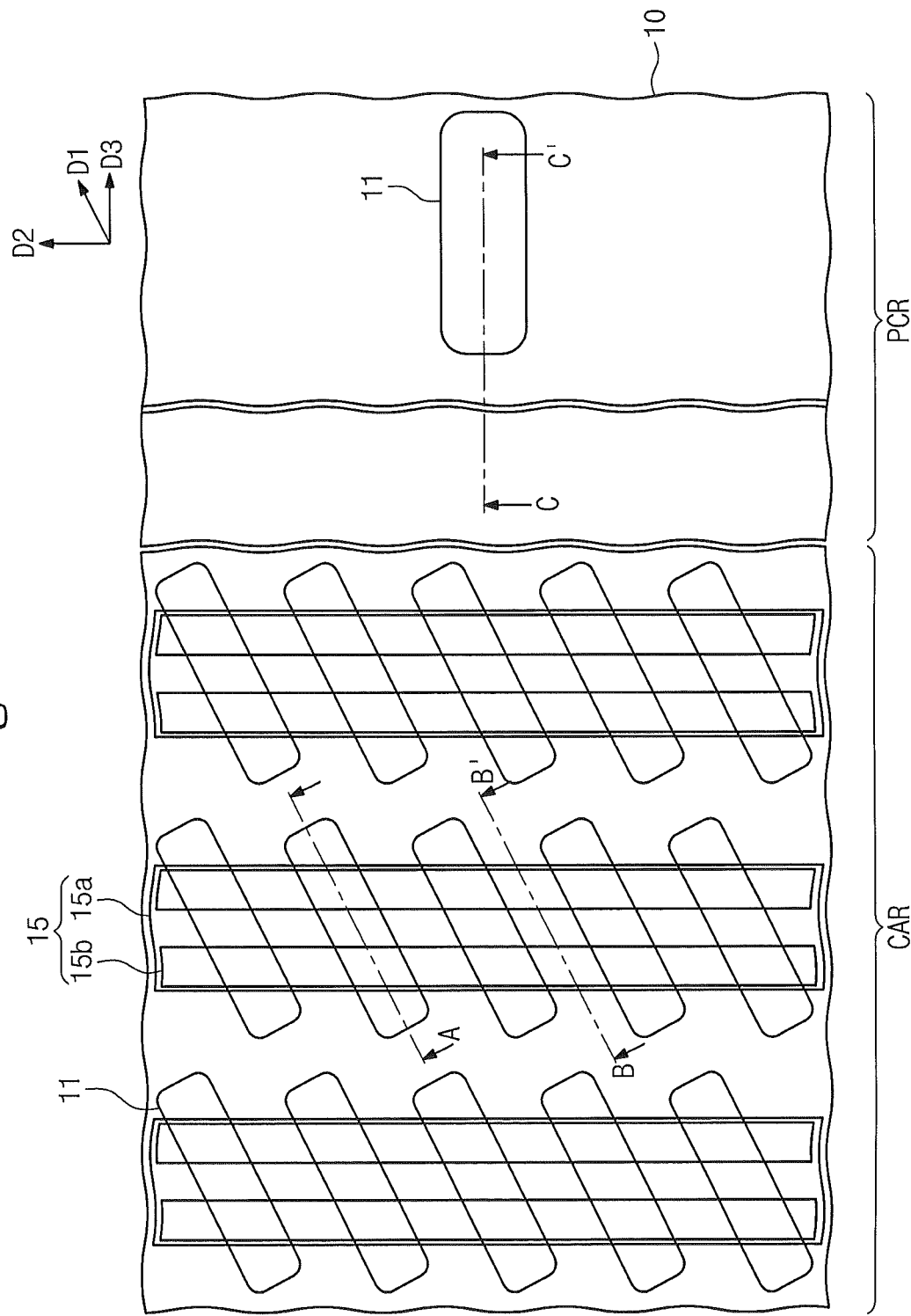

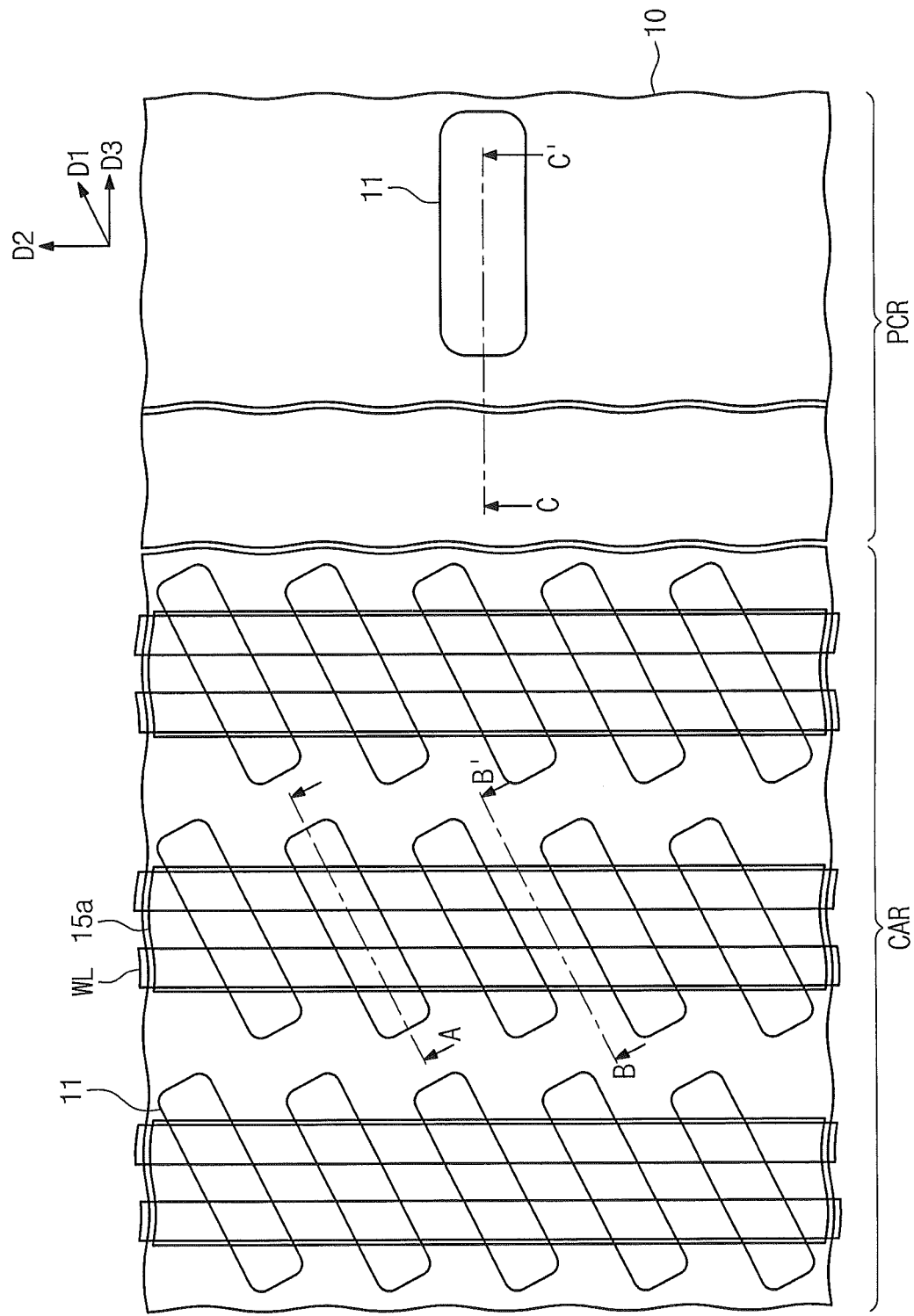

US 9,087,728 B2

SEMICONDUCTOR DEVICE

CROSS-REFERENCE TO RELATED APPLICATIONS

This U.S. non-provisional patent application claims priority under 35 U.S.C. §119 to Korean Patent Application No. 10-2012-0140994, filed on Dec. 6, 2012, the entirety of which is incorporated by reference herein.

FIELD

The inventive concept relates to semiconductor devices and manufacturing methods thereof.

BACKGROUND

Semiconductor devices are attractive in the electronics industry because of their small size, multi-function and/or low manufacture costs. However, semiconductor devices have been highly integrated with the development of the electronic industry. Widths and spaces of patterns of semiconductor devices have been more and more reduced for high integration of the semiconductor devices. However, new exposure techniques and/or high cost exposure techniques may be required for fineness of the patterns so that semiconductor devices may be difficult to highly integrate. Thus, research has been conducted to develop new integrating techniques.

SUMMARY

Embodiments of the inventive concept may provide highly integrated semiconductor devices.

Embodiments of the inventive concept may also provide semiconductor devices with improved reliability.

Embodiments of the inventive concept may also provide methods of manufacturing a highly integrated semiconductor device.

Embodiments of the inventive concept may also provide methods of manufacturing a semiconductor device having improved reliability.

In one aspect, a semiconductor device may include: a substrate; an active region defined by a device isolation layer provided in the substrate, the active region having first regions and a second region between the first regions; a first trench provided in the substrate to extend in a first direction, the first trench crossing the active region and the device isolation layer; a pair of second trenches connected to a bottom of the first trench, the pair of second trenches provided between the second region and the first regions; and gates provided in the second trenches, respectively.

In some embodiments, the first regions may be provided at both sides of the first trench; the second region may be provided between the second trenches; and a top surface of the second region may be lower than top surfaces of the first regions.

In some embodiments, the semiconductor device may further include: a trench-insulating layer filling the first trench and extending in the first direction. The trench-insulating layer may have a first hole exposing the second region.

In some embodiments, the trench-insulating layer may protrude higher than a top surface of the substrate and may extend in the first direction.

In some embodiments, the semiconductor device may further include: storage node contacts contacting the first regions, respectively; and storage nodes disposed on the storage node contacts, respectively.

In some embodiments, the semiconductor device may further include: a bit line contact provided in the first hole and contacting the second region; and a bit line connected to the bit line contact, the bit line provided on the trench-insulating layer to extend in a second direction crossing the first direction.

In some embodiments, the trench-insulating layer may include: a first insulating layer having a second hole greater than the first hole, the second hole exposing at least portions of the gates; and a second insulating layer provided in the second hole and covering the exposed gates.

In some embodiments, the trench-insulating layer may include: spacer insulating layers formed on sidewalls of the first trench; and a gap insulating layer provided in a gap region between the spacer insulating layers, the gap insulating layer exposing the second region. Sidewalls of the bit line contact which are opposite to each other in the first direction may be aligned with sidewalls of the bit line.

In another aspect, a method of manufacturing a semiconductor device may include: forming device isolation layer in/on a substrate to define active regions, each of the active regions having first regions and a second region between the first regions; forming a first trench and a pair of second trenches in the substrate, the first trench extending in a first direction and crossing the active regions and the device isolation layer, and the pair of second trenches connected to a bottom of the first trench and extending in the first direction at both sides of the second regions; and forming gates in the second trenches, respectively.

In some embodiments, the method may further include: forming a trench-insulating layer filling the first trench, the trench-insulating layer having first holes exposing the second regions, respectively; forming bit line contacts contacting the second regions in the first holes, respectively; and forming bit lines connected to the bit line contacts on the trench-insulating layer, the bit lines extending in a second direction crossing the first direction.

In some embodiments, forming the first trench and the second trenches may include: forming a mask layer extending in the first direction on the substrate; etching the substrate using the mask layer as an etch mask to form the first trench; forming spacer layers on sidewalls of the first trench; forming a gap insulating layer in the trench between the spacer layers; and after removing the spacer layers, etching a bottom surface of the first trench using the mask layer and the gap insulating layer as etch masks to form the second trenches.

In some embodiments, forming the first trench and the second trenches may include: forming a mask layer extending in the first direction on the substrate, the mask layer exposing the substrate between the second region and the first regions; etching the substrate using the mask layer as an etch mask to form the second trenches; and recessing the substrate of the second regions to form the first trench on the second trenches.

In some embodiments, forming the trench-insulating layer may include: forming a first insulating layer filling the first trench and having second holes, the second holes greater than the first holes, and the second holes exposing at least portions of the gates; and forming a second insulating layer in each of the second holes, the second insulating layer covering the exposed gates.

In some embodiments, forming the trench-insulating layer may include: forming spacer insulating layers on sidewalls of the first trench, the spacer insulating layers exposing the second regions; forming a bit line contact conductive layer in a gap region between the spacer insulating layers; etching the bit line contact conductive layer using the bit lines as etch masks to form the bit line contacts; and forming a gap insulating layer in the gap region between the bit line contacts.

BRIEF DESCRIPTION OF THE DRAWINGS

The inventive concept will become more apparent in view of the attached drawings and accompanying detailed description.

FIGS. 3A to 11A are plan views sequentially illustrating a method of manufacturing a semiconductor device according to a first embodiment of the inventive concept;

FIGS. 3B, 4B, 4C, 4D, 4E, 5B, 6B, 7B, 7C, 8B, 9B, 10B, and 11B are cross-sectional views sequentially illustrating a method of manufacturing a semiconductor device according to a first embodiment of the inventive concept;

FIG. 12A is a layout of a semiconductor device according to a second embodiment of the inventive concept;

FIGS. 13A to 17A are plan views sequentially illustrating a method of manufacturing a semiconductor device according to a second embodiment of the inventive concept;

FIGS. 19A to 22A are plan views sequentially illustrating a method of manufacturing a semiconductor device according to a third embodiment of the inventive concept;

FIGS. 19B to 22B are cross-sectional views sequentially illustrating a method of manufacturing a semiconductor device according to a third embodiment of the inventive concept;

DETAILED DESCRIPTION OF THE EMBODIMENTS

Figure 1A:
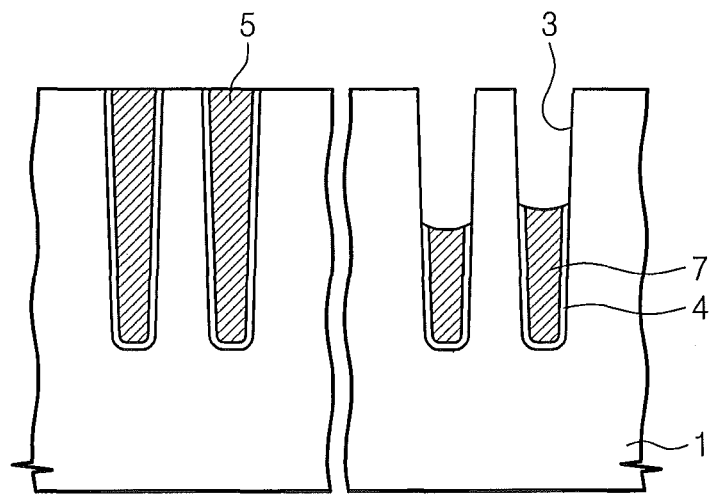
FIGS. 1A and 1B are cross-sectional views illustrating inventive concepts.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shapes illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1B:
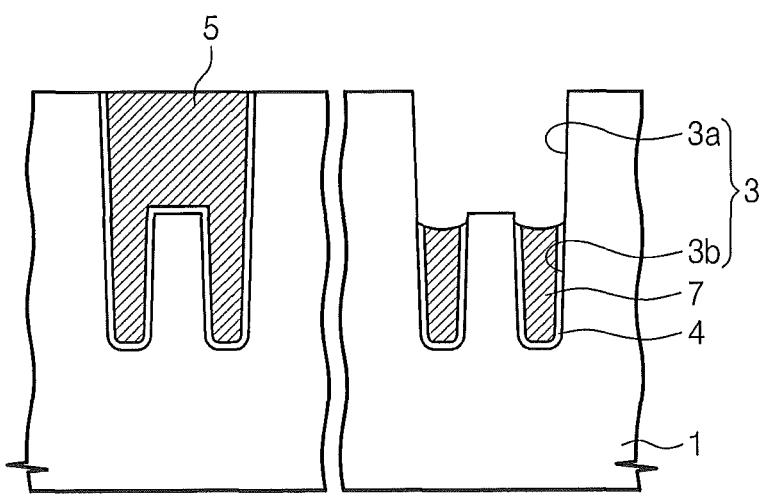

FIGS. 1A and 1B are cross-sectional views illustrating inventive concepts. FIG. 1A illustrates a general art, and FIG. 1B illustrates a technique according to the inventive concepts.

Referring to FIG. 1A, a conductive layer 5 may be formed in a pair of trenches 3 adjacent to each other and then the conductive layer 5 may be recessed. A top surface of the recessed conductive layer 7 may be lower than a top surface of a substrate 1. The recessed conductive layer 7 may be used as a gate (i.e., a word line) of a buried channel array transistor (BCAT). The conductive layer 5 may include at least material one selected from a group consisting of a poly-silicon layer, a metal silicide layer, and a metal layer. Recessing the conductive layer 5 may be performed by an etch-back process to form recessed conductive layers 7 disposed on insulating layers 4. As a width of the trench 3 becomes reduced due to high integration of a semiconductor device, heights of top surfaces of the recessed conductive layers 7 may have a non-uniform distribution. Additionally, the width of the trench 3 may become very small so that it may be difficult to recess the conductive layer by the etch-back process. Thus, dispersion of the cells including the recessed conductive layers 7 may increase. Further, as the width of the trench 3 becomes narrow, it may be difficult to fill the trench 3 with the conductive layer 5.

Referring to FIG. 1B, a trench 3 includes a first trench 3a and second trenches 3b. The second trenches 3b are connected to a bottom of the first trench 3a and extend downward. The first trench 3a may have a width wider than that of each of the second trenches 3b. Thus, even though the width of the trench 3 becomes reduced by the high integration of the semiconductor device, the conductive layer 5 can easily fill the trench 3. Additionally, the etch-back process can be easily performed so that heights of top surfaces of the recessed conductive layers 7 can be substantially uniform. The recessed conductive layers 7 are disposed on insulating layers 4. As a result, reliability of cells including the recessed conductive layers 7 may be improved.

Figure 2A:
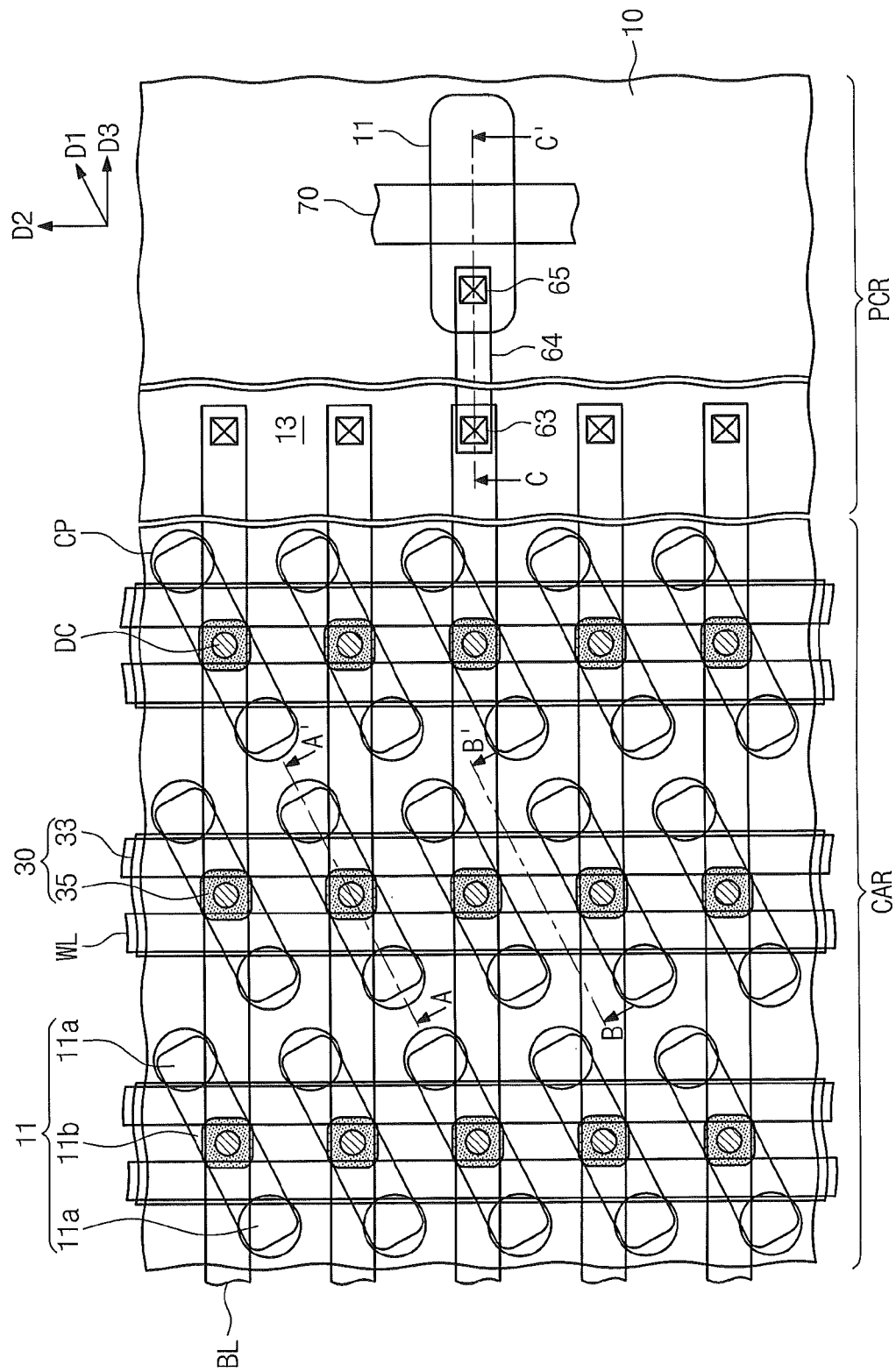
FIG. 2A is a layout of a semiconductor device according to a first embodiment of the inventive concept.
Figure 2B:
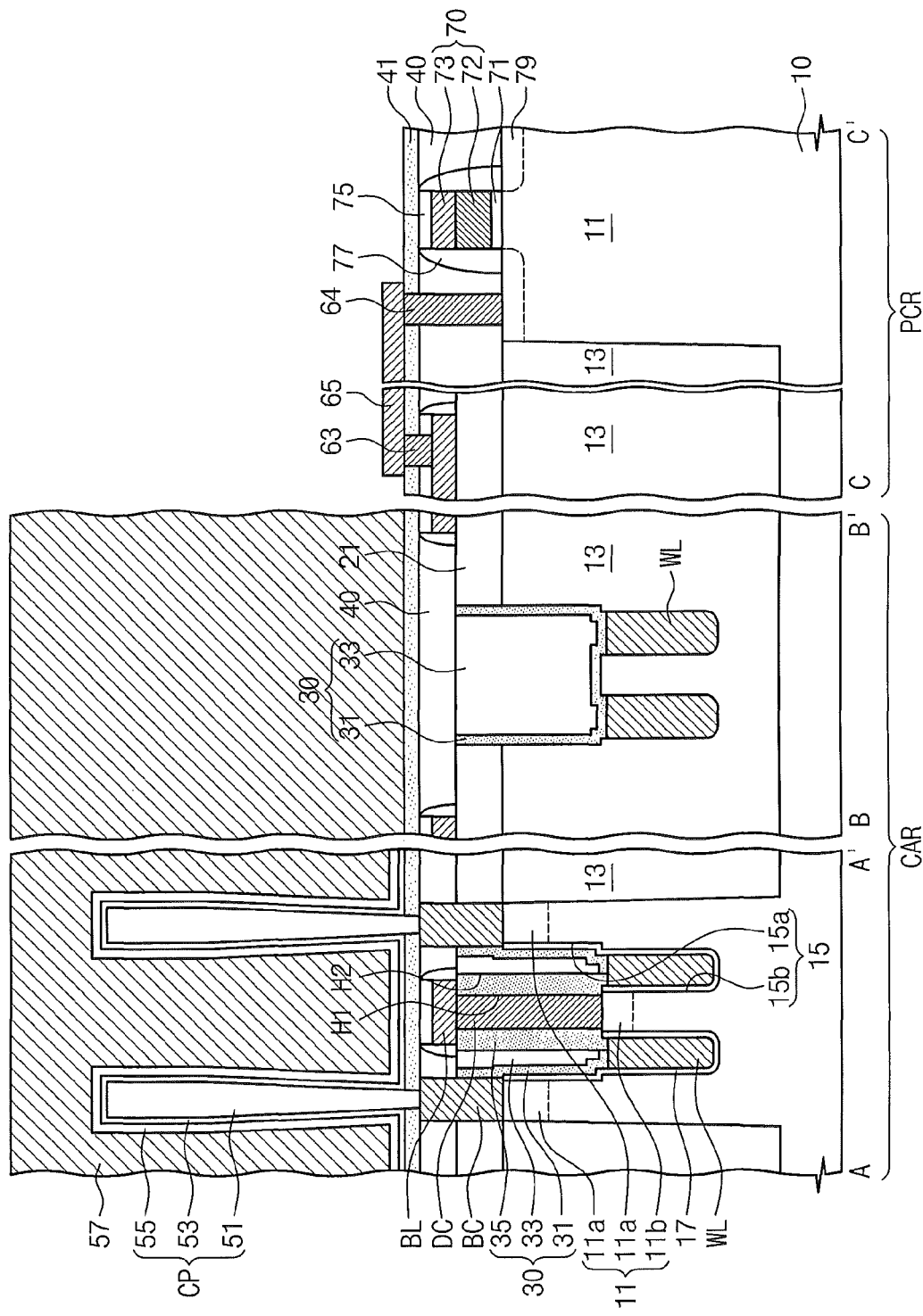
FIG. 2B is a cross-sectional view taken along lines A-A', B-B', and C-C' of FIG. 2A.

FIG. 2A is a layout of a semiconductor device according to a first embodiment of the inventive concept. FIG. 2B is a cross-sectional view taken along lines A-A', B-B', and C-C' of FIG. 2A.

Referring to FIGS. 2A and 2B, a device isolation layer 13 is provided in a substrate 10 to define an active region 11. The substrate 10 may include a cell array region CAR and a peripheral circuit region PCR. The substrate 10 may be a first conductivity type (e.g., a P-type) silicon substrate. In the cell array region CAR, the active region 11 may have a bar-shape extending in a first direction D1 in a plan view. A plurality of the active regions 11 may be provided in the cell array region CAR. The active regions 11 may be arranged in parallel to the first direction D1. The active regions 11 may be disposed along a second direction D2 crossing the first direction D1. Each of the active regions 11 may have first regions 11a and a second region 11b between the first regions 11a. The first regions 11a may be disposed at edges of the active region 11, respectively, and the second region 11b may be disposed at a center of the active region 11. The first regions 11a and the second region 11b may have a second conductivity type, for example, an N-type.

A plurality of word lines WL may be provided in the substrate 10 to cross the active regions 11 and the device isolation layer 13. The word lines WL may extend in the second direction D2. The first direction D1 may be tilted or oblique with respect to the second direction D2 in a plan view. The word lines WL may include at least one selected from a group consisting of a poly-silicon layer, a metal silicide layer, and a metal layer. A trench 15 extends in the second direction D2 to cross the active regions 11. The trench 15 may include a first trench 15a disposed in the substrate 10 between the first regions 11a, and a pair of second trenches 15b connected to a bottom of the first trench 15a. The pair of second trenches 15b may be provided in the substrate 10 between the second region 11b and the first regions 11a. The first trench 15a may have a wider width than each of the second trenches 15b. The word lines WL are formed in the second trenches 15b, respectively. The first regions 11a are provided at both sides of the first trench 15a, and the second region 11b is provided between the second trenches 15b. A top surface of the substrate 10 of the second region 11b is lower than a top surface of the substrate 10 of the first regions 11a. Top surfaces of the word lines WL may be lower than the top surface of the substrate 10 of the second region 11b. The word lines WL may be used as gates of memory cells. A gate insulating layer 17 is disposed between the substrate 10 and the word lines WL.

A trench-insulating layer 30 fills the first trench 15a. The trench-insulating layer 30 may have a first hole H1 exposing the second region 11b. The trench-insulating layer 30 may protrude to be higher than the top surface of the substrate 10 and may extend in the second direction D2. The trench-insulating layer 30 may have a plurality of the first holes H1 respectively exposing the second regions 11b of the active regions 11 arranged in the second direction D2. The trench-insulating layer 30 may include first, second, and third insulating layers 31, 33, and 35. The second insulating layer 33 may be provided in the first trench 15a and may extend in the second direction D2. The second insulating layer 33 may have a second hole H2 greater or wider than the first hole H1. The second hole H2 may expose at least a portion of the word lines WL. The third insulating layer 35 may be provided to have a spacer-shape in the second hole H2 and may cover the word lines WL. The third insulating layer 35 may have the first hole H1 exposing the second region 11b. The first insulating layer 31 may be provided between the second insulating layer 33 and sidewalls of the first trench 15a and between the second insulating layer 33 and the word lines WL. A sidewall of the first insulating layer 31 may be aligned with a sidewall of the second insulating layer 33. The second insulating layer 33 may be formed of a silicon oxide layer, and the first and third insulating layers 31 and 35 may be formed of a silicon nitride layer or a silicon oxynitride layer. The gate insulating layer 17 may extend between the first insulating layer 31 and the sidewalls of the first trench 15a.

A first interlayer insulating layer 21 is provided on the substrate 10. A top surface of the first interlayer insulating layer 21 may be provided at the same height as a top surface of the trench-insulating layer 30.

Bit line contacts DC may be provided in the first holes H1, respectively. The bit line contacts DC may be in contact with the second regions 11b of the active regions 11, respectively. The bit line contacts DC may include at least one selected from a group consisting of a metal silicide, a poly-silicon, a metal nitride, and a metal. Bit lines BL are provided on the trench-insulating layer 30, so as to extend onto the first interlayer insulating layer 21 in a third direction D3 crossing the first and second directions D1 and D2. The second direction D2 and the third direction D3 may be perpendicular to each other. The bit lines BL are connected to the second regions 11b of the active regions 11 through the bit line contacts DC.

The bit lines BL may be formed of a metal containing layer. A capping pattern 75 may be provided on each of the bit lines BL. A spacer layer 77 may be provided on each sidewall of the bit line BL. The capping pattern 75 and the spacer layer 77 may be formed of, for example, a silicon oxide layer or a silicon nitride layer.

A second interlayer insulating layer 40 may be provided on the first interlayer insulating layer 21 and the trench-insulating layer 30. In the cell array region CAR, the second interlayer insulating layer 40 may cover the bit line BL.

In the cell array region CAR, storage node contacts BC may be provided to penetrate the first and second interlayer insulating layers 21 and 40. The storage node contacts BC may be in contact with the first regions 11a.

An etch stop layer 41 may be provided on the second interlayer insulating layer 40. The etch stop layer 41 may expose the storage node contacts BC. Data storage elements may be formed on the storage node contacts BC, respectively. The semiconductor device according to the present embodiment may be a dynamic random access memory (DRAM) device. In this case, the data storage element may be a capacitor CP. In more detail, storage nodes, i.e., lower electrodes 51 are formed on the etch stop layer 41 in the cell array region CAR. The lower electrodes 51 may penetrate the etch stop layer 41, so as to be electrically connected to the storage node contacts BC, respectively. However, the data storage element of the inventive concept is not limited thereto. In other embodiments, the data storage element may be a variable resistance element of a phase change RAM (PRAM) device, a variable resistance element of a resistive RAM (RRAM) device, or a magnetic tunnel junction (MTJ) pattern of a magnetic RAM (MRAM) device.

A dielectric layer 53 may conformally cover top surfaces and sidewalls of the lower electrodes 51. The dielectric layer 53 may include a metal oxide having a high dielectric constant. An upper electrode 55 may conformally cover the dielectric layer 53. The capacitor CP may include the lower electrode 51, the dielectric layer 53, and the upper electrode 55. The upper electrode 55 may be formed of, for example, titanium nitride. The upper electrode 55 may be covered by a plate electrode 57. The plate electrode 57 may include, for example, tungsten. The plate electrode 57 may fill a space between the lower electrodes 51.

In the peripheral circuit region PCR, a peripheral gate insulating layer 71 and a peripheral gate 70 are sequentially stacked on the substrate 10. The peripheral gate 70 may include a first gate layer 72 and a second gate layer 73 that are sequentially stacked. The first gate layer 72 may be a polysilicon layer, and the second gate layer 73 may be a metal containing layer. The second gate layer 73 may include the same material as the bit line BL. Because the material of the bit line BL in the cell array region 73 is also used as the gate material of the peripheral circuit region PCR, an additional deposition process for a peripheral gate is not required. Thus, manufacturing processes of the semiconductor device may be simplified and a thickness of the interlayer insulating layer may be reduced. The spacer layer 77 may also cover a sidewall of the peripheral gate 70. The capping patterns 75 may cover top surfaces of the bit line BL and the peripheral gate 70, respectively.

Peripheral dopant regions 79 are provided in the substrate 10 at both sides of the peripheral gate 70, respectively. The substrate 10 of the peripheral circuit region PCR may be covered by the second interlayer insulating layer 40. The bit line BL may be electrically connected to the peripheral dopant region 79 through a first peripheral contact 63, a peripheral interconnection 65, and a second peripheral contact 64. The first peripheral contact 63 may penetrate the capping pattern 75. The peripheral interconnection 65 may be disposed on the etch stop layer 41. The second peripheral contact 64 may penetrate the second interlayer insulating layer 40 and the etch stop layer 41.

A method of manufacturing a semiconductor device according to a first embodiment will be described hereinafter. FIGS. 3A to 11A are plan views sequentially illustrating a method of manufacturing a semiconductor device according to a first embodiment of the inventive concept. FIGS. 3A to 11A correspond to FIG. 2A. FIGS. 3B, 4B, 4C, 4D, 4E, 5B, 6B, 7B, 7C, 8B, 9B, 10B, and 11B are cross-sectional views sequentially illustrating a method of manufacturing a semiconductor device according to a first embodiment of the inventive concept. FIGS. 3B, 4B, 4C, 4D, 4E, 5B, 6B, 7B, 7C, 8B, 9B, 10B, and 11B correspond to FIG. 2B.

Figure 3A:
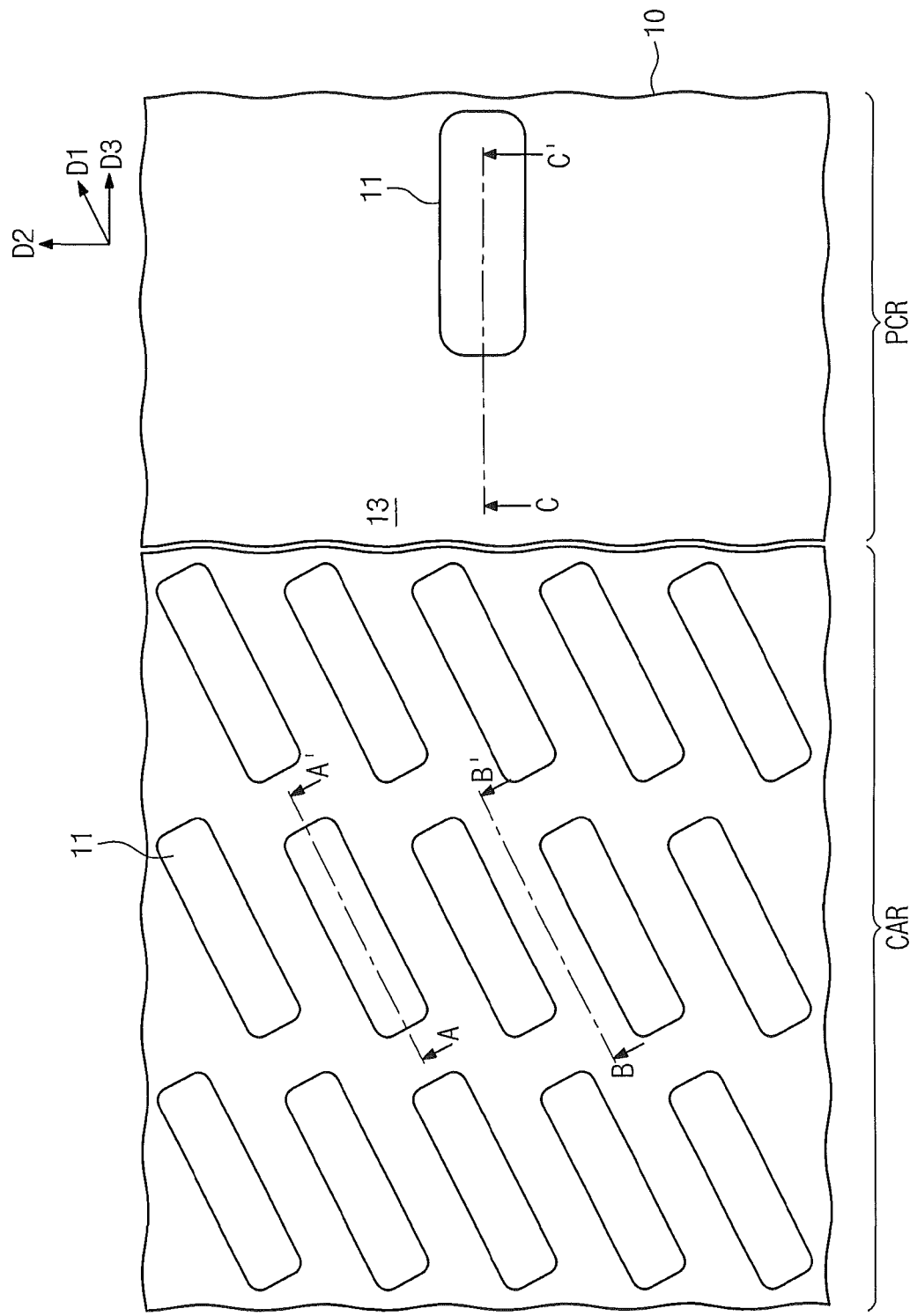
Figure 3B:
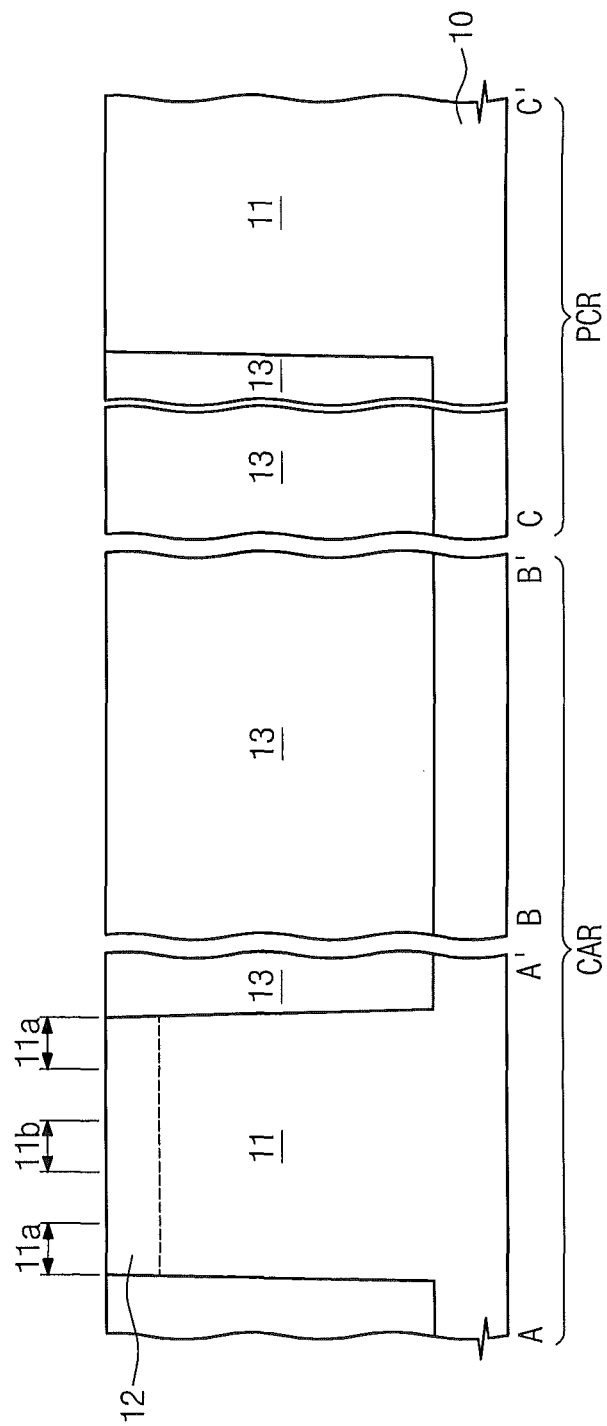

Referring to FIGS. 3A and 3B, a substrate 10 is provided. The substrate 10 includes a cell array region CAR and a peripheral circuit region PCR. The substrate 10 may be a first conductivity type (e.g., a P-type) silicon substrate. A device isolation layer 13 is formed in the substrate 10 to define an active region 11. The device isolation layer 13 may be formed using a method, such as a shallow trench isolation (STI) method. The device isolation layer 13 may include, for example, a silicon oxide layer.

In the cell array region CAR, the active region 11 may have a bar-shape extending in a first direction D1 in a plan view. A plurality of the active regions 11 may be provided in the cell array region CAR. The active regions 11 may be arranged in parallel to the first direction D1. The active regions 11 may be disposed along a second direction D2 crossing the first direction D1. Each of the active regions 11 may have first regions 11a and a second region 11b between the first regions 11a. The first regions 11a may be disposed at edges of the active region 11, respectively, and the second region 11b may be disposed at a center of the active region 11. An upper portion 12 of the active region 11 may be doped with dopants of a second conductivity type (e.g., an N-type).

Referring to FIGS. 4A and 4B, a plurality of first mask patterns 20 may be formed on the substrate 10. In the cell array region CAR, the first mask patterns 20 may have linear shapes extending in the second direction D2. The first mask patterns 20 may cross over the active regions 11 and the device isolation layer 13. The first mask patterns 20 may cover the first regions 11a of each active region 11 and may expose a portion of each active region 11 disposed between the first regions 11a. The first mask pattern 20 in the peripheral circuit region PCR may cover the active region 11 and the device isolation layer 13 in the peripheral circuit region PCR. Each of the first mask patterns 20 may include a lower mask pattern 21 and an upper mask pattern 22. The lower mask pattern 21 may be formed of, for example, a silicon oxide layer. The upper mask pattern 22 may be formed of, for example, a silicon nitride layer or a silicon oxynitride layer.

In the cell array region CAR, the substrate 10 is patterned using the first mask patterns 20, thereby forming a first trench 15a. A bottom of the first trench 15a is higher than a bottom surface of the device isolation layer 13. A liner nitride layer 23 may be formed on the first trench 15a and the first mask pattern 20.

Referring to FIG. 4C, a pair of spacer layers 24 may be formed on sidewalls of the first trench 15a. The spacer layers 24 extend in the second direction D2. A thickness of each of the spacer layers 24 is less than a half of a width of the first trench 15a. For example, the thickness of each of the spacer layers 24 may be about one-third (⅓) of the width of the first trench 15a. The spacer layers 24 may be formed of, for example, a silicon oxide layer.

A first gap insulating layer 26 may be formed in the first trench 15a between the pair of spacer layers 24. The first gap insulating layer 26 may be formed of a material having an etch selectivity with respect to the spacer layers 24. The first gap insulating layer 26 may be formed of, for example, a silicon nitride layer or a silicon oxynitride layer.

Figure 4D:
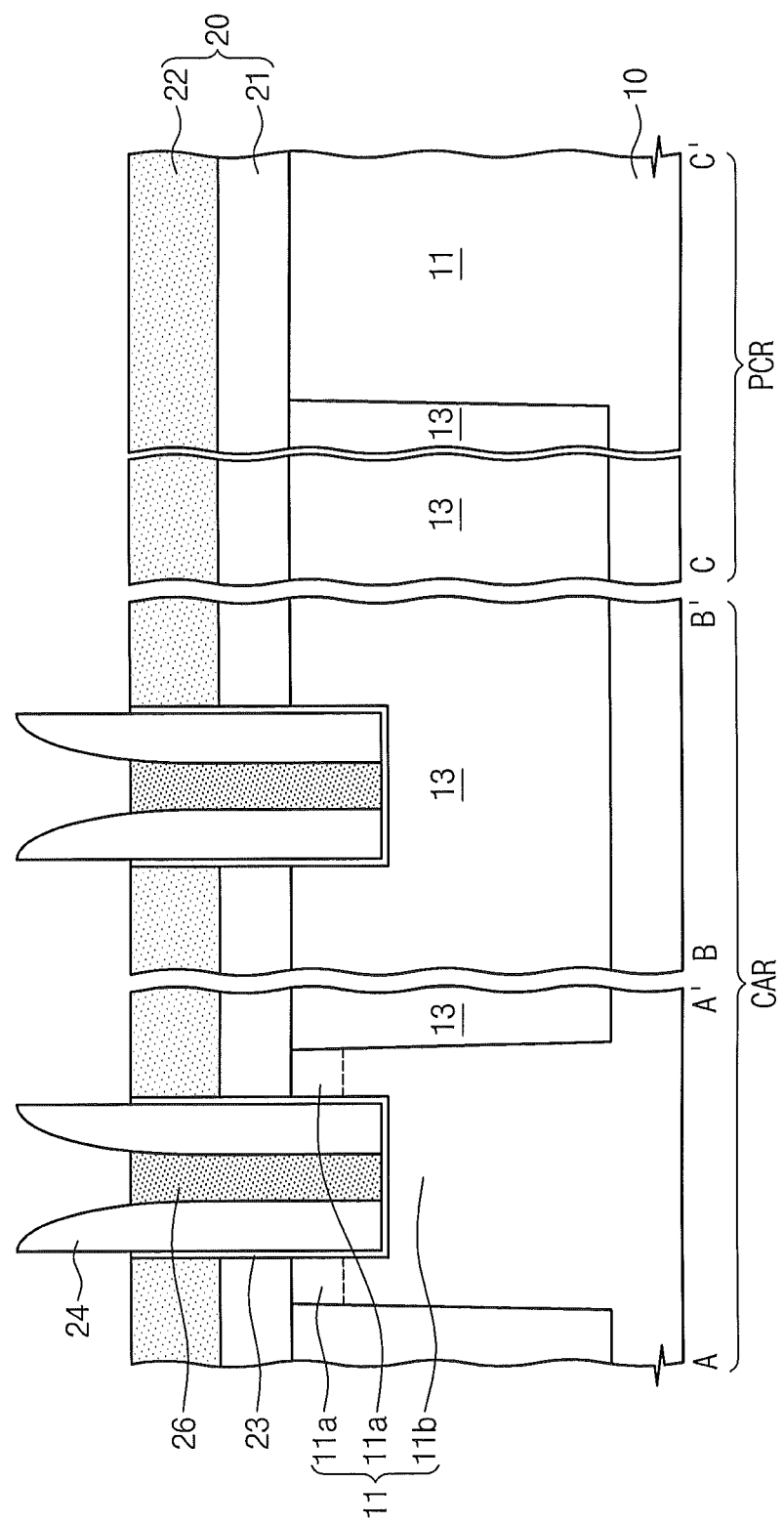

Referring to FIGS. 4D and 4E, the first gap insulating layer 26 is recessed to be lower than top ends of the spacer layers 24 by an etching process. Recessing the first gap insulating layer 26 may be performed using a wet etching process. At this time, the upper mask pattern 22 may be recessed to a level similar to that of a top surface of the recessed gap insulating layer 26. Subsequently, the spacer layers 24 may be selectively removed to expose the liner nitride layer 23 disposed on the bottom of the first trench 15a. The first gap insulating layer 26 may remain on only a second region 11b of each of the active regions 10 in the cell array region CAR.

Figure 5B:
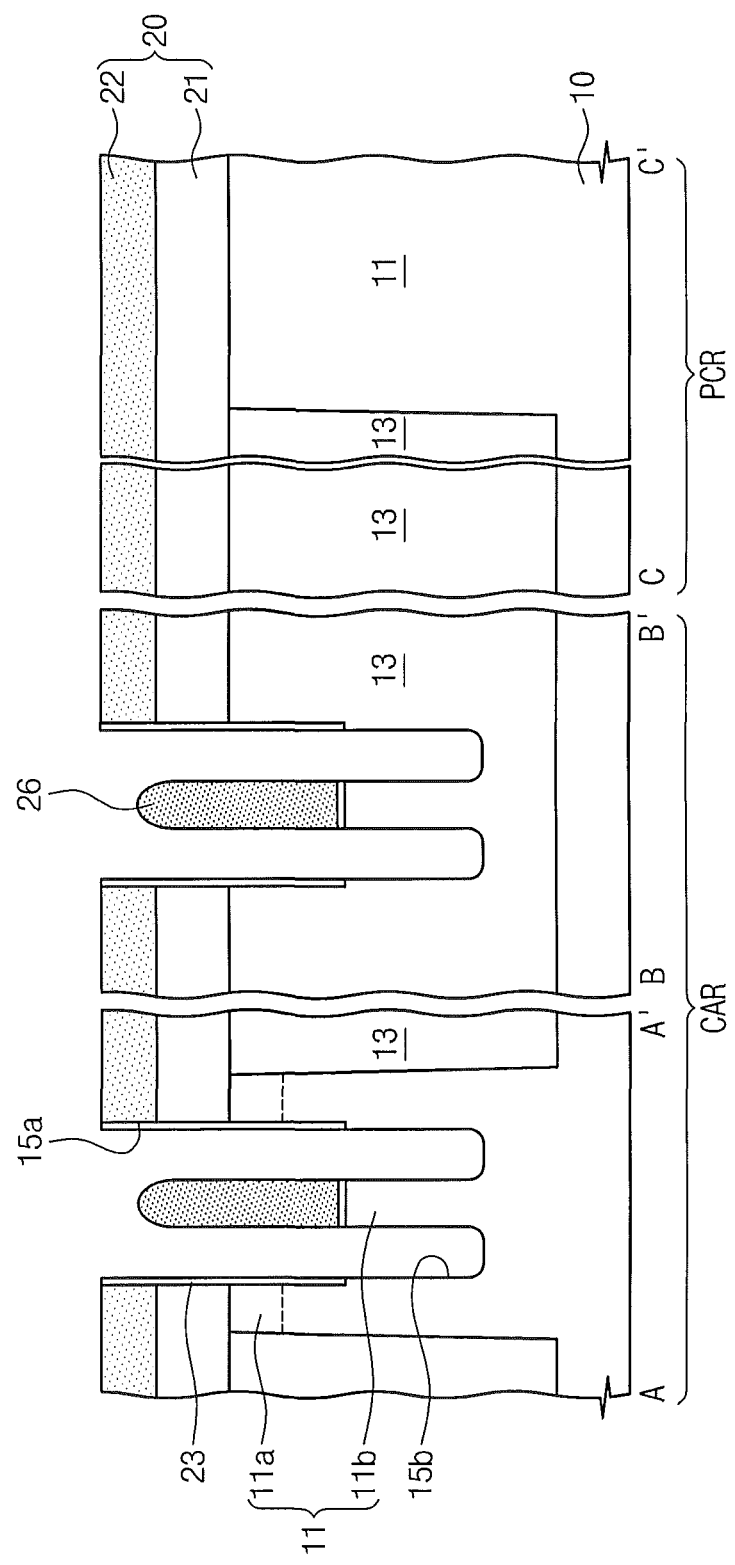

Referring to FIGS. 5A and 5B, the bottom surface of the first trench 15a is etched using the first mask pattern 20 and the first gap insulating layer 26 as etch masks, thereby forming second trenches 15b. Bottoms of the second trenches 15b are formed to be higher than the bottom surface of the device isolation layer 13.

Figure 6B:
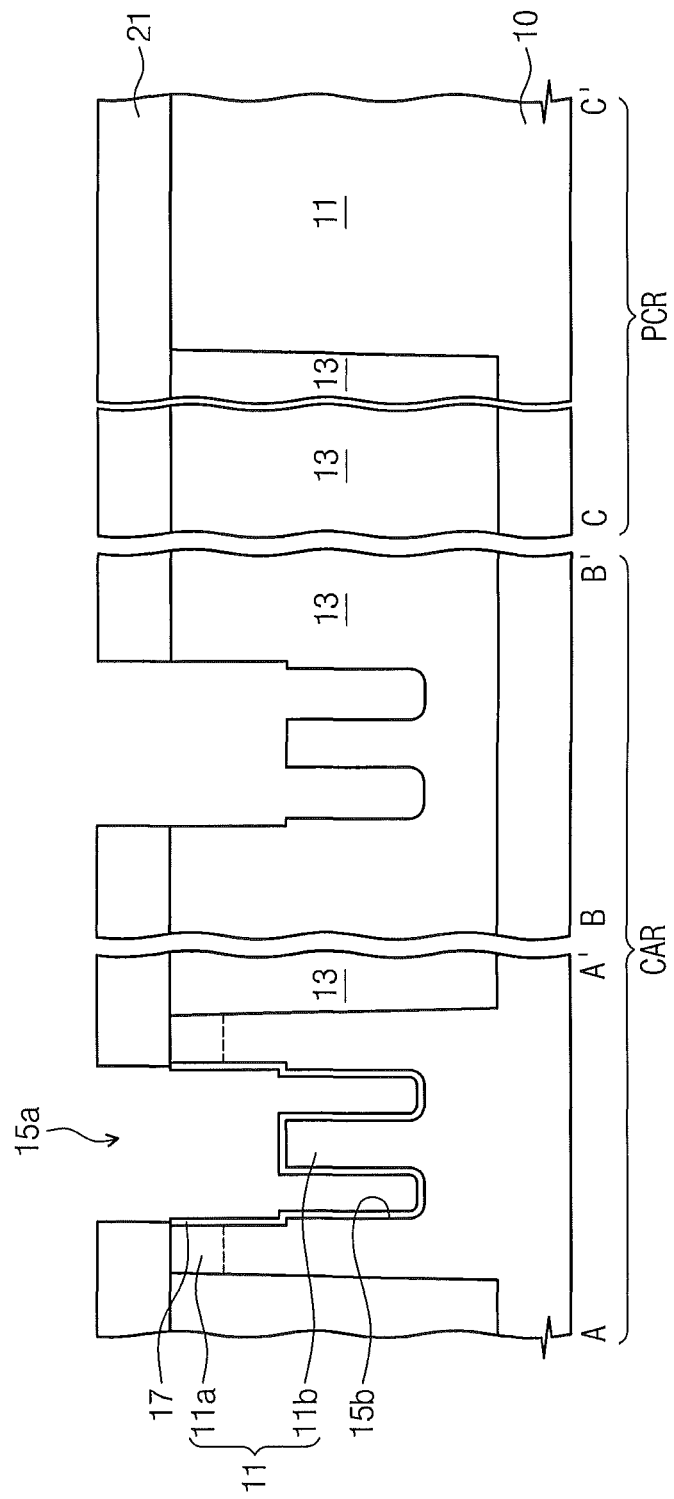

Referring to FIGS. 6A and 6B, the upper mask pattern 22 and the first gap insulating layer 26 are selectively removed. At this time, the liner nitride layer 23 may be removed. Thus, the bottom surfaces and sidewalls of the first trench 15a and the second trenches 15b may be exposed. The substrate 10 between the second trenches 15b is the second region 11b of the active region 10. A top surface of the substrate 10 and the lower mask pattern 21 on the device isolation layer 13 may be exposed. If the upper mask pattern 22 and the first gap insulating layer 26 are formed of a silicon nitride layer or a silicon oxynitride layer, they may be removed using an etching solution including phosphoric acid.

A gate insulating layer 17 may be formed on the bottom surfaces and the sidewalls of the first trench 15a and the second trenches 15b. For example, the gate insulating layer 17 may be a silicon oxide layer formed by thermally oxidizing the substrate 10.

Figure 7B:
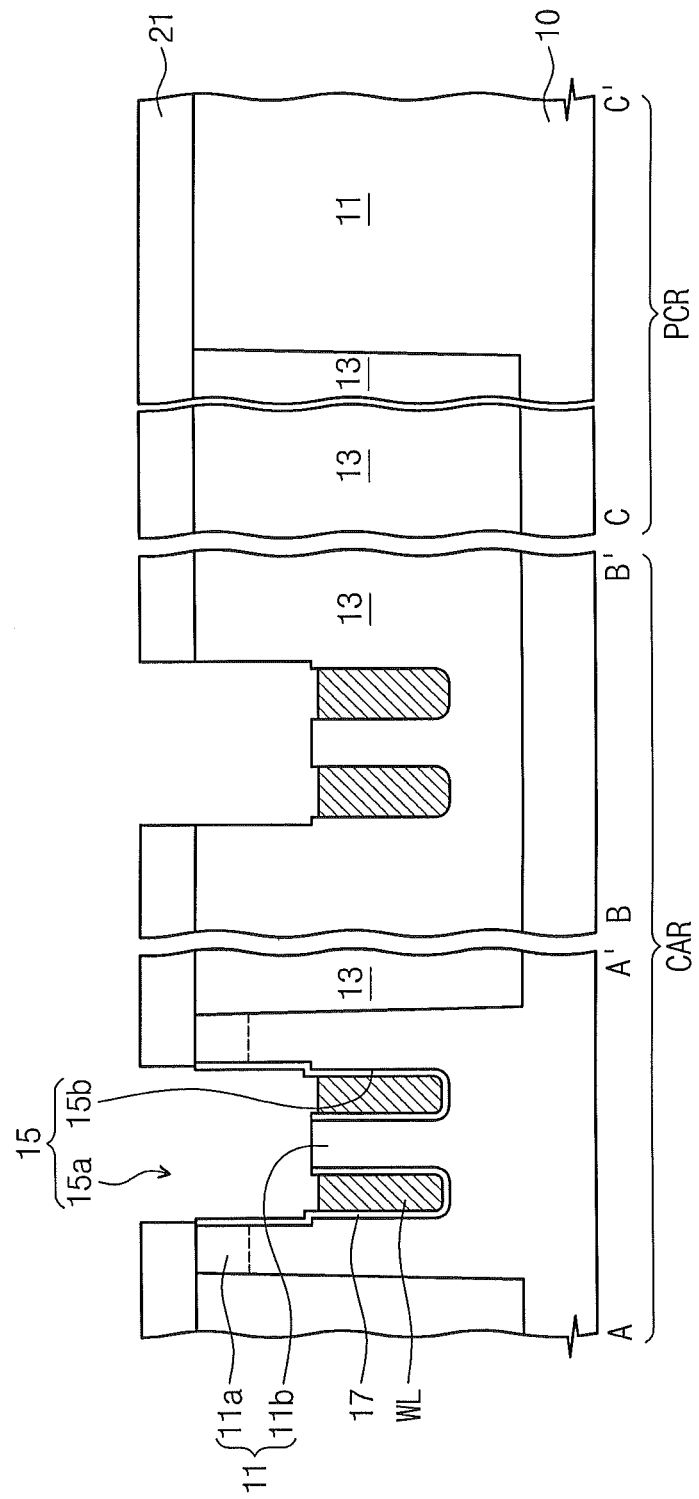

Referring to FIGS. 7A and 7B, word lines WL may be formed in the second trenches 15b. In some embodiments, a conductive layer may be formed in the first and second trenches 15a and 15b and then the conductive layer may be recessed to form the word lines WL. Top surfaces of the word lines WL may be lower than the top surface of the substrate 10 of the second region 11b by the recessing process performed on the conductive layer. Recessing the conductive layer may be performed using an etch-back process. The conductive layer may include at least one material selected from a group consisting of a poly-silicon layer, a metal silicide layer, and a metal layer.

A trench 15 includes the first trench 15a having a generally wide width and the second trenches 15b formed under the first trench 15a and having generally narrow widths. Thus, even though a width of the trench 15 is reduced, the conductive layer for the word lines WL can easily fill the trench 15 and the etch-back process can be easily performed on the conductive layer for the word lines WL. Thus, heights of the top surfaces of the word lines can be substantially uniform.

Figure 7C:
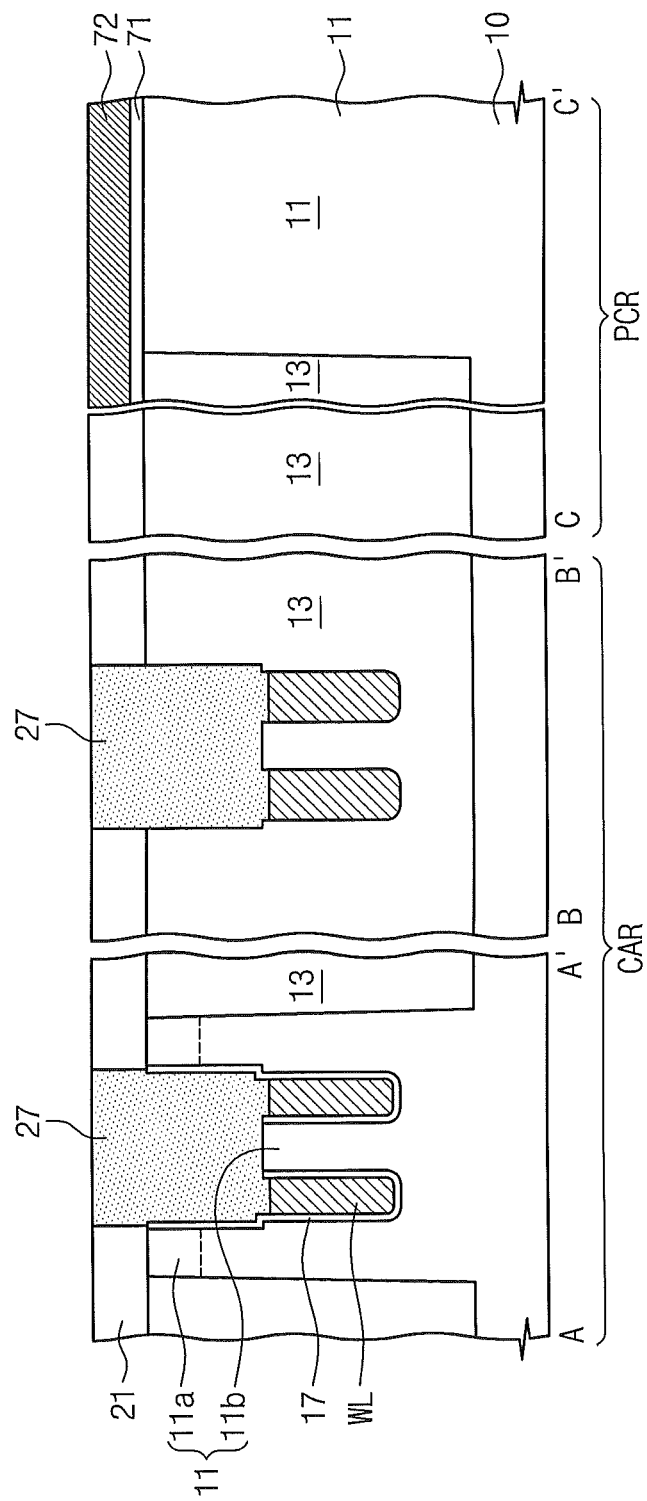

Referring to FIG. 7C, a sacrificial layer 27 may be formed to fill the first trench 15a. The sacrificial layer 27 may have an etch selectivity with respect to a silicon oxide layer. For example, the sacrificial layer 27 may be a silicon nitride layer or a silicon oxynitride layer. The lower mask pattern 21 in the peripheral circuit region PCR may be removed to expose the substrate 10 of the peripheral circuit region PCR. Hereinafter, the lower mask patterns 21 in the cell array region CAR will be defined as a first interlayer insulating layer 21. A peripheral gate insulating layer 71 and a first gate layer 72 may be formed in the peripheral circuit region PCR. The peripheral gate insulating layer 71 may be formed by thermally oxidizing the substrate 10. The first gate layer 72 may be a poly-silicon layer. The peripheral gate insulating layer 71 and the first gate layer 72 may be removed in the cell array region CAR. Thereafter, the sacrificial layer 27 may be removed.

Referring to FIGS. 8A and 8B, a first insulating layer 31 may be formed on the sidewalls and the bottom surface of the first trench 15a. For example, the first insulating layer 31 may be a silicon nitride layer or a silicon oxynitride layer. A second insulating layer 33 may be formed on the first insulating layer 31 to fill the first trench 15a. The second insulating layer 33 may be, for example, a silicon oxide layer. The first insulating layer 31 may prevent the word lines WL from being oxidized in the process of forming the second insulating layer 33 (i.e., the silicon oxide layer).

The first and second insulating layers 31 and 33 may extend in the second direction D2. The first insulating layer 31 and the second insulating layer 33 may be patterned to form a first hole H1 by an etching process using a photoresist pattern (not shown). The first hole H1 may expose the second region 11b and at least portions of the word lines WL adjacent to the second region 11b.

Referring to FIGS. 9A and 9B, a third insulating layer 35 may be formed on a sidewall of the first hole H1. For example, the third insulating layer 35 may be a silicon nitride layer or a silicon oxynitride layer. The third insulating layer 35 may be a spacer layer formed on the sidewall of the first hole H1. The third insulating layer 35 may cover the word lines WL. Thus, the third insulating layer 35 may define a second hole H2 having a smaller size than the first hole H1. The second hole H2 may expose the second region 11b.

A trench-insulating layer 30 may include the first to third insulating layers 31, 33, and 35. A top surface of the trench-insulating layer 30 may be disposed at substantially the same height as a top surface of the first interlayer insulating layer 21. Dopant ions of the second conductivity type (e.g., the N-type) may be implanted into the second region 11b through the second hole H2.

Figure 10A:
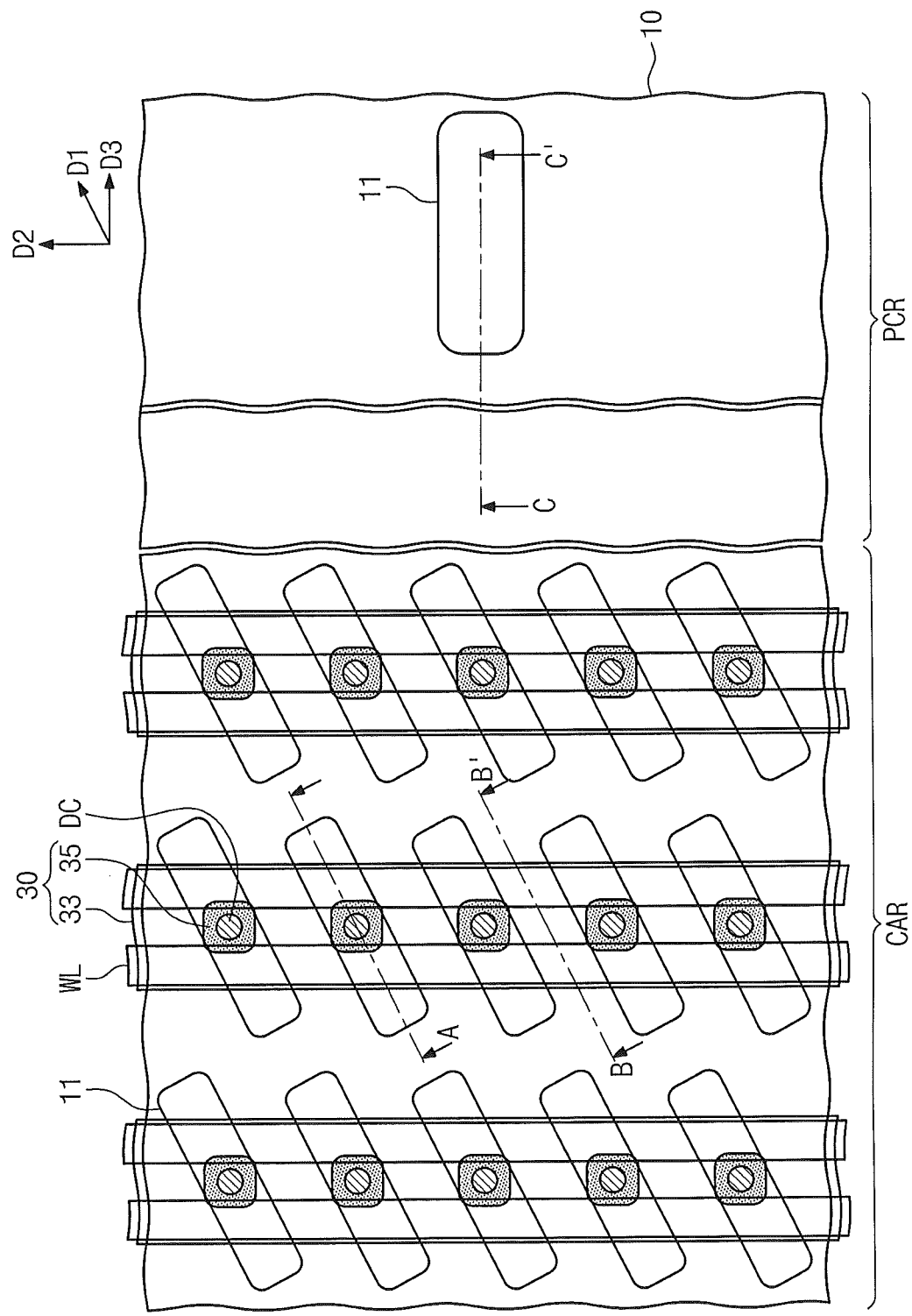
Figure 10B:
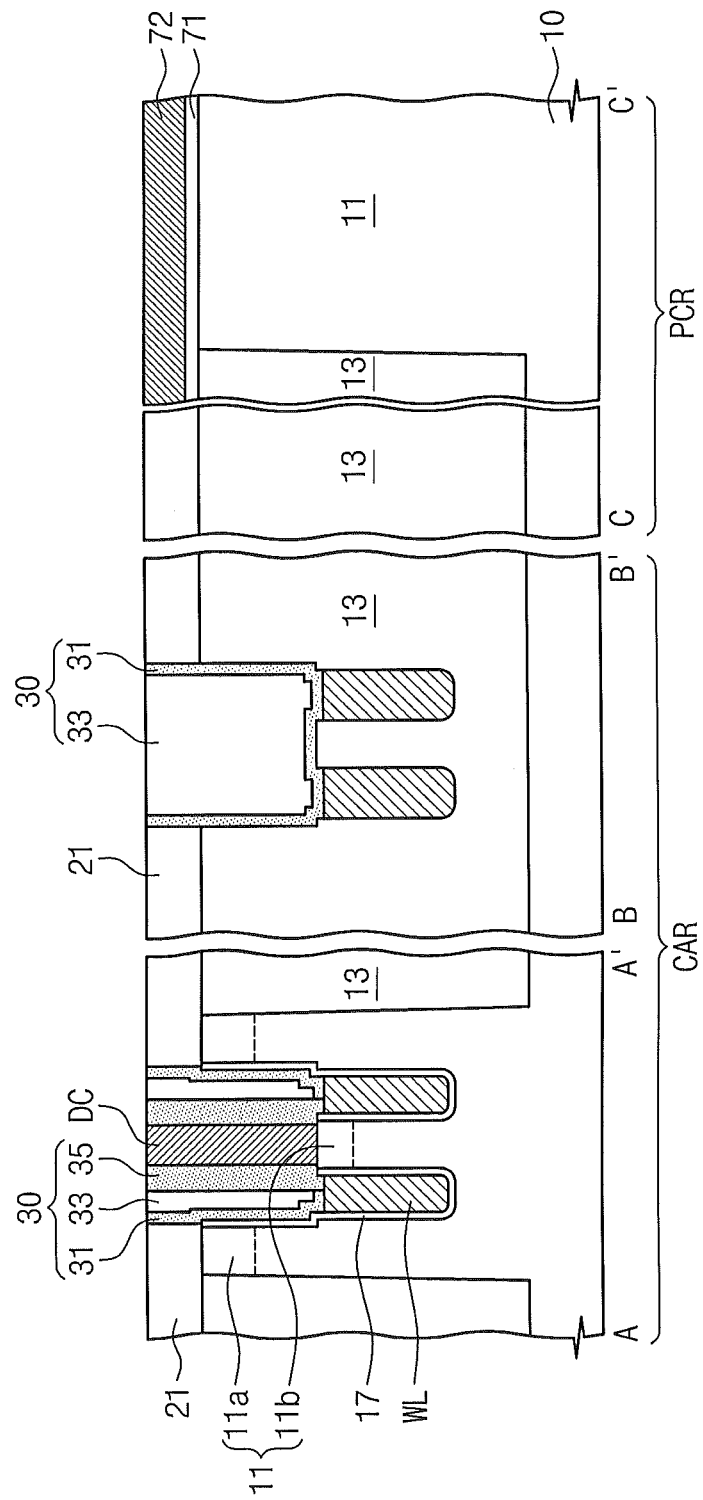

Referring to FIGS. 10A and 10B, bit line contacts DC may be formed in the second hole H2 so as to be in contact with the second region 11b. A top surface of the bit line contacts DC may be disposed at substantially the same height as the top surfaces of the trench-insulating layer 30 and the first interlayer insulating layer 21. The bit line contacts DC may include at least one material selected from a group consisting of a doped semiconductor material (e.g., doped silicon and/or doped germanium), a metal-semiconductor compound (e.g., tungsten silicide, cobalt silicide, and/or titanium silicide), a metal nitride (e.g., titanium nitride and/or tantalum nitride), and a metal (e.g., tungsten, titanium, and/or tantalum). The bit line contacts DC may be insulated from the word lines WL due to the third insulating layer 35. As a result, the second region 11b connected to the bit line contacts DC of a buried channel array transistor (BCAT) may be recessed to be lower than the top surface of the substrate 10 without an additional process.

Figure 11B:
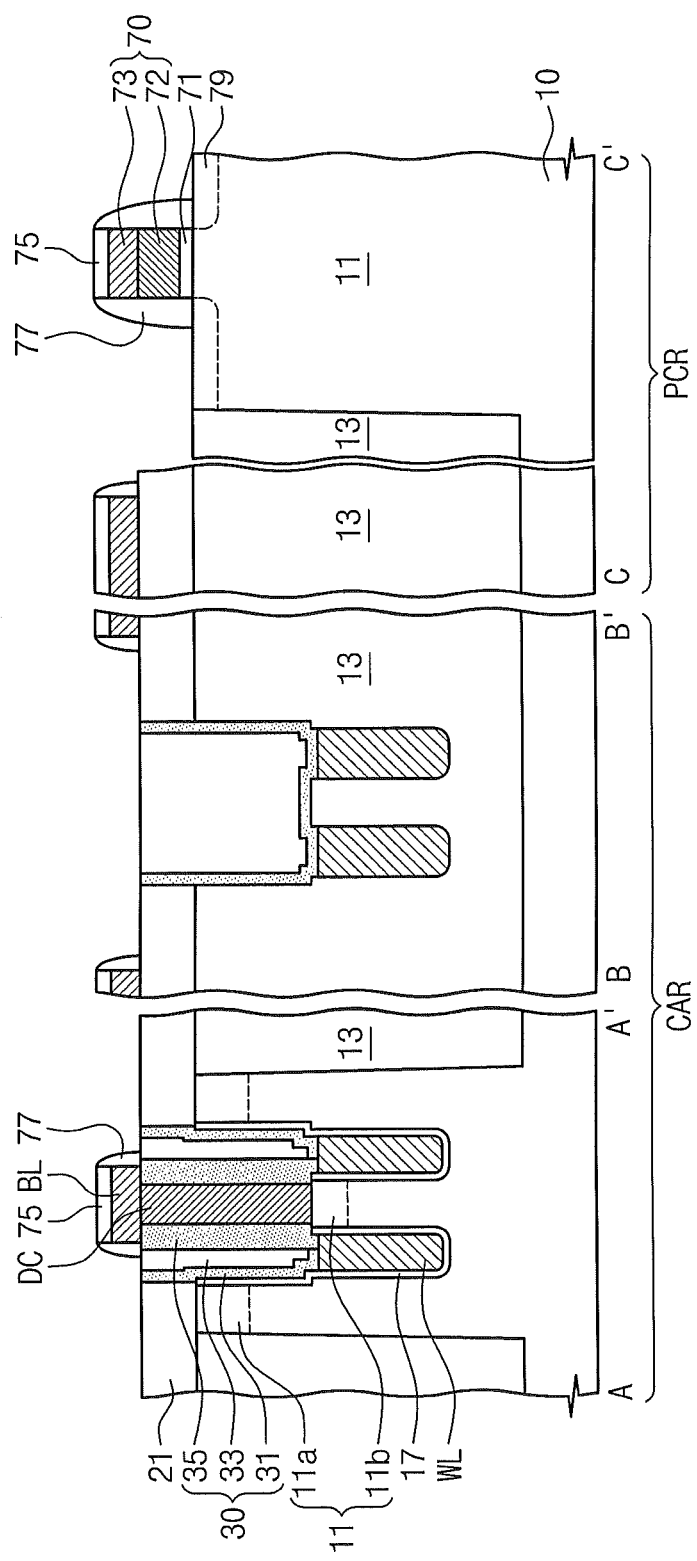

Subsequently, referring to FIGS. 11A and 11B, a conductive layer (not shown) may be formed on the substrate 10. For example, the conductive layer may include at least one material selected from a group consisting of a doped semiconductor material (e.g., doped silicon and/or doped germanium), a metal-semiconductor compound (e.g., tungsten silicide, cobalt silicide, and/or titanium silicide), a metal nitride (e.g., titanium nitride and/or tantalum nitride), and a metal (e.g., tungsten, titanium, and/or tantalum). A capping layer (not shown) may be formed on the conductive layer. The capping layer and the conductive layer may be patterned. Thus, the capping layer may be formed into capping patterns 75, and the conductive layer may be formed into a bit line BL in the cell array region CAR and a second gate layer 73 in the peripheral circuit region PCR. At this time, the first gate layer 72 may be patterned to be aligned with the second gate layer 73.

In the cell array region CAR, the bit line BL may be provided on the trench-insulating layer 30 and the first interlayer insulating layer 21 and may extend in a third direction D3 crossing the first and second directions D1 and D2. The second direction D2 may be perpendicular to the third direction D3. The bit line BL is electrically connected to the second region 11b through the bit line contacts DC. The bit line BL may be a metal containing layer. The bit line BL may extend into the peripheral circuit region PCR. In the peripheral circuit region PCR, a peripheral gate 70 may include the first gate layer 72 and the second gate layer 73 that are sequentially stacked. The second gate layer 73 may include the same material as the bit line BL. Thus, the material of the bit line BL in the cell array region CAR is also used as the gate electrode material of the peripheral circuit region PCR. As a result, an additional deposition process for the gate electrode of the peripheral circuit region PCR is not required to simplify the manufacturing processes of the semiconductor device.

A spacer layer 77 may be formed on sidewalls of the bit line BL and the peripheral gate 70. The capping patterns 75 may be provided on the bit line BL and the peripheral gate 70, respectively.

Peripheral dopant regions 79 may be provided in the substrate 10 at both sides of the peripheral gate 70 in the peripheral circuit region PCR.

Referring again to FIGS. 2A and 2B, a second interlayer insulating layer 40 may be formed on the first interlayer insulating layer 21 and the trench-insulating layer 30. For example, the second interlayer insulating layer 40 may be a silicon oxide layer. In the cell array region CAR, the second interlayer insulating layer 40 may cover the bit line BL. In the peripheral circuit region PCR, the second interlayer insulating layer 40 may cover the peripheral gate 70. In the cell array region CAR, storage node contacts BC may be provided to penetrate the first and second interlayer insulating layers 21 and 40. The storage node contacts BC may be in contact with the first regions 11a.

An etch stop layer 41 may be formed on the second interlayer insulating layer 40. For example, the etch stop layer 41 may be a silicon nitride layer or a silicon oxynitride layer.

In the peripheral circuit region PCR, a peripheral interconnection 65 may be formed on the etch stop layer 41. The peripheral interconnection 65 may be connected to the bit line BL through a first peripheral contact 63 penetrating the etch stop layer 41 and the capping pattern 75. The peripheral interconnection 65 may be electrically connected to the peripheral dopant region 79 through a second peripheral contact 64 penetrating the etch stop layer 41 and the second interlayer insulating layer 40. The peripheral interconnection 65 and the peripheral contacts 63 and 64 may include a metal containing material.

In the cell array region CAR, the etch stop layer 41 may expose the storage node contacts BC. Data storage elements may be formed on the storage node contacts BC. In the present embodiment, the data storage element may be, for example, a capacitor CP. The semiconductor device of the present embodiment may be a dynamic random access memory (DRAM) device, and the data storage element may be the capacitor CP. In more detail, storage nodes, i.e., lower electrodes 51 are formed on the etch stop layer 41 in the cell array region CAR. The lower electrodes 51 may penetrate the etch stop layer 41 so as to be electrically connected to the storage node contacts BC. However, the data storage element according to the inventive concept is not limited to the capacitor CP. In other embodiments, the data storage element may be a variable resistance element of a phase change RAM (PRAM) device, a variable resistance element of a resistive RAM (RRAM) device, or a magnetic tunnel junction (MTJ) pattern of a magnetic RAM (MRAM) device.

A dielectric layer 53 may be formed to conformally cover top surfaces and sidewalls of the lower electrodes 51. The dielectric layer 53 may include a metal oxide having a high dielectric constant. An upper electrode 55 may conformally cover the dielectric layer 53. The capacitor CP may include the lower electrode 51, the dielectric layer 53, and the upper electrode 55. The upper electrode 55 may be formed of for example, titanium nitride. The upper electrode 55 may be covered by a plate electrode 57. The plate electrode 57 may include, for example, tungsten. The plate electrode 57 may fill a space between the lower electrodes 51.

According to the present embodiment of the inventive concept, even though the width of the trench 15 is reduced due to high integration of the semiconductor device, the heights of the top surfaces of the word lines WL may be substantially uniform. Thus, dispersion of BCAT cells may be reduced to improve reliability of the semiconductor device.

Figure 12B:
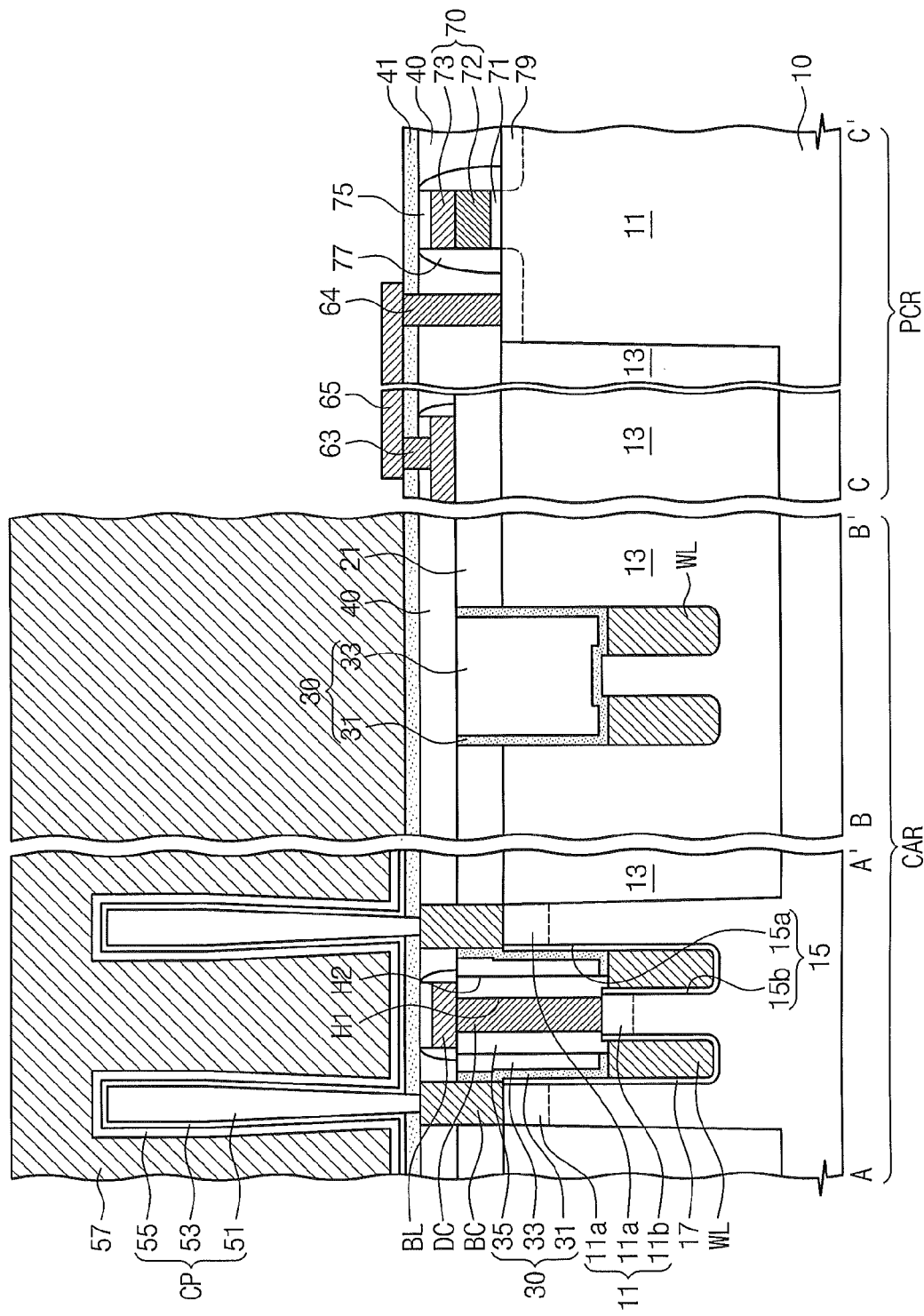
FIG. 12B is a cross-sectional view taken along lines A-A', B-B', and C-C' of FIG. 12A.

FIG. 12A is a layout of a semiconductor device according to a second embodiment of the inventive concept. FIG. 12B is a cross-sectional view taken along lines A-A', B-B', and C-C' of FIG. 12A. In the present embodiment, the descriptions to the same elements as described with reference to FIGS. 2A and 2B may be omitted or mentioned briefly. That is, differences between the present embodiment and the first embodiment will be mainly described hereinafter. Referring to FIGS. 12A and 12B, sidewalls of the first trench 15a may be aligned with sidewalls of the second trenches 15b.

FIGS. 13A to 17A are plan views sequentially illustrating a method of manufacturing a semiconductor device according to a second embodiment of the inventive concept. FIGS. 13A to 17A correspond to FIG. 12A. FIGS. 13B, 14B, 15B, 16B, and 17B are cross-sectional views sequentially illustrating a method of manufacturing a semiconductor device according to a second embodiment of the inventive concept. FIGS. 13B to 17B correspond to FIG. 12B.

Figure 13A:
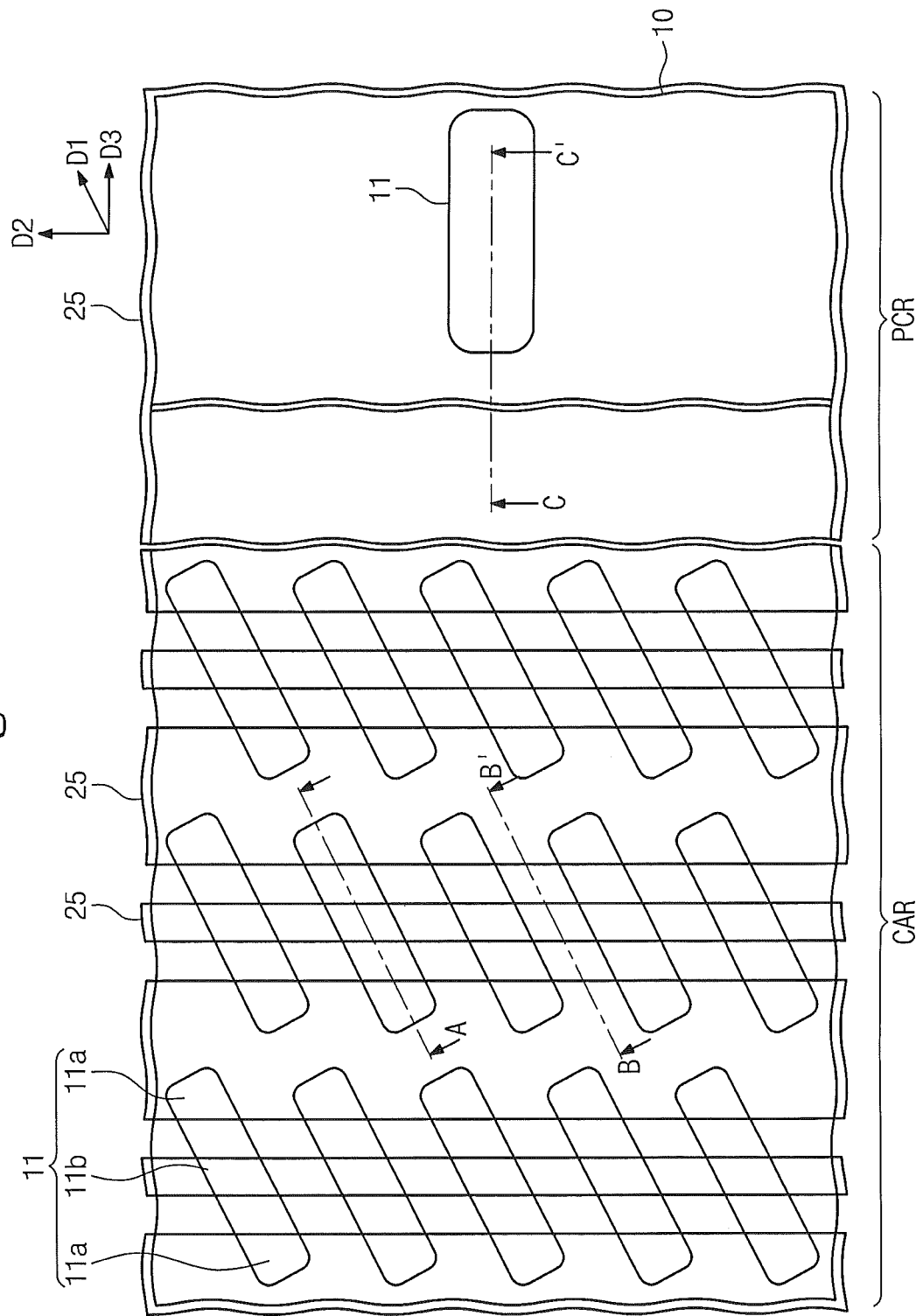
Figure 13B:
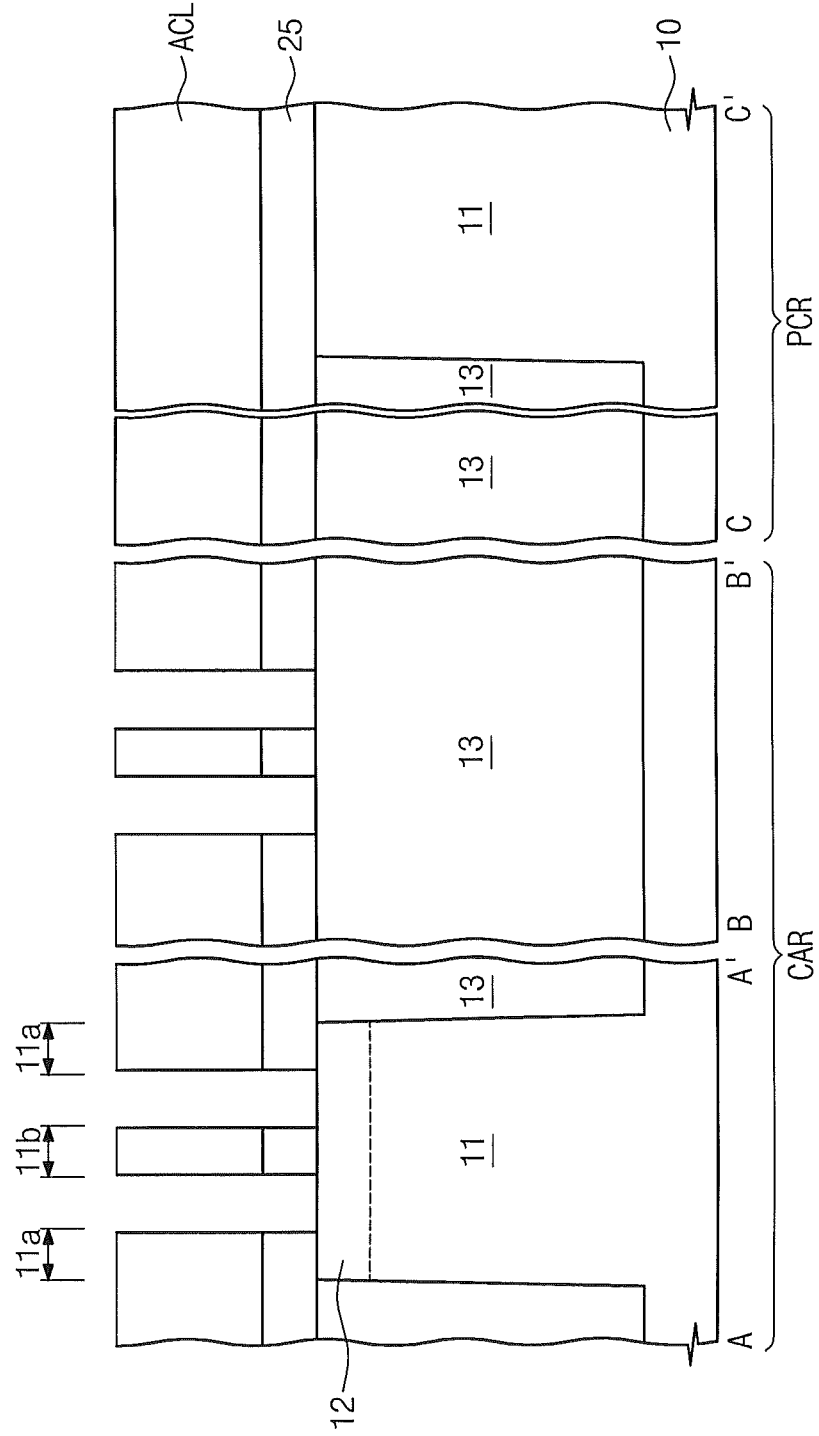
FIGS. 13B, 14B, 15B, 16B, and 17B are cross-sectional views sequentially illustrating a method of manufacturing a semiconductor device according to a second embodiment of the inventive concept.

Referring to FIGS. 13A and 13B, second mask patterns 25 may be formed on the substrate 10 described with reference to FIGS. 3A and 3B. The second mask patterns 25 may be formed by a patterning process using another mask pattern (e.g., an amorphous carbon layer ACL).

In the cell array region CAR, the second mask patterns 25 may have line shapes extending in the second direction D2. The second mask patterns 25 may cross over the active region 11 and the device isolation layer 13. The second mask patterns 25 may cover the first regions 11a and the second region 11b of the active region 11 and may expose the substrate 10 between the second region 11b and the first regions 11a. The second mask pattern 25 of the peripheral circuit region PCR may cover the substrate 10 in the peripheral circuit region PCR. For example, the second mask patterns 25 may be formed of silicon oxide.

Figure 14A:
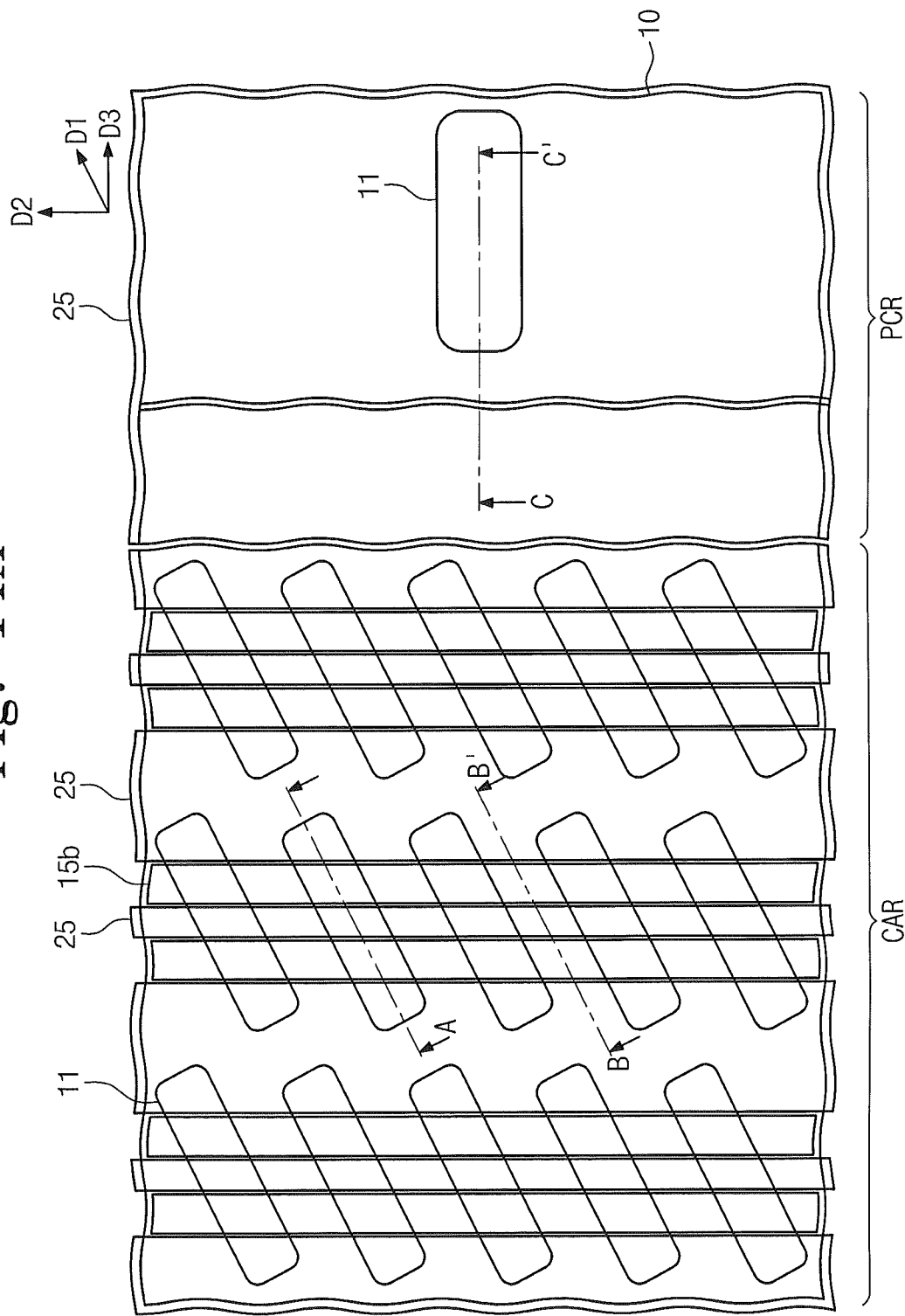
Figure 14B:
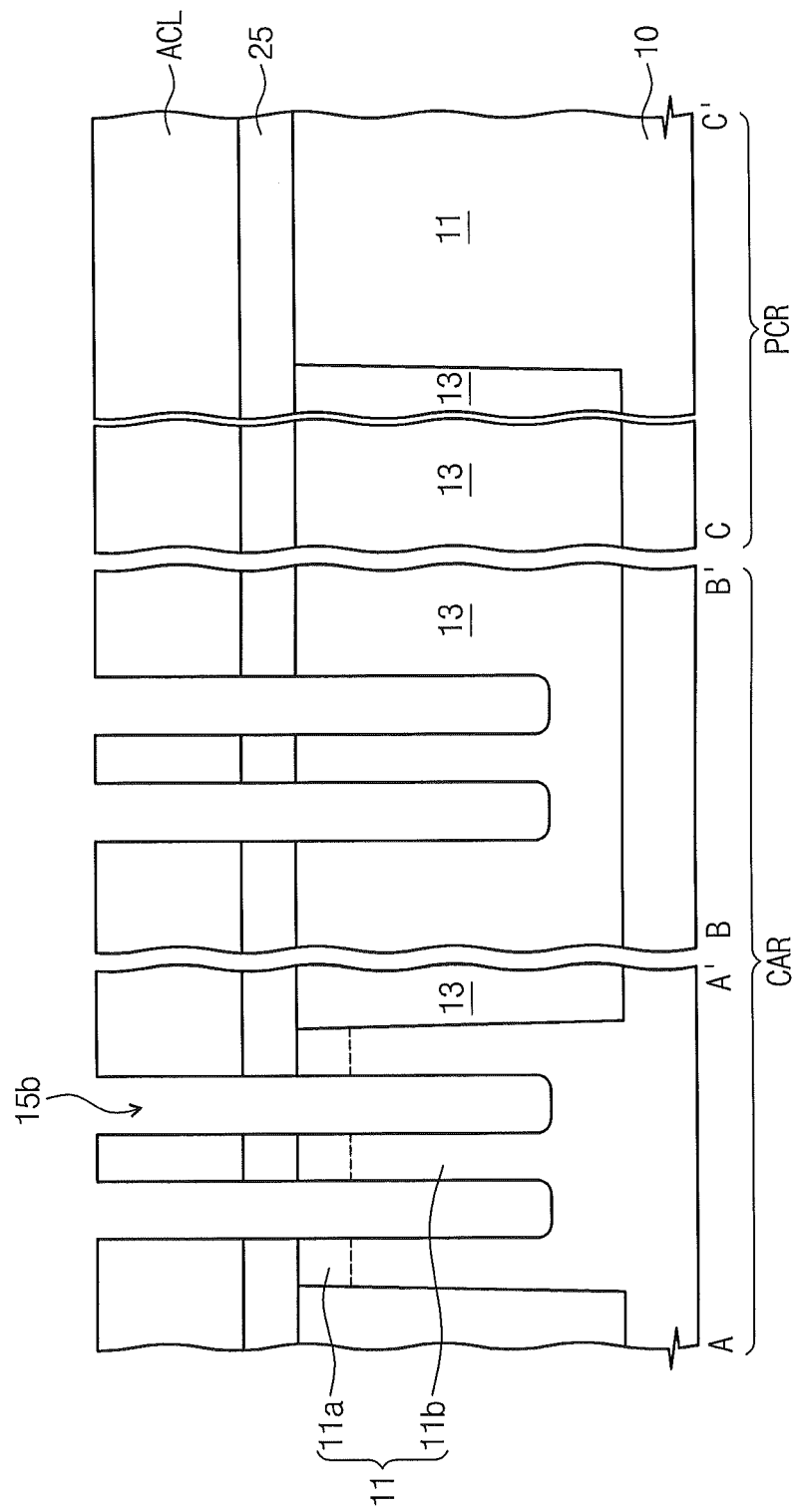

Referring to FIGS. 14A and 14B, the substrate 10 is etched using the second mask patterns 25 as etch mask to form second trenches 15b in the cell array region CAR. Bottoms of the second trenches 15b are formed to be higher than a bottom surface of the device isolation layer 13.

Figure 15A:
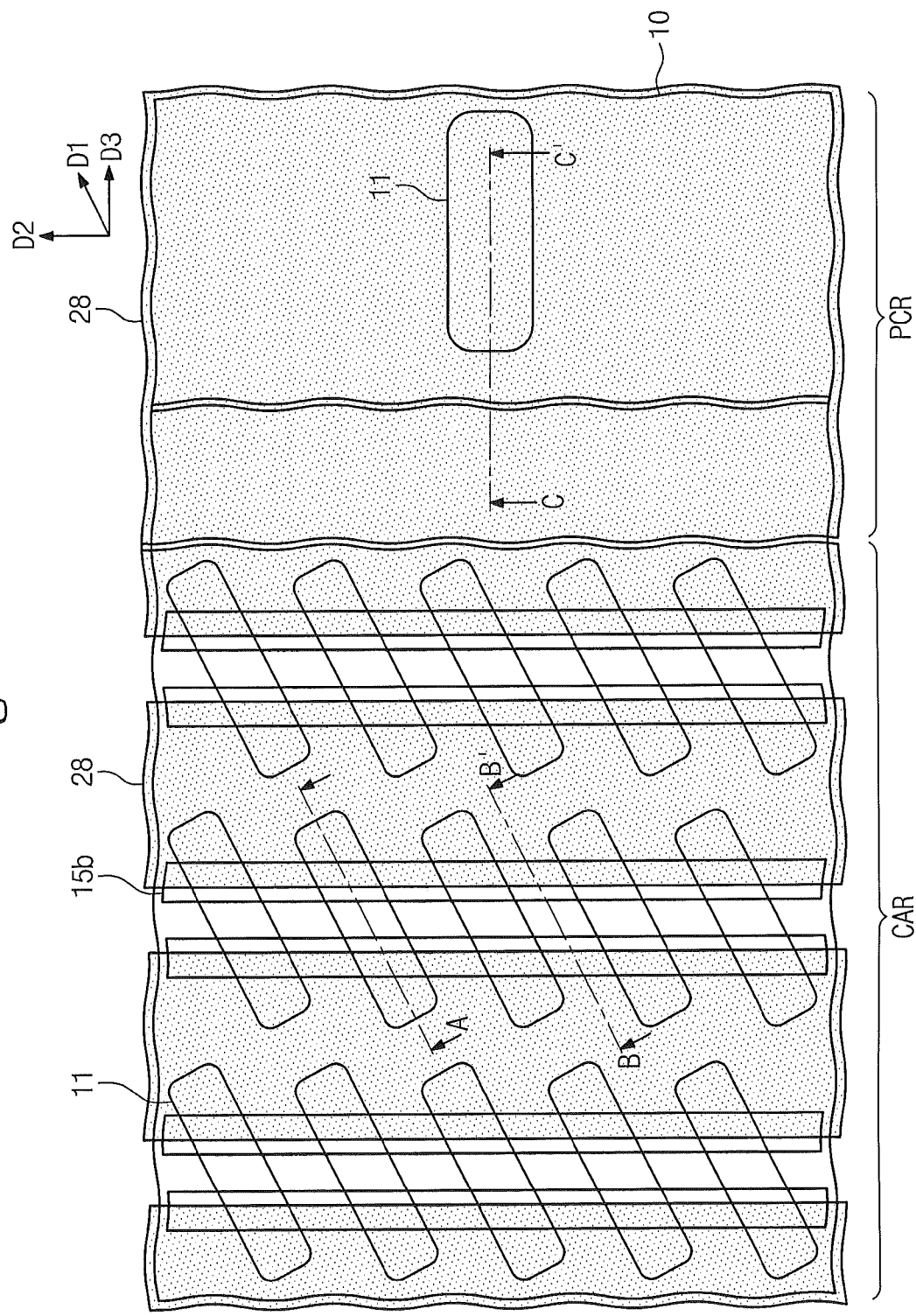
Figure 15B:
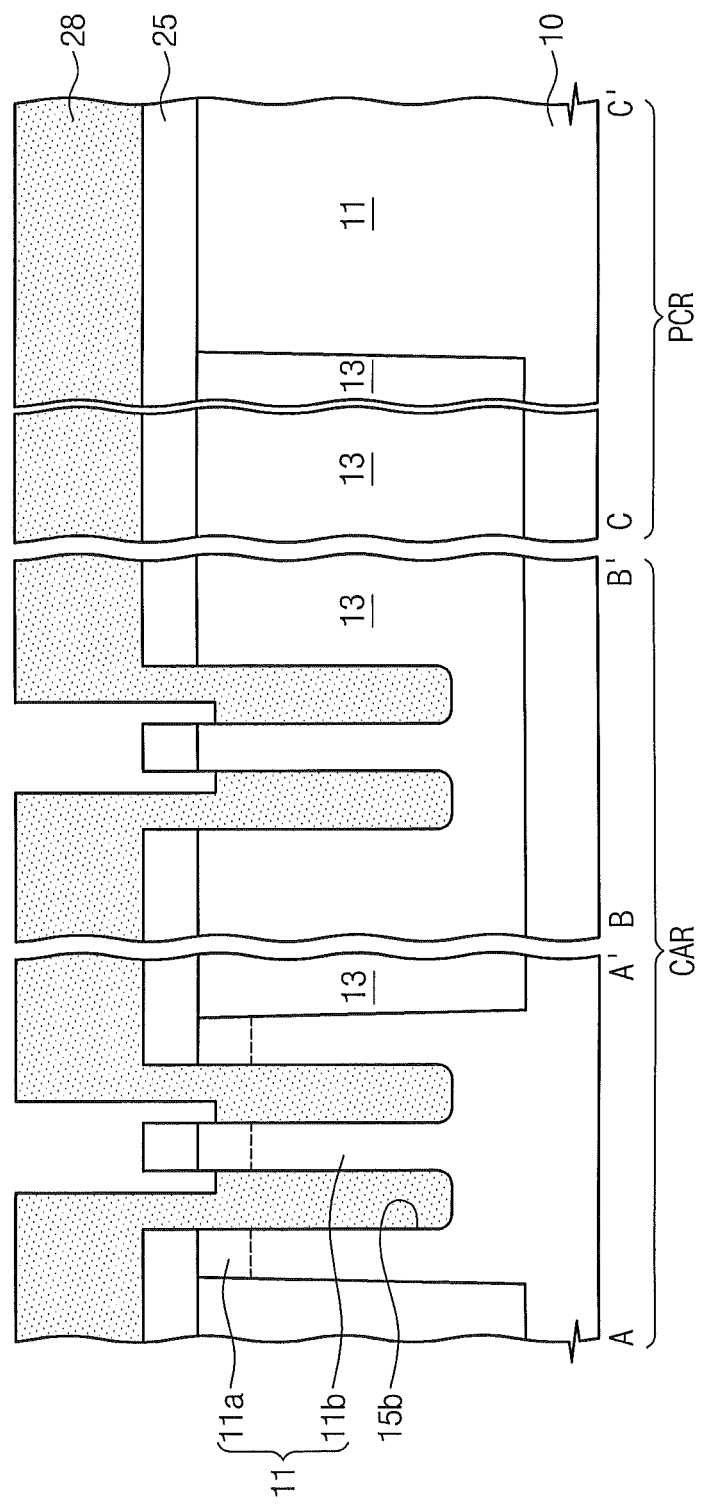

Referring to FIGS. 15A and 15B, third mask patterns 28 exposing the second region 11b are formed. The third mask patterns 28 may be formed of a spin-on-hardmask (SOH) layer. The SOH layer may be a hydrocarbon-based insulating layer. The third mask patterns 28 may have line shapes extending in the second direction D2. The third mask pattern 28 may cross over the active region 11 and the device isolation layer 13.

Figure 16B:
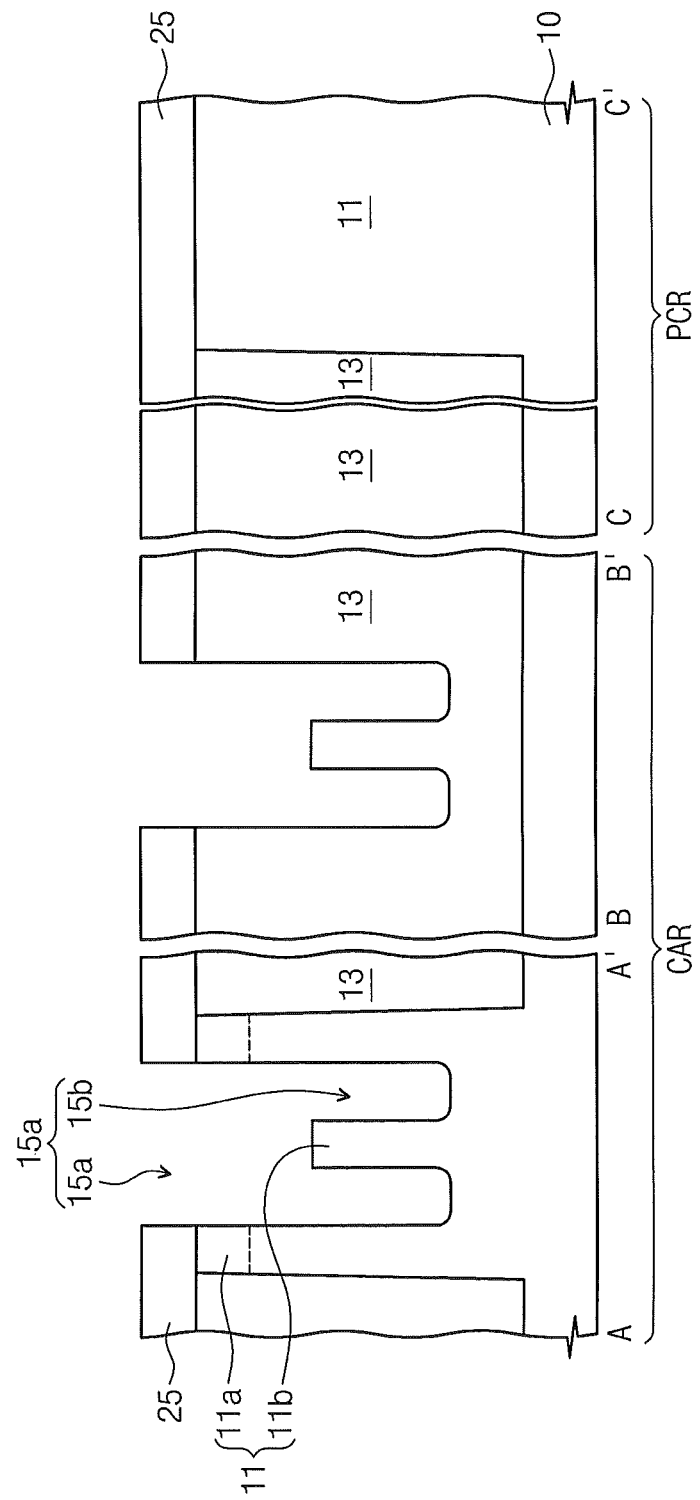

Referring to FIGS. 16A and 16B, the second mask pattern 25 and the substrate 10 are etched using the third mask patterns 28, thereby recessing the second region 11b. A top surface of the recessed second region 11b is lower than the top surfaces of the first regions 11a. Thus, a first trench 15a may be formed on the second trenches 15b. The first trench 15a has a width wider than that of each of the second trenches 15b. Sidewalls of the first trench 15a may be aligned with sidewalls of the second trenches 15b. The first and second trenches 15a and 15b may linearly extend in the second direction D2. The first and second trenches 15a and 15b cross the active region 11 and the device isolation layer 13.

Figure 17B:
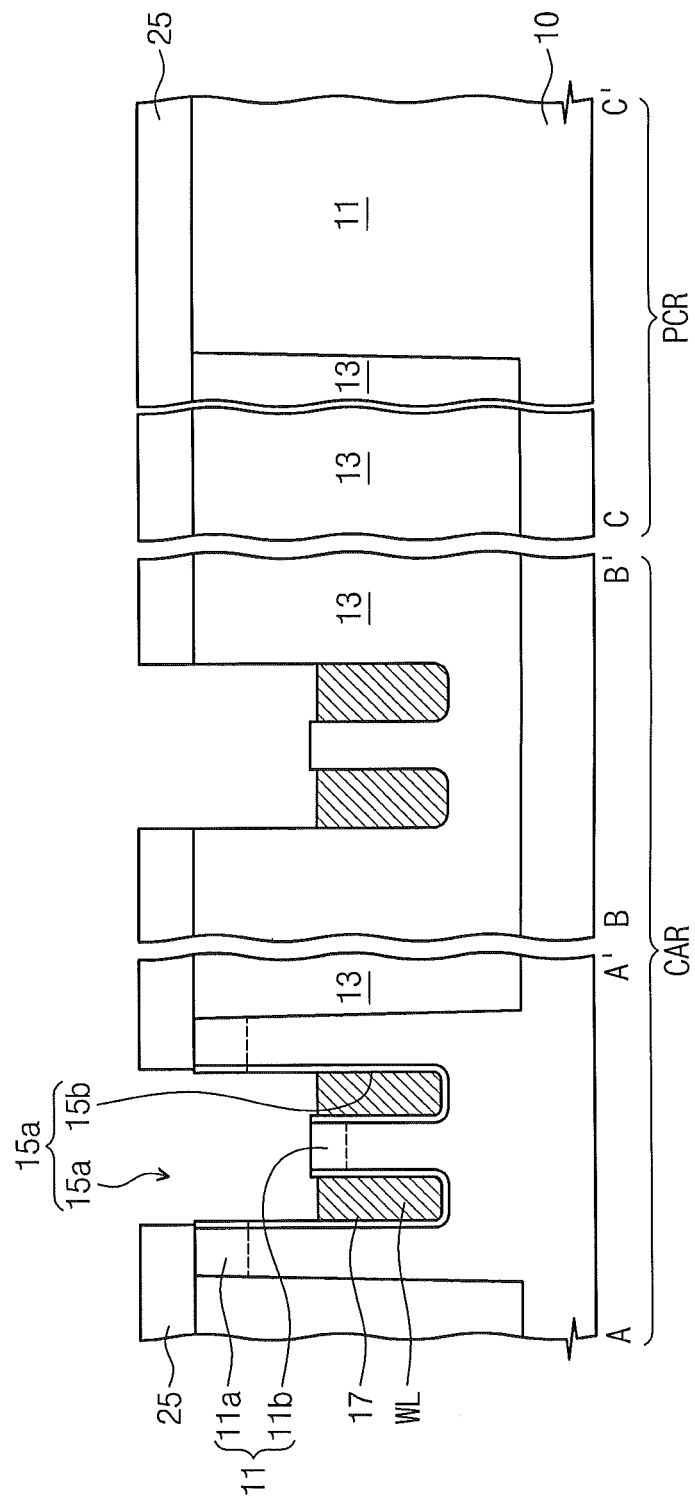

Referring to FIGS. 17A and 17B, a gate insulating layer 17 may be formed on bottom surfaces and sidewalls of the first and second trenches 15a and 15b. For example, the gate insulating layer 17 may be a silicon oxide layer formed by thermally oxidizing the substrate 10.

Word lines WL may be formed in the second trenches 15b, respectively. In some embodiments, a conductive layer may be formed in the first and second trenches 15a and 15b and then the conductive layer may be recessed to form the word lines WL. Top surfaces of the word lines WL may be lower than the top surface of the substrate 10 of the second region 11b by the recessing of the conductive layer. For example, the conductive layer for the word lines WL may include at least one material selected from a group consisting of a polysilicon layer, a metal silicide layer, and a metal layer.

Next, the semiconductor device illustrated in FIGS. 12A and 12B may be formed using subsequent processes similar to corresponding processes of forming the semiconductor device according to the first embodiment of the inventive concept. The second mask patterns 25 are represented into the first interlayer insulating layer 21 of FIGS. 12A and 12B.

Figure 18A:
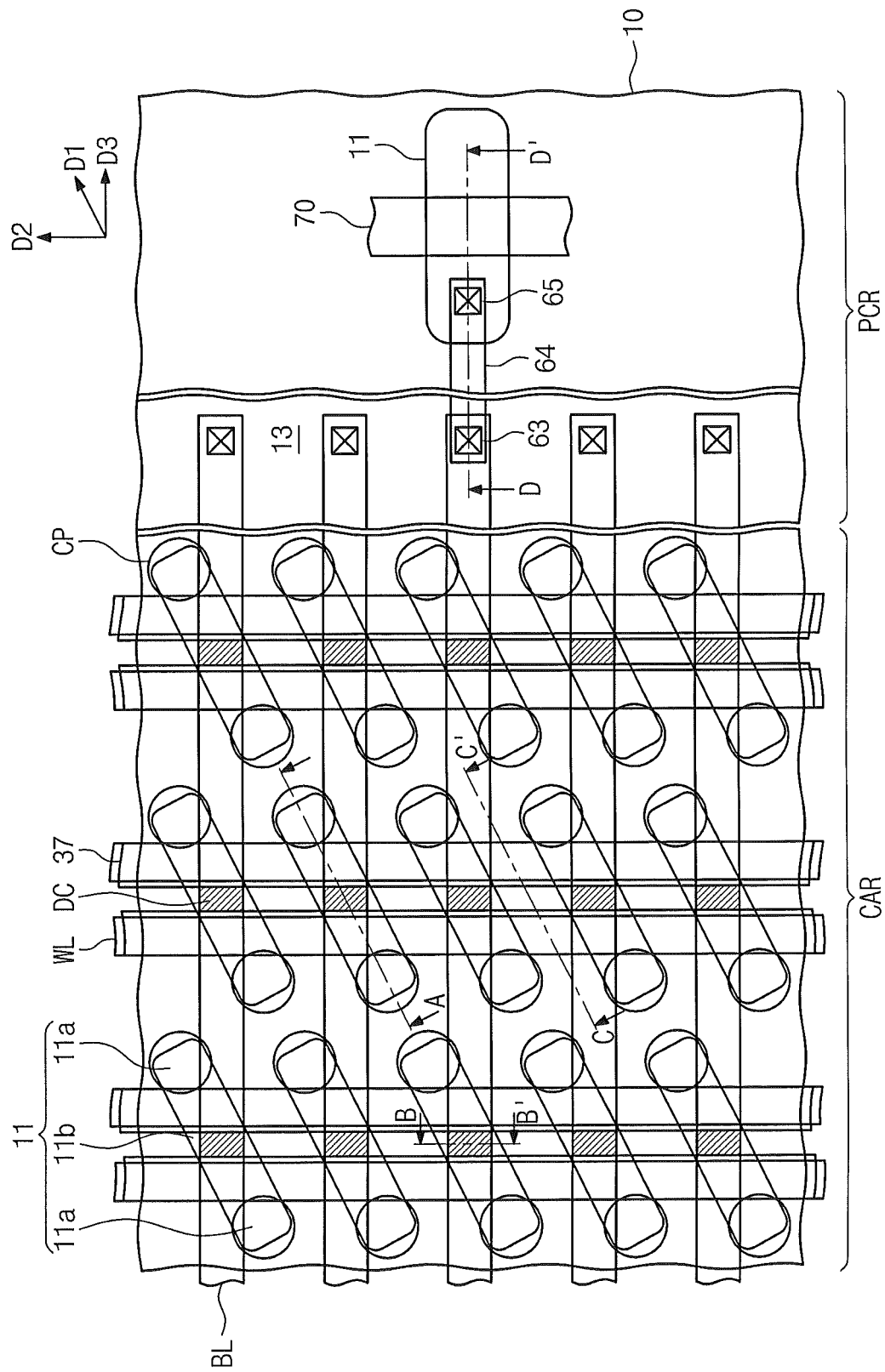
FIG. 18A is a layout of a semiconductor device according to a third embodiment of the inventive concept.
Figure 18B:
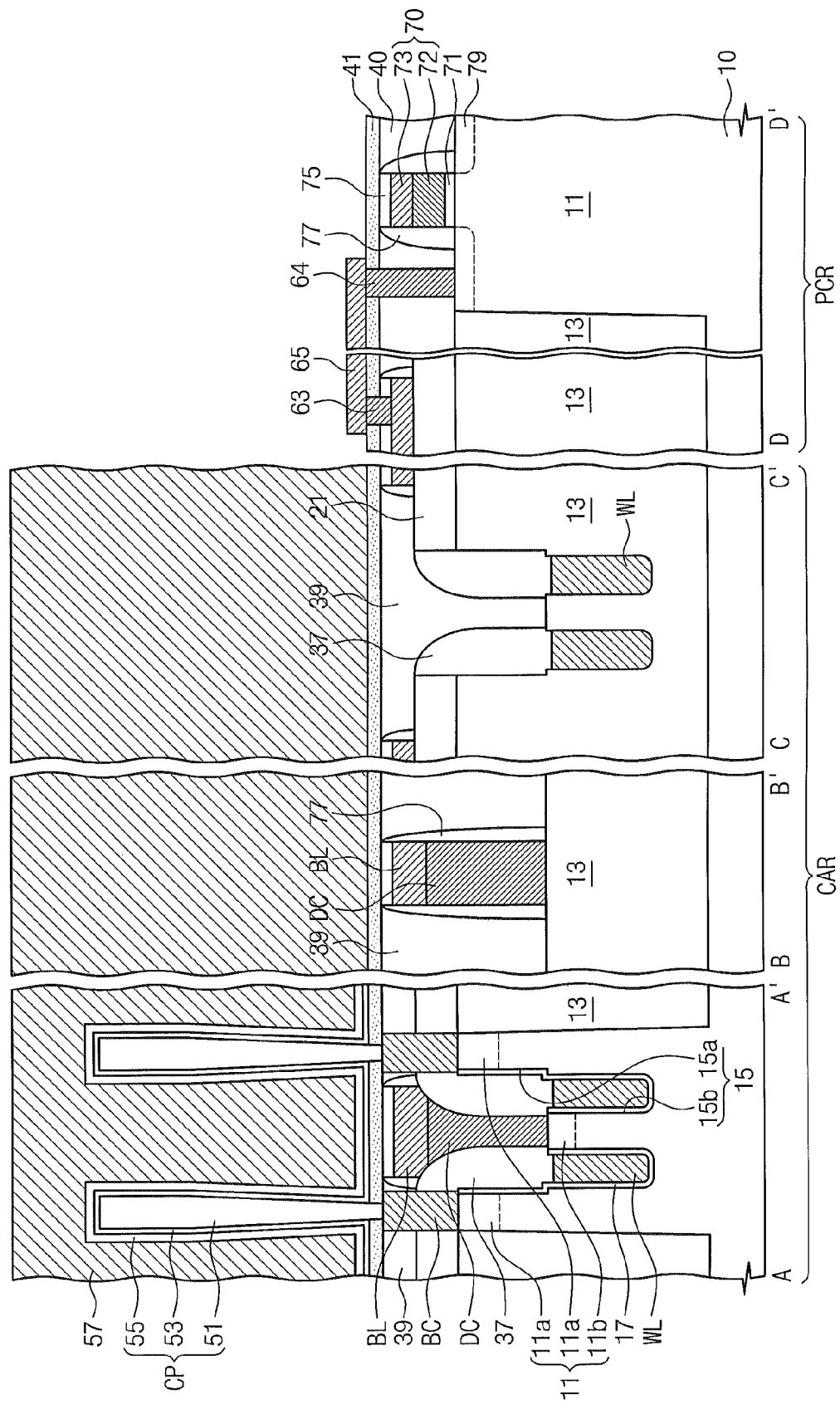
FIG. 18B is a cross-sectional view taken along lines A-A', B-B', C-C', and D-D' of FIG. 18A.

FIG. 18A is a layout of a semiconductor device according to a third embodiment of the inventive concept. FIG. 18B is a cross-sectional view taken along lines A-A', B-B', C-C', and D-D' of FIG. 18A. In the present embodiment, the descriptions to the same elements as described with reference to FIGS. 2A and 2B may be omitted or mentioned briefly. That is, differences between the present embodiment and the first embodiment will be mainly described hereinafter.

Referring to FIGS. 18A and 18B, a trench-insulating layer may include a pair of spacer insulating layers 37 formed on the sidewalls of the first trench 15a, and a second gap insulating layer 39 provided in a gap region between the spacer insulating layers 37. The spacer insulating layers 37 may extend in the second direction D2. The spacer insulating layers 37 may cover the word lines WL. The spacer insulating layers 37 and the second gap insulating layer 39 may expose the second region 11b. The spacer insulating layers 37 may protrude to be higher than the top surface of the substrate 10. The spacer insulating layers 37 may have top ends disposed at the same height as the top surface of the first interlayer insulating layer 21. The second gap insulating layer 39 may extend onto the first interlayer insulating layer 21 so as to cover the bit line BL in the cell array region CAR and the peripheral gate 70 in the peripheral circuit region PCR.

Bit line contacts DC may be provided between the spacer insulating layers 37 so as to be in contact with the second region 11b. The bit line contacts DC may include at least one material selected from a group consisting of a metal silicide, a poly-silicon, a metal nitride, and a metal. Sidewalls of the bit line contacts DC opposite to each other in the second direction D2 are aligned with sidewalls of the bit line BL, respectively.

FIGS. 19A to 22A are plan views sequentially illustrating a method of manufacturing a semiconductor device according to a third embodiment of the inventive concept. FIGS. 19A to 22A correspond to FIG. 18A. FIGS. 19B to 22B are cross-sectional views sequentially illustrating a method of manufacturing a semiconductor device according to a third embodiment of the inventive concept. FIGS. 19A to 22B correspond to FIG. 18B.

Figure 19A:
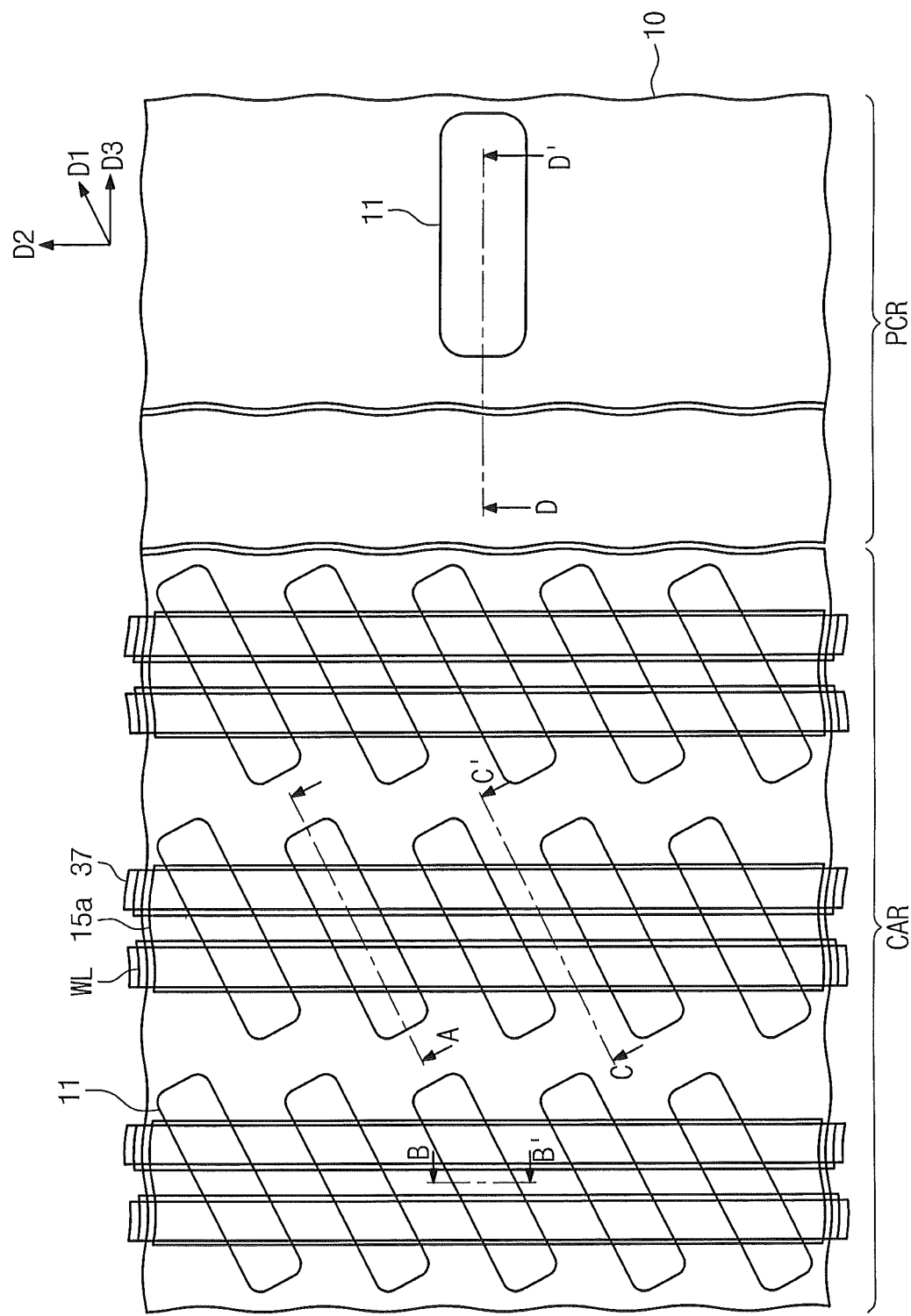
Figure 19B:
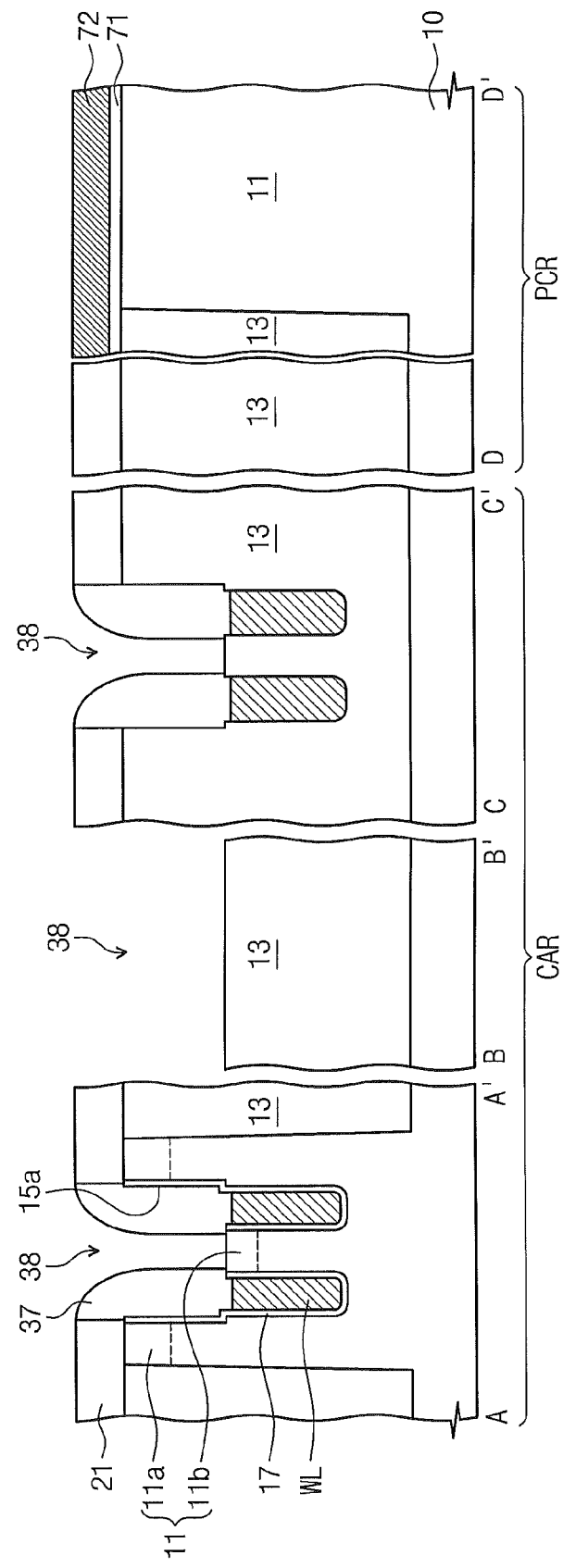

Referring to FIGS. 19A and 19B, spacer insulating layers 37 are formed on the sidewalls of the first trench 15a described with reference to FIGS. 7A to 7C. In some embodiments, an insulating layer (not shown) may be formed on the substrate 10. The insulating layer (not shown) may not completely fill the first trench 15a. The insulating layer (not shown) may be anisotropically etched to form the spacer insulating layers 37. The spacer insulating layers 37 may extend in the second direction D2 and may expose the second region 11b. A gap region 38 may be provided between the spacer insulating layers 37. The second region 11b may be exposed through the gap region 38.

Figure 20A:
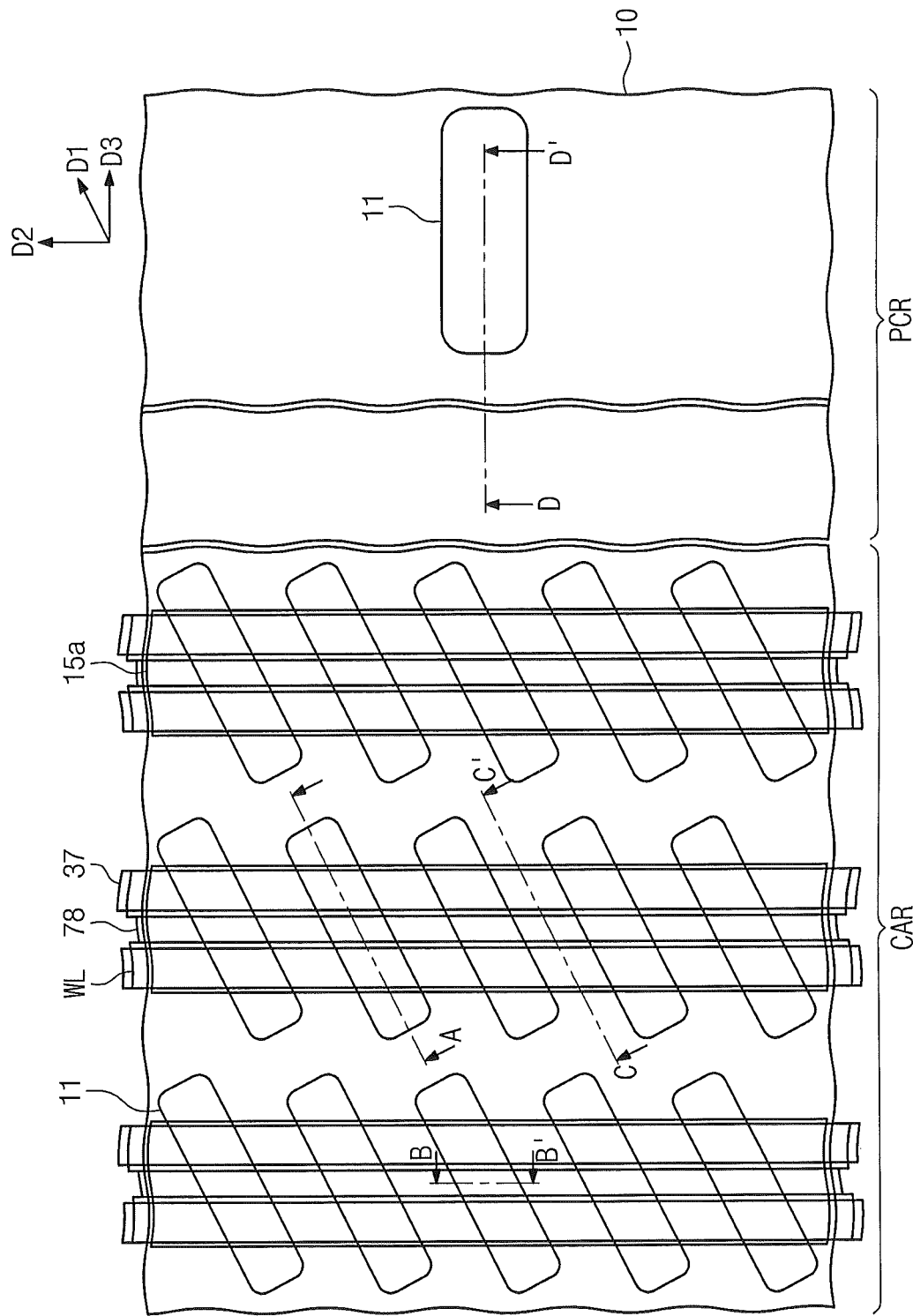
Figure 20B:
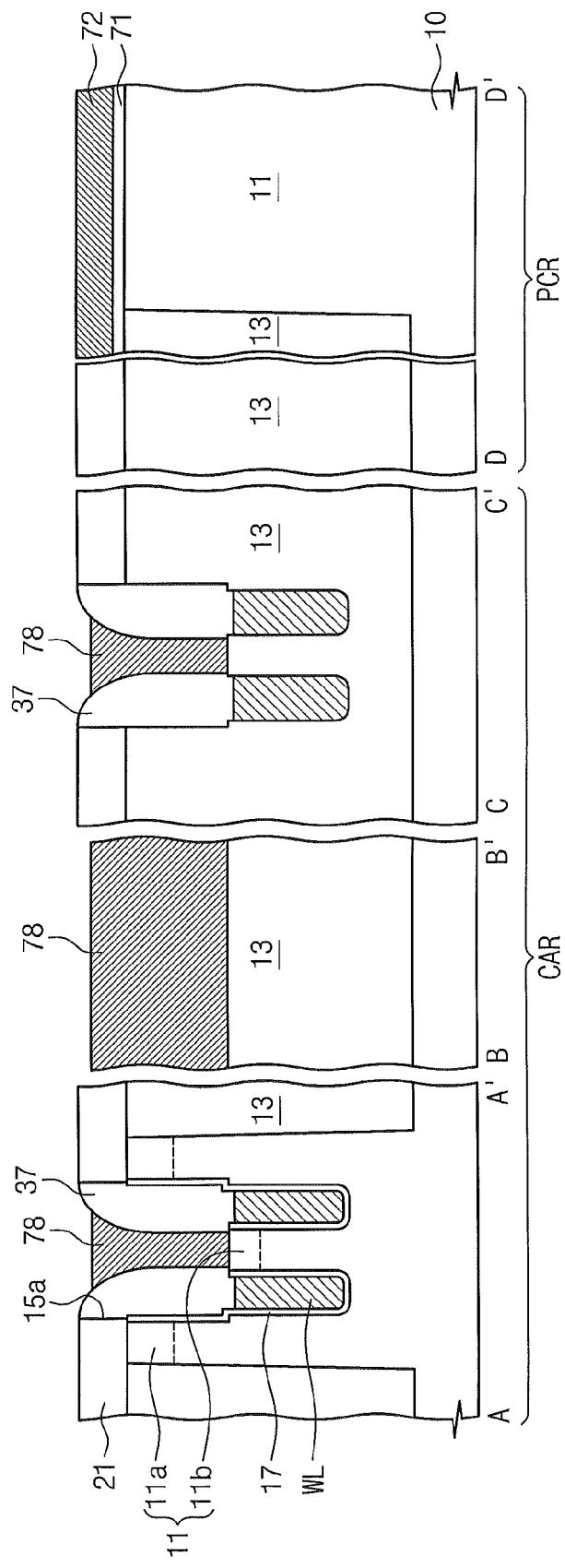

Referring to FIGS. 20A and 20B, a bit line contact conductive layer 78 is formed in the gap region 38 between the spacer insulating layers 37. The bit line contact conductive layer 78 may be formed on the substrate 10 and then may be planarized. Thus, the bit line contact conductive layer 78 may remain in only the gap region 38. The bit line contact conductive layer 78 may extend in the second direction D2. The bit line contact conductive layer 78 may include at least one material selected from a group consisting of a doped semiconductor material (e.g., doped silicon and/or doped germanium), a metal-semiconductor compound (e.g., tungsten silicide, cobalt silicide, and/or titanium silicide), a metal nitride (e.g., titanium nitride and/or tantalum nitride), and a metal (e.g., tungsten, titanium, and/or tantalum).

Figure 21A:
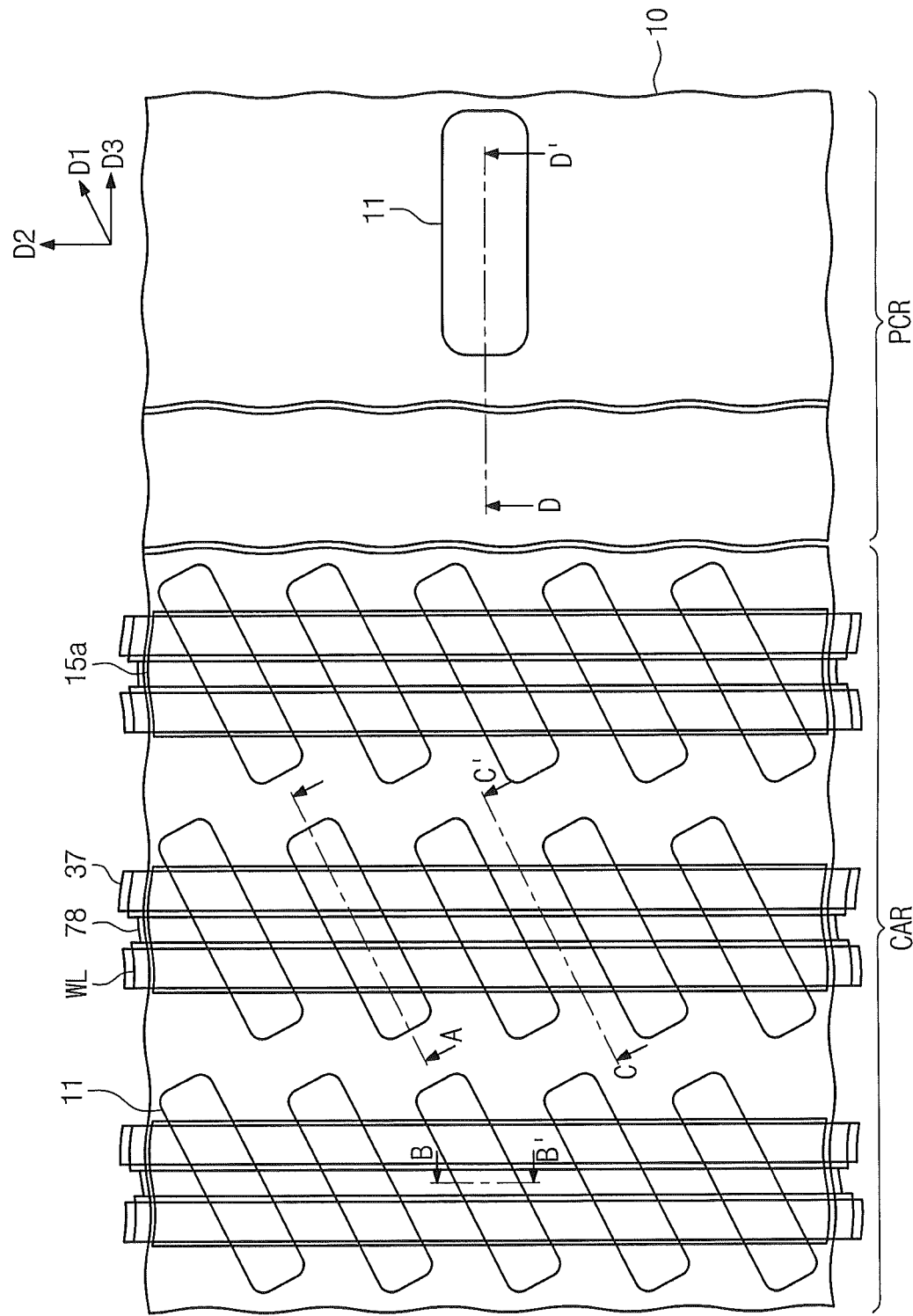
Figure 21B:
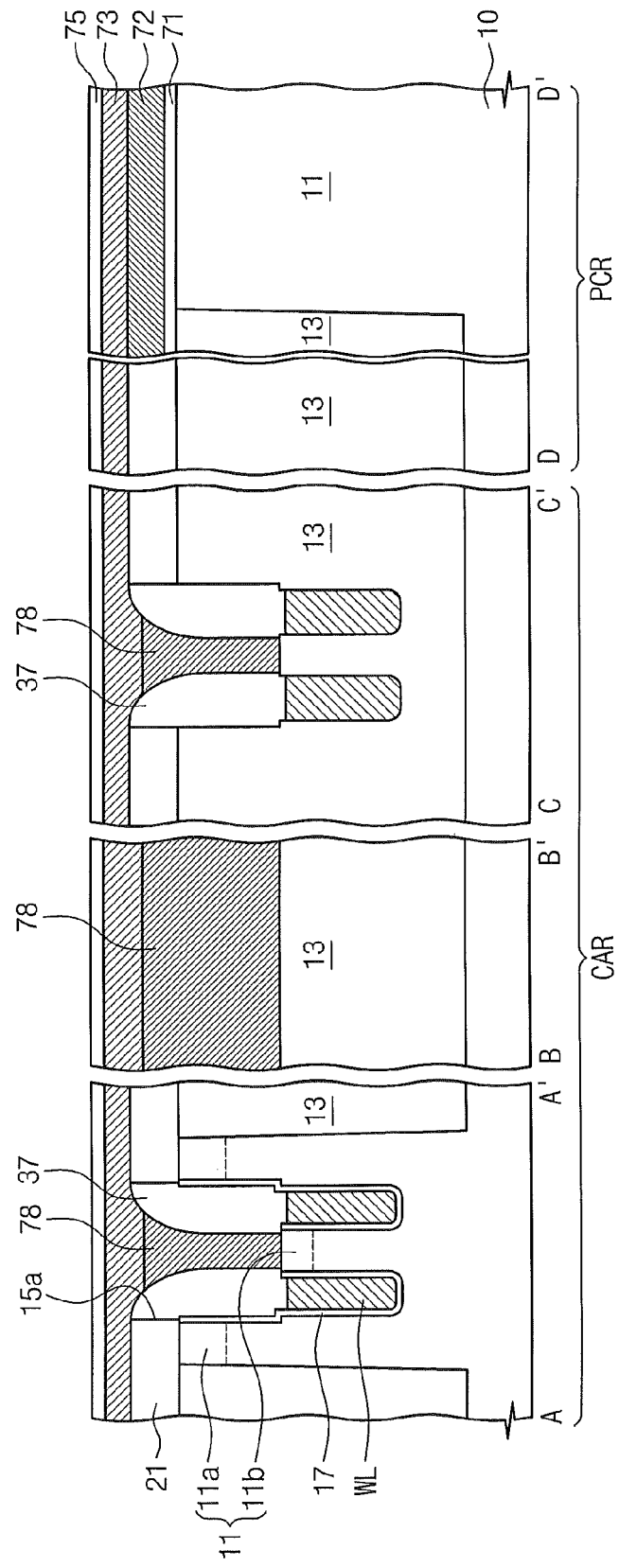

Referring to FIGS. 21A and 21B, a second gate layer 73 may be formed on the substrate 10. For example, the second gate layer 73 may include at least one material selected from a group consisting of a doped semiconductor material (e.g., doped silicon and/or doped germanium), a metal-semiconductor compound (e.g., tungsten silicide, cobalt silicide, and/or titanium silicide), a metal nitride (e.g., titanium nitride and/or tantalum nitride), and a metal (e.g., tungsten, titanium, and/or tantalum). A capping layer 75 may be formed on the second gate layer 73. The capping layer 75 may be, for example, a silicon oxide layer or a silicon nitride layer.

Figure 22A:
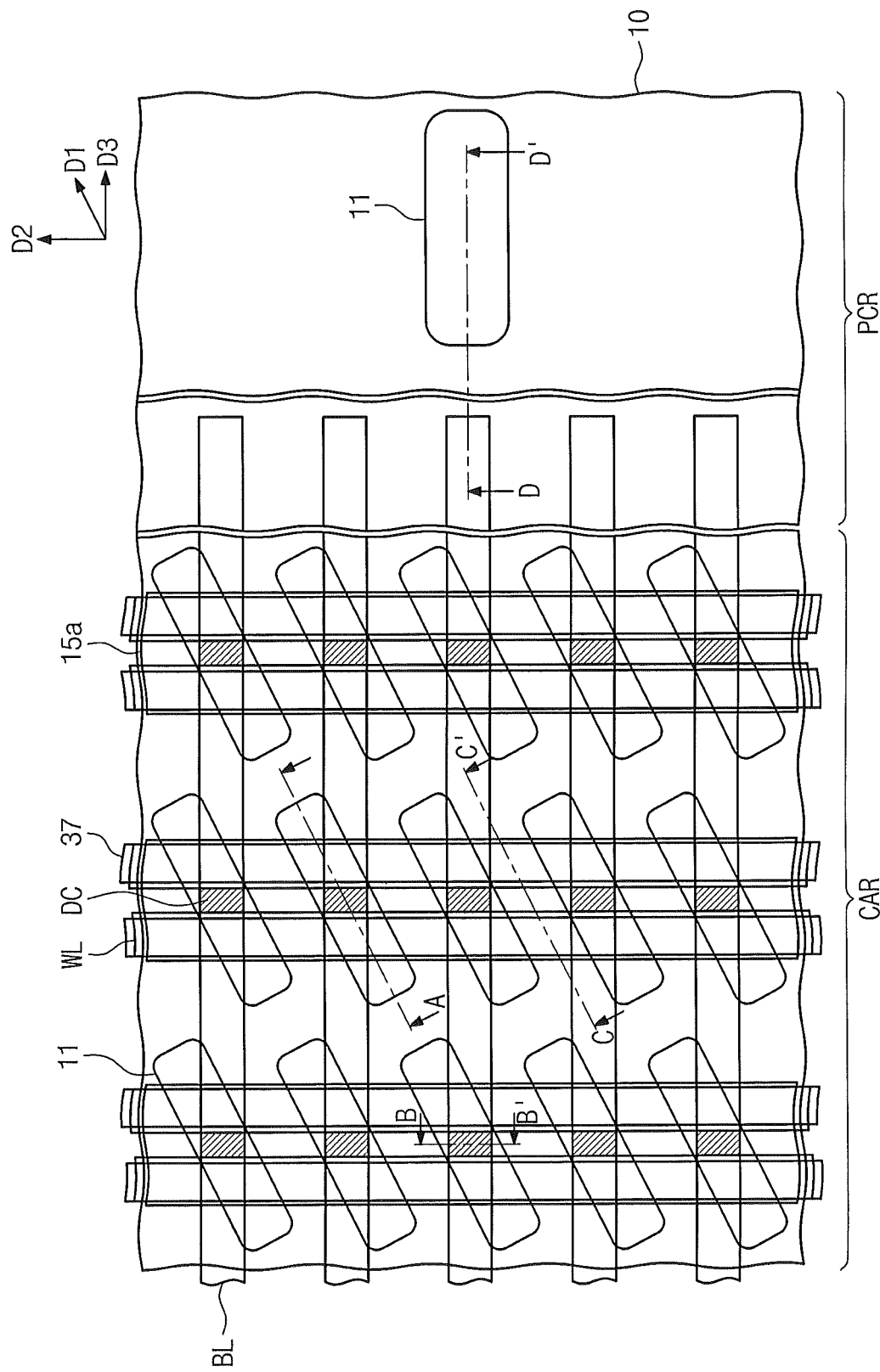
Figure 22B:
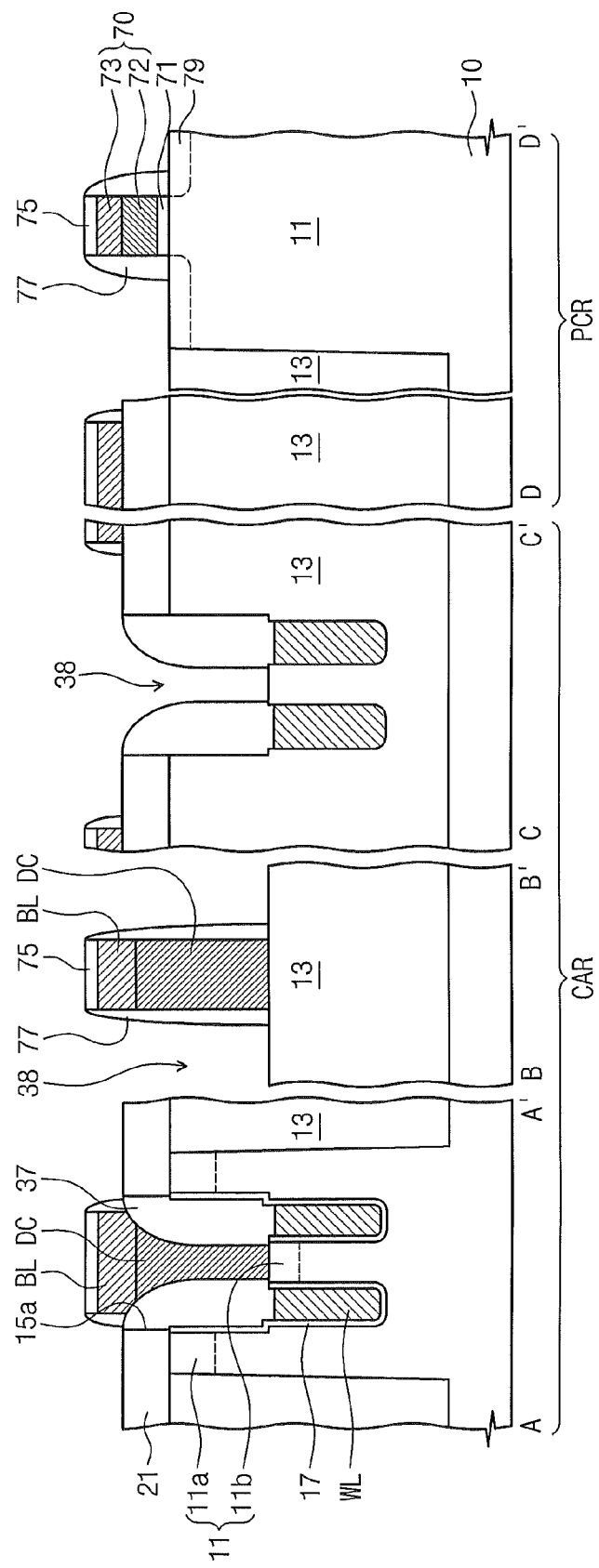

Referring to FIGS. 22A and 22B, the second gate layer 73 may be patterned to form bit lines BL in the cell array region CAR. The bit lines BL may extend in the third direction D3. Additionally, the first gate layer 72 and the bit line contact conductive layer 78 may be patterned. The bit line contact conductive layer 78 may be etched using the bit lines BL as etch masks, thereby forming bit line contacts DC.

Referring again to FIGS. 18A and 18B, the second gap insulating layer 39 may be formed in the gap region 38 between the bit line contacts DC. The second gap insulating layer 39 may cover the bit lines BL, the peripheral gate 70. Next, the semiconductor device illustrated in FIGS. 18A and 18B may be formed using subsequent processes similar to corresponding processes of the first embodiment.

Figure 23A:
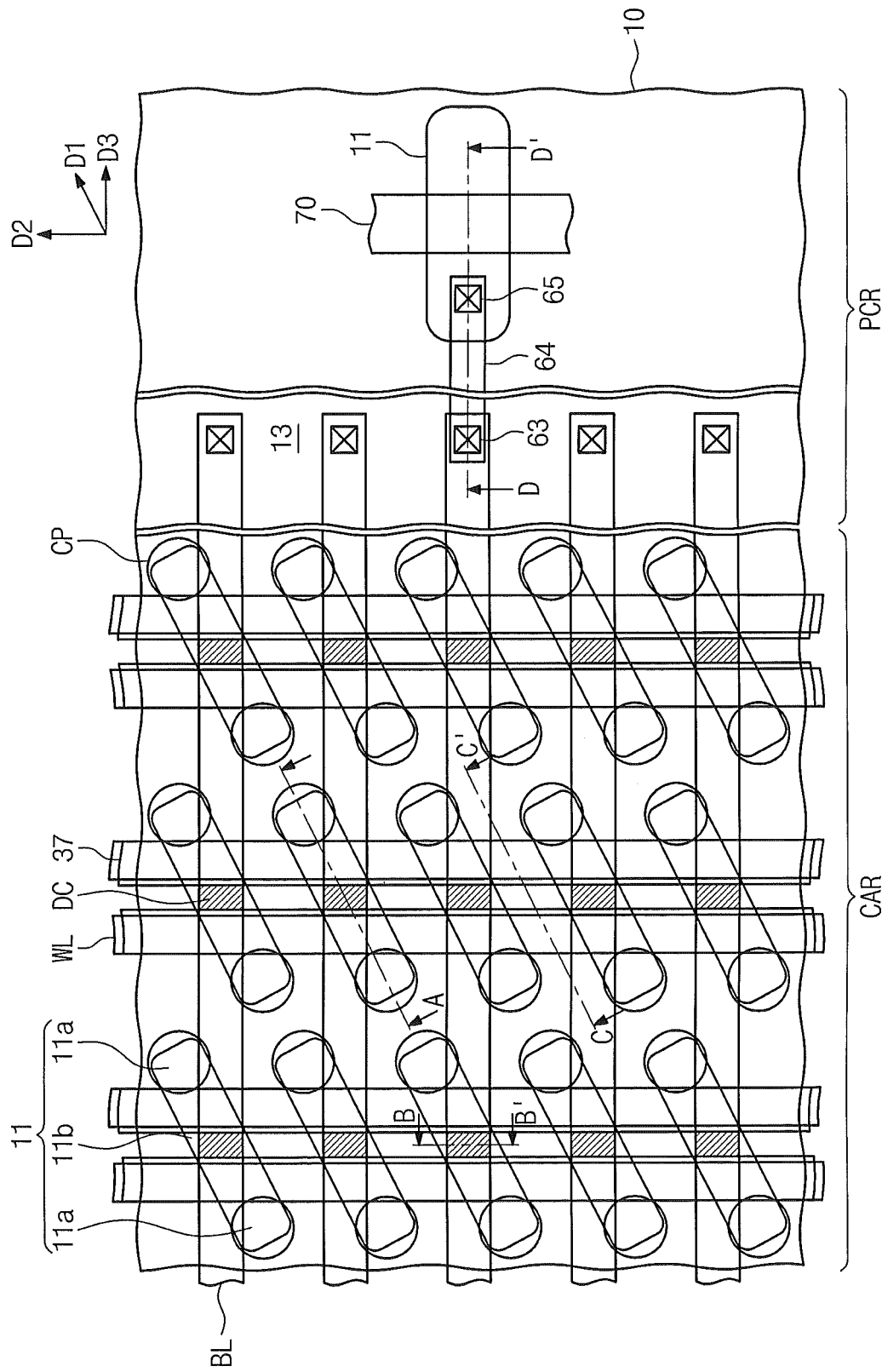
FIG. 23A is a layout of a semiconductor device according to a fourth embodiment of the inventive concept.
Figure 23B:
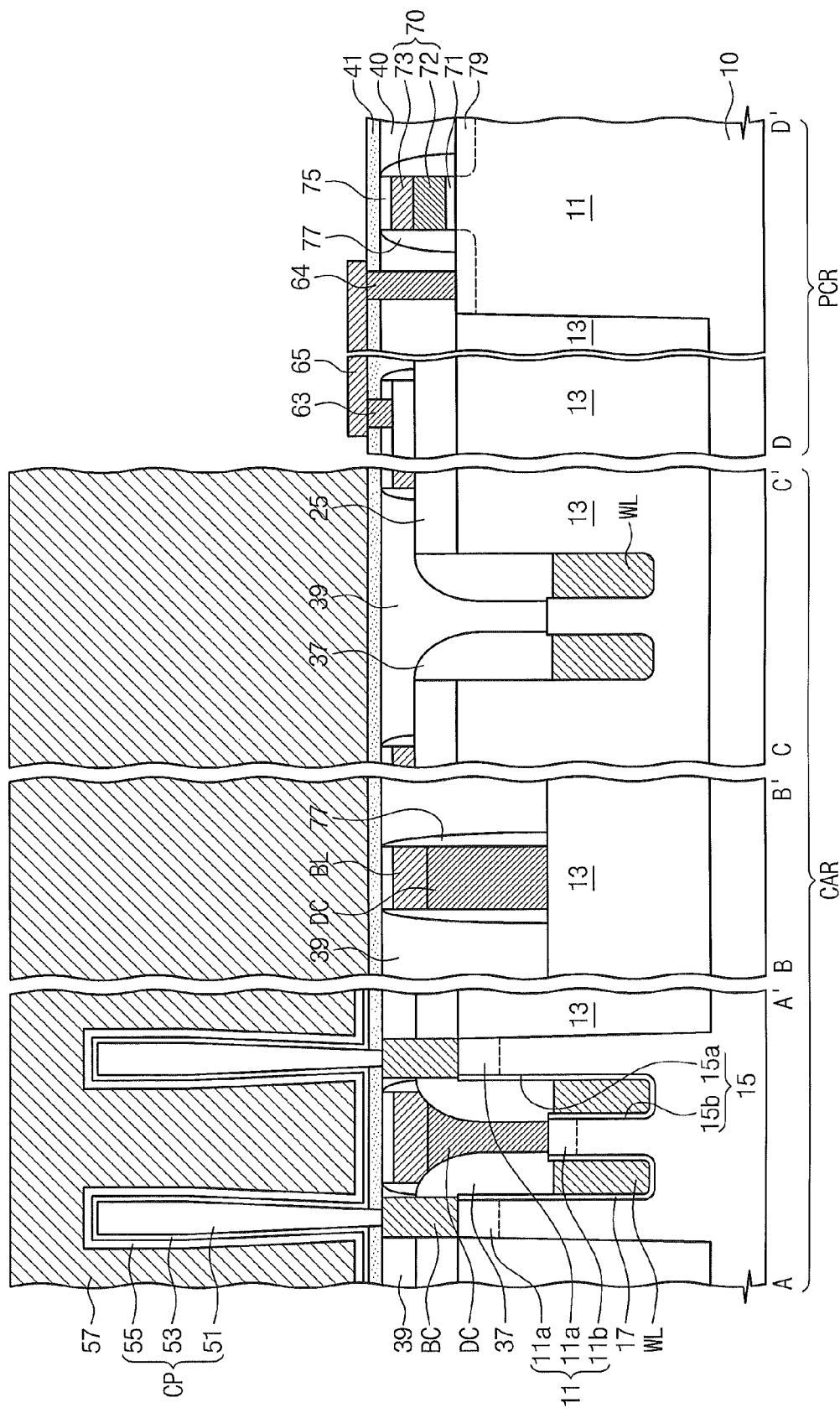
FIG. 23B is a cross-sectional view taken along lines A-A', B-B', C-C', and D-D' of FIG. 23A.

FIG. 23A is a layout of a semiconductor device according to a fourth embodiment of the inventive concept. FIG. 23B is a cross-sectional view taken along lines A-A', B-B', C-C', and D-D' of FIG. 23A. In the present embodiment, the descriptions to the same elements as described with reference to FIGS. 18A and 18B may be omitted or mentioned briefly. That is, differences between the present embodiment and the third embodiment will be mainly described hereinafter. Referring to FIGS. 23A and 23B, sidewalls of the first trench 15a may be aligned with sidewalls of the second trenches 15b.

The semiconductor device according to the fourth embodiment may be formed by a manufacturing method similar to the manufactured method of the semiconductor device according to the third embodiment of the inventive concept.

Figure 24:
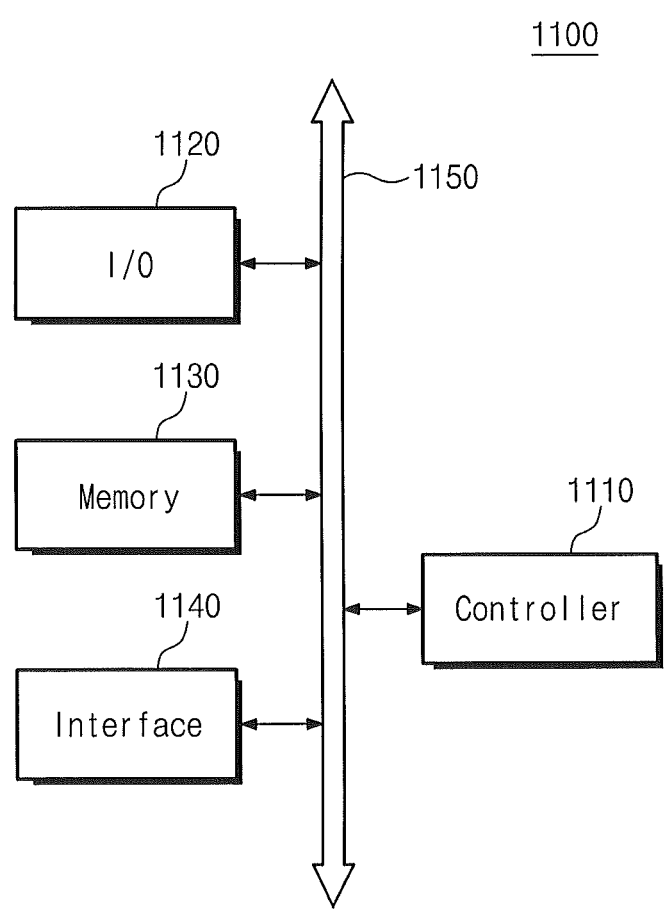
FIG. 24 is a schematic block diagram illustrating an example of memory systems including semiconductor devices according to embodiments of the inventive concept.

FIG. 24 is a schematic block diagram illustrating an example of memory systems including semiconductor devices according to embodiments of the inventive concept.

Referring to FIG. 24, a memory system 1100 according to an embodiment of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The controller 1110, the I/O unit 1120, the memory device 1130, and/or the interface unit 1140 may include the semiconductor devices according to embodiments of the inventive concept.

The controller 1110 may include at least one of a microprocessor, a digital signal processor, a microcontroller or other logic devices. The other logic devices may have a similar function to any one of the microprocessor, the digital signal processor and the microcontroller. The I/O unit 1120 may include a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The memory system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 25:
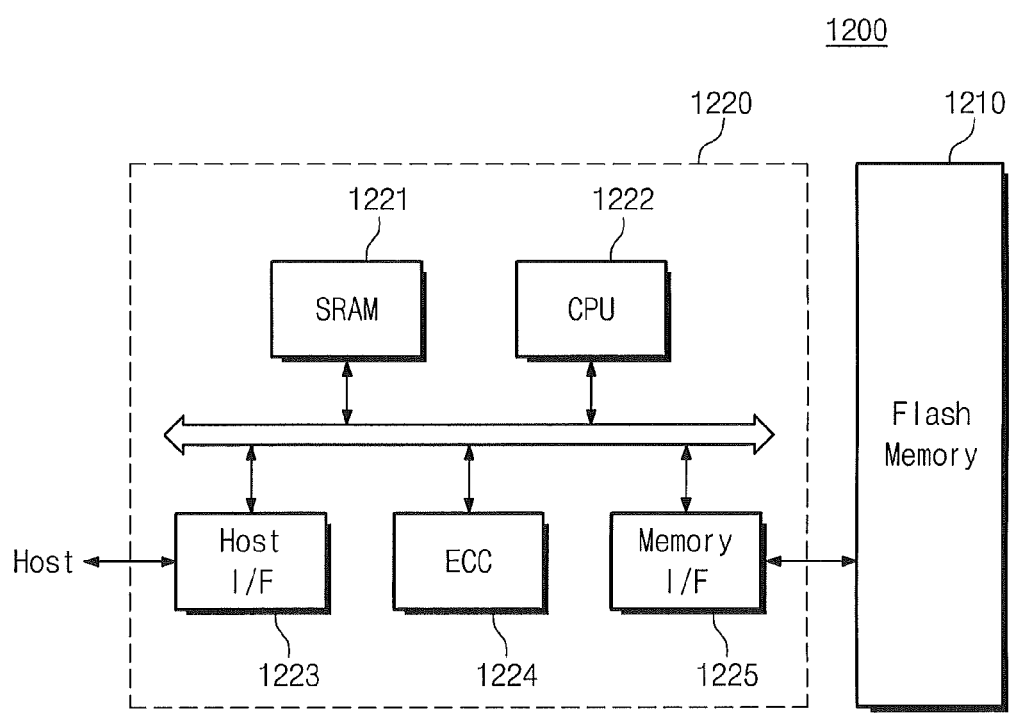
FIG. 25 is a schematic block diagram illustrating an example of memory cards including semiconductor devices according to embodiments of the inventive concept.

FIG. 25 is a schematic block diagram illustrating an example of memory cards including semiconductor devices according to embodiments of the inventive concept.

Referring to FIG. 25, a memory card 1200 may include a memory device 1210. The memory device 1210 may include at least one of the semiconductor devices according to the embodiments mentioned above. In other embodiments, the memory device 1210 may further include another type of semiconductor memory devices (e.g., a static random access memory (SRAM) device, etc.) which are different from the semiconductor devices according to the embodiments described above. The memory card 1200 may include a memory controller 1220 that controls data communication between a host and the memory device 1210. The memory device 1210 and/or the controller 1220 may include the semiconductor devices according to embodiments of the inventive concept.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

Figure 26:
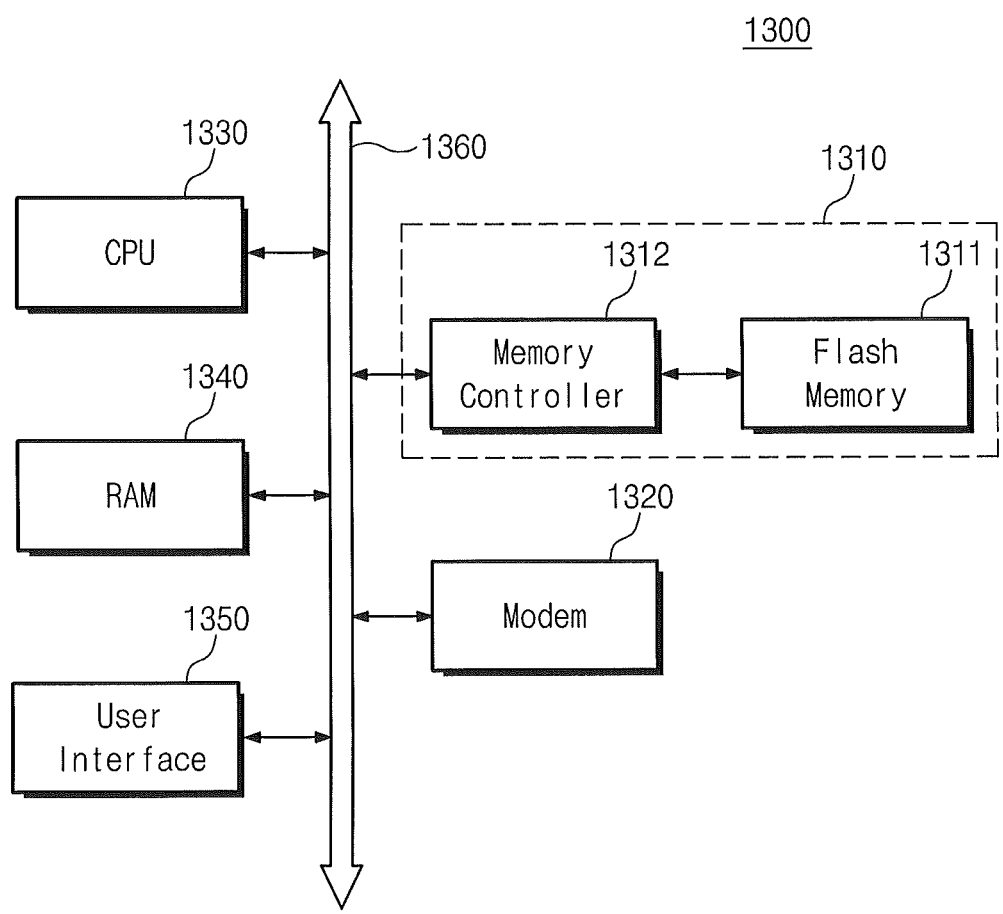
FIG. 26 is a schematic block diagram illustrating an example of information processing systems including semiconductor devices according to embodiments of the inventive concept.

FIG. 26 is a schematic block diagram illustrating an example of information processing systems including semiconductor devices according to embodiments of the inventive concept.

Referring to FIG. 26, an information processing system 1300 according to embodiments may include a modem 1320, a central processing unit (CPU) 1330, a RAM 1340, and a user interface unit 1350 which may be electrically connected to a flash memory system 1310 through a system bus 1360. The flash memory system 1310 may have substantially the same structure as the system of the aforementioned memory card. Data processed by the CPU 1330 and/or inputted from an external system may be stored in the flash memory system 1310. The flash memory system 1310 may be provided as a solid state drive SSD. In this case, the information processing system 1300 may be able to store reliably a large amount of data in the memory system 1310. This increase in reliability enables the memory system 1310 to conserve resources for error correction such that a high speed data exchange function may be provided to the information processing system 1300. Although not shown in the drawings, the information processing system 1300 may further include an application chipset, a camera image processor (CIS), and/or an input/output device.

The semiconductor devices and the memory systems according to the aforementioned embodiments may be encapsulated using various packaging techniques. For example, the semiconductor devices and the memory systems according to the aforementioned embodiments may be encapsulated using any one of a package on package (PoP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

According to embodiments of the inventive concept, the dispersion of the heights of the word lines of the BCATs may be reduced to improve the reliability of the semiconductor device.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
 a substrate;
 an active region defined by a device isolation layer provided in the substrate, the active region having first regions and a second region between the first regions;
 a first trench provided in the substrate to extend in a first direction, the first trench crossing the active region and the device isolation layer;
 a pair of second trenches connected to a bottom of the first trench, the pair of second trenches provided between the second region and the first regions; and
 gates provided in the second trenches, respectively.

2. The semiconductor device of claim 1, wherein the first regions are provided at both sides of the first trench;
 wherein the second region is provided between the second trenches; and
 wherein a top surface of the second region is lower than top surfaces of the first regions.

3. The semiconductor device of claim 2, further comprising:
 a trench-insulating layer filling the first trench and extending in the first direction, the trench-insulating layer having a first hole exposing the second region.

4. The semiconductor device of claim 3, wherein the trench-insulating layer protrudes higher than a top surface of the substrate and extends in the first direction.

5. The semiconductor device of claim 3, further comprising:
 storage node contacts contacting the first regions, respectively; and
 storage nodes disposed on the storage node contacts, respectively.

6. The semiconductor device of claim 3, further comprising:
 a bit line contact provided in the first hole and contacting the second region; and
 a bit line connected to the bit line contact, the bit line provided on the trench-insulating layer to extend in a second direction crossing the first direction.

7. The semiconductor device of claim 6, wherein the trench-insulating layer comprises:
 a first insulating layer having a second hole greater than the first hole, the second hole exposing at least portions of the gates; and
 a second insulating layer provided in the second hole and covering the exposed gates.

8. The semiconductor device of claim 7, wherein the trench-insulating layer further comprises:
 a third insulating layer disposed between a sidewall of the first trench and the first insulating layer and between the first insulating layer and the gates.

9. The semiconductor device of claim 8, wherein the first insulating layer is a silicon oxide layer; and
 wherein each of the second and third insulating layers is a silicon nitride layer or a silicon oxynitride layer.

10. The semiconductor device of claim 6, wherein the trench-insulating layer comprises:
 spacer insulating layers formed on sidewalls of the first trench; and
 a gap insulating layer provided in a gap region between the spacer insulating layers, the gap insulating layer exposing the second region.

11. The semiconductor device of claim 10, wherein sidewalls of the bit line contact which are opposite to each other in the first direction are aligned with sidewalls of the bit line.

* * * * *